(12) United States Patent
Kanda

(10) Patent No.: US 8,080,363 B2
(45) Date of Patent: Dec. 20, 2011

(54) RESIN FOR HYDROPHOBITIZING RESIST SURFACE, METHOD FOR MANUFACTURING THE RESIN, AND POSITIVE RESIST COMPOSITION CONTAINING THE RESIN

(75) Inventor: Hiromi Kanda, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 410 days.

(21) Appl. No.: 12/207,345

(22) Filed: Sep. 9, 2008

(65) Prior Publication Data

US 2009/0239176 A1 Sep. 24, 2009

(30) Foreign Application Priority Data

Mar. 19, 2008 (JP) .................... 2008-071483

(51) Int. Cl.
*G03F 7/00* (2006.01)
*G03F 7/0041* (2006.01)
*C08G 2/04* (2006.01)

(52) U.S. Cl. .............. 430/270.1; 430/905; 430/913; 428/482

(58) Field of Classification Search ........... 430/270.1, 430/322, 326, 913, 907, 905, 910
See application file for complete search history.

(56) References Cited

U.S. PATENT DOCUMENTS

| | | | | |
|---|---|---|---|---|
| 6,890,699 B2 * | 5/2005 | Seibold et al. | | 430/270.1 |
| 6,919,161 B2 * | 7/2005 | Hatakeyama et al. | | 430/270.1 |
| 7,232,638 B2 * | 6/2007 | Hatakeyama et al. | | 430/270.1 |
| 7,254,924 B2 * | 8/2007 | Regina | | 52/306 |
| 7,341,817 B2 * | 3/2008 | Wada et al. | | 430/270.1 |
| 7,368,220 B2 * | 5/2008 | Kanda et al. | | 430/270.1 |
| 7,504,194 B2 * | 3/2009 | Fukuhara et al. | | 430/270.1 |
| 7,598,017 B2 * | 10/2009 | Iwashita et al. | | 430/270.1 |
| 7,611,820 B2 * | 11/2009 | Kanda et al. | | 430/270.1 |
| 7,635,554 B2 * | 12/2009 | Fukuhara et al. | | 430/270.1 |
| 7,666,574 B2 * | 2/2010 | Fukuhara et al. | | 430/270.1 |
| 7,700,260 B2 * | 4/2010 | Kanna et al. | | 430/270.1 |
| 7,771,912 B2 * | 8/2010 | Yamamoto et al. | | 430/270.1 |
| 7,790,351 B2 * | 9/2010 | Fukuhara et al. | | 430/270.1 |
| 7,794,914 B2 * | 9/2010 | Ando et al. | | 430/270.1 |
| 2005/0019690 A1 * | 1/2005 | Kodama | | 430/270.1 |
| 2007/0134588 A1 * | 6/2007 | Kanda et al. | | 430/270.1 |
| 2008/0081296 A1 * | 4/2008 | Jung | | 430/311 |
| 2009/0068586 A1 * | 3/2009 | Nakamura et al. | | 430/270.1 |
| 2009/0123869 A1 * | 5/2009 | Wang | | 430/270.1 |
| 2009/0130592 A1 * | 5/2009 | Wang | | 430/270.1 |
| 2009/0269695 A1 * | 10/2009 | Fuji et al. | | 430/270.1 |

FOREIGN PATENT DOCUMENTS

EP 1795960 A2 * 6/2007

(Continued)

OTHER PUBLICATIONS

B.J. Lin, "Semiconductor Foundry, Lithography, and Partners", Emerging Lithographic Technologies VI, Proceeding of SPIE, vol. 4688 (2002).

(Continued)

*Primary Examiner* — Amanda C. Walke
(74) *Attorney, Agent, or Firm* — Sughrue Mion, PLLC

(57) ABSTRACT

A resin to be added to a resist composition and locally distributed on a resist film surface to hydrophobitize the resist film surface includes a residual monomer in an amount of 1 mass % or less to the resin as a whole in terms of solid content.

22 Claims, 1 Drawing Sheet

FOREIGN PATENT DOCUMENTS

| | | | |
|---|---|---|---|
| EP | 1835340 A1 | * | 9/2007 |
| JP | 10-303114 A | | 11/1998 |
| JP | 2006-48029 A | | 2/2006 |
| JP | 2006-58842 A | | 3/2006 |
| JP | 2006-309245 A | | 11/2006 |
| WO | 2004/068242 A1 | | 8/2004 |

OTHER PUBLICATIONS

Hoffinagle et al., "Liquid immersion deep-ultraviolet interferometric lithography", J.Vac. Sci. Technol. B, vol. 7, No. 6, pp. 3306-3309 (Nov./Dec. 1999).

* cited by examiner

FIGURE
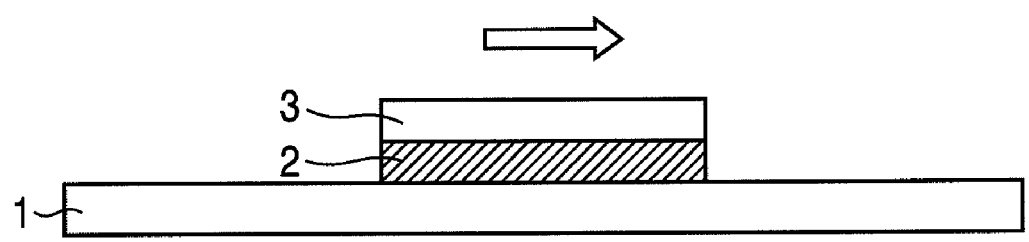

RESIN FOR HYDROPHOBITIZING RESIST SURFACE, METHOD FOR MANUFACTURING THE RESIN, AND POSITIVE RESIST COMPOSITION CONTAINING THE RESIN

BACKGROUND OF THE INVENTION

Description of the Related Art

With the progress of fining of semiconductor devices, shortening of the wavelengths of exposure light source and increasing in the numerical aperture (high NA) of projection lens have advanced, and now exposure apparatus using an ArF excimer laser having wavelength of 193 nm as the light source have been developed. In recent years, as a method of achieving further finer pattern formation, immersion lithography applying the techniques to heighten resolution in optical microscopes is known. In immersion lithography, exposure is performed by filling between a projection lens and a sample with a liquid of high refractive index (hereinafter also referred to as "immersion liquid").

The latest advance of immersion exposure techniques is reported in non-patent document 1 (*SPIE Proc.,* 4688, 11 (2002)), non-patent document 2 (*J. Vac. Sci. Tecnol. B,* 17 (1999)), and patent document 1 (JP-A-10-303114, the term "JP-A" as used herein refers to an "unexamined published Japanese patent application"). When an ArF excimer laser is used as the light source, it is thought that pure water (a refractive index at 193 nm: 1.44) is most promising in view of the safety in handling, and transmittance and refractive index at 193 nm.

Patent document 2 (WO 2004/068,242) discloses that the resist performance changes by the immersion of a resist for ArF exposure in water before and after exposure and appoints this is a problem in immersion exposure. Further, patent document 3 (JP-A-2006-58842) discloses that if the components in a resist such as an acid and the like are eluted from a photo-resist layer into an immersion liquid layer, the surface of a lens is contaminated, which is a problem.

As a means for solving this problem, patent document 4 (JP-A-2006-48029) and patent document 5 (JP-A-2006-309245) propose that moving (elution) of the components in a resist to an immersion liquid during the contact of the immersion liquid with the resist layer in the exposure process can be restrained by adding into a resist a substance that migrates to the upper part of the resist after coating.

Further, as a result of eager examination, it has been found that by the addition of hydrophobitizing resin (HR), not only elution of the resist components can be restrained but also the surface layer can be hydrophobilized, therefore, when the immersion medium is water, the receding contact angle of the resist film surface to water at the time of touching with the resist film can be improved, and following ability after an immersion liquid can be improved.

However, when a resist containing resin (HR) containing a large amount of low molecular weight component is coated, there is a possibility that the resin (HR) comes to be in contact with the immersion liquid floating on the surface, and the low molecular weight components and water-soluble components in the resin (HR) are eluted into the immersion liquid and contaminate the exposure lens. Further, there are cases where immersion defects (development defects) increase to adversely influence the performances of resist by immersion, so that improvement has been necessary.

SUMMARY OF THE INVENTION

An object of the present invention is to provide resin capable of well hydrophobitizing a resist film surface in patterning by immersion exposure, making good following ability after an immersion liquid, preventing elution of a generated acid to an immersion liquid, and showing an effect of suppression of development defects. Another object is to provide a method for manufacturing the resin. A further object is to provide a positive resist composition containing the resin.

The above objects of the invention have been achieved by the following resin, method for manufacturing the resin, and resist composition containing the resin.

<1> A resin to be added to a resist composition and locally distributed on a resist film surface to hydrophobitize the resist film surface, the resin comprising:
a residual monomer in an amount of 1 mass % or less to the resin as a whole in terms of solid content <2> A method for manufacturing the resin as described in the above item <1>, the method comprising:
passing a solution containing a resin obtained by polymerization through a filter comprising a porous polyolefin film having a cation exchange group.

<3> A method for manufacturing the resin as described in the above item <1>, the method comprising:
passing a solution containing a resin obtained by polymerization through a filter having positive ζ-potential.

<4> The method as described in the above item <2> or <3>, wherein
the purity of a monomer for use in the synthesis of the resin is 99% or more.

<5> The method as described in any of the above items <2> to <4>, further comprising:
removing a radical capturing material, before the polymerization, from at least one of (a) a solution containing a monomer, a radical polymerization initiator, and a solvent, and (b) a solvent in the reaction vessel.

<6> The method as described in the above item <5> for manufacturing the resin to be added to an immersion resist, wherein
the radical capturing material is oxygen.

<7> The method as described in any of the above items <2> to <6>, further comprising:
bringing the resin obtained by polymerization into contact with an aqueous solution.

<8> The method as described in the above item <7>, further comprising:
dividing the resin formed by polymerization to an organic solvent layer, and water-soluble components as impurities to a water layer by extracting operation using an organic solvent and water.

<9> The method as described in the above item <7> or <8>, wherein
the aqueous solution is acidic.

<10> The method as described in any of the above items <2> to <9>, further comprising:
performing, after precipitation-purifying the resin obtained by polymerization, at least either treatment of (i) a repulping treatment using a poor solvent, or (ii) a rinsing treatment using a poor solvent.

<11> The method as described in the above item <10> for manufacturing the resin to be added to an immersion resist, wherein
the resin having been purified by precipitation is further subjected to (iii) rinsing treatment using water.

<12> A positive resist composition comprising:
(A) a resin having a monocyclic or polycyclic alicyclic hydrocarbon structure, and capable of increasing the solubility in an alkali developing solution by the action of an acid, (B) a compound capable of generating an acid upon irradiation with actinic ray or radiation, (C) the resin as described in the above item <1>, and (D) a solvent.

<13> A pattern-forming method comprising:

forming a resist film with the positive resist composition as described in the above item <12>, exposing the resist film, and developing the resist film.

BRIEF DESCRIPTION OF THE DRAWING

FIGURE is an outline of the evaluation method of following ability of water.

DETAILED DESCRIPTION OF THE INVENTION

[Best Mode for Carrying Out the Invention]

The invention will be described in detail below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

[1] Hydrophobitizing Resin (HR) and Synthesizing Method of the Same:

In patterning by immersion exposure, as hydrophobitizing resin (HR) to be added to a resist to hydrophobitizing a resist film surface, resin in which a residual amount of monomer is 1 mass % or less in terms of solid content to the resin as a whole is preferred. The present inventors have found that such resin can be obtained by passing a solution containing resin obtained by polymerization through a filter consisting of a porous polyolefin film having a cation exchange group or through a filter having positive ζ-potential.

A residual amount of monomer in resin is preferably 1 mass % or less in terms of solid content to the resin (HR) as a whole, more preferably 0.5 mass % or less, and still more preferably 0.1 mass % or less.

The amount of residual monomer in resin can be measured by high performance liquid chromatography (HPLC), and impurities contained in a monomer are also contained in a residual monomer.

Synthesizing Method of Resin (RH):

In a manufacturing method in the invention, a batch polymerization method of dissolving a monomer seed and an initiator in a solvent and heating the solution to perform polymerization, and a dropping polymerization method of adding a solution of a monomer and an initiator to a heated solvent over 1 to 10 hours by dropping are exemplified, and the dropping polymerization method is preferred.

Process of Passing a Solution Through a Filter:

In obtaining the resin (HR) containing a residual amount of monomer of 1 mass % or less in terms of solid content, it is effective to pass a solution containing resin obtained by polymerization (a resin-containing solution) through at least either one of a filter consisting of a porous polyolefin film having a cation exchange group and a filter having positive ζ-potential.

Cation Exchange Filter:

By passing the solution through a filter consisting of a porous polyolefin film having a cation exchange group, impurities such as low molecular weight components and water-soluble components in the resin adversely influencing patterning by immersion exposure can be removed.

The cation exchange groups of the porous polyolefin film include strongly acidic cation exchange groups such as a sulfonic acid group, and weakly acidic cation exchange groups such as a carboxyl group. As the polyolefin that constitutes a polyolefin film, e.g., polyethylene, such as high density polyethylene, and polypropylene are exemplified. As the filters consisting of a porous polyolefin film having a cation exchange group, hydrophilic filters are preferred, for example, "Ion Clean", manufactured by Pall Corporation is preferably used.

The flowing amount of the passage of a resin-containing solution through a filter consisting of a porous polyolefin film having a cation exchange group differs according to the kinds of the materials of polyolefin films and the kinds of solutions (solvents), and the amount can be arbitrarily determined within the range not injuring the removal efficiency of impurities (e.g., 100 ml/min to 100 liter/min or so). The temperature at the time of passage of a solution through a filter is generally from 0 to 80° C., and preferably from 10 to 50° C. or so. The temperature at the passage is preferably lower from the points of the deterioration of a filter and the prevention of decomposition of a solvent, on one hand, the temperature is preferably higher from easiness of passage by the viscosity of a solution.

Filter Having ζ-Potential:

As the filters having positive ζ-potential in the invention, filters formed with membranes showing positive ζ-potential of 10 mV or more in distilled water of pH 7.0 (23° C.) are exemplified.

As the filters having positive ζ-potential, commercially available products, e.g., Posidyne (manufactured by Pall Corporation), Ultipleats Posidyne H (manufactured by Pall Corporation), Zetapor (manufactured by CUNO K.K.), and Zetaplus (manufactured by CUNO K.K.) can be used. As membranes showing positive ζ-potential, those made of surface-modified polyamides are generally used.

As the forms of filters, disc-type and cartridge-type filters are generally used. The filters having positive ζ-potential may be used alone, or may be used in combination with filters formed of other materials. As other materials, fluorine resins, e.g., PTFE, polyolefin resins, e.g., polypropylene and polyethylene, and polyamide resins, e.g., nylon 6 and nylon 66 (those surfaces of which are not modified) are exemplified.

When filters having positive ζ-potential are used alone, the pore size of the filters is 0.2 μm or less, preferably 0.1 μm or less, and more preferably 0.05 μm or less.

When filters having positive ζ-potential are used in combination with filters made of other materials, the pore size of the filters having positive ζ-potential may be 0.2 μm or more, and in such a case, the pore size of the filters made of other materials is 0.2 μm or less, preferably 0.1 μm or less, and more preferably 0.05 μm or less. The pore sizes here are nominal pore sizes of the manufacturers.

Both of the process of filtering with a cation exchange filter and the process of filtering with a filter having positive ζ-potential may be used.

The solvents for preparing a resin-containing solution for filter processing are not especially restricted, but solvents for use in resists are generally preferably used.

Specifically, esters, e.g., ethyl acetate, butyl acetate, propylene glycol monomethyl ether monoacetate, ethyl lactate, ethyl 3-ethoxypropionate, ethyl pyruvate, 2-ethoxyethyl acetate, 2-(2-ethoxyethoxy)ethyl acetate, ethyl benzoate, and γ-butyrolactone, carbonates, e.g., propylene carbonate, ketones, e.g., acetone, ethyl methyl ketone, diethyl ketone, isobutyl methyl ketone, t-butyl methyl ketone, cyclopentanone, and cyclohexanone, ethers, e.g., diethyl ether, diisopropyl ether, t-butyl methyl ether, dibutyl ether, dimethoxyethane, propylene glycol monomethyl ether, anisole, dioxane, dioxolan, and tetrahydrofuran, alcohols, e.g., isopropanol and butanol, nitrites, e.g., acetonitrile and propionitrile, aromatic hydrocarbons, e.g., toluene and xylene, and mixed solvents of these solvents are exemplified. Of these solvents, propylene glycol methyl ether acetate, propylene glycol methyl ether, ethyl lactate, γ-butyrolactone, cyclohexanone and cyclopentanone are preferred.

These solvents may be used alone, or two or more kinds may be used in combination.

These solvents may be polymerized solvents, or may be solvents obtained by substitution of polymerized solvents.

The resin concentration in a resin-containing solution is preferably from 1 to 80 mass %, and more preferably from 5 to 50 mass %.

It is sufficient to perform the filtering processing to a solution containing resin after polymerization, or may also be performed to a reaction solution after polymerization, a resin-containing solution in which a polymerization solvent has been substituted, or a resist prepared by the addition of components other than resin.

The synthesis and washing of resin until preparation of a solution containing resin (a resin-containing solution) to be subjected to the filtering processing are described below.

Polymerizable Monomer:

Monomer seeds to obtain preferred resin as resin (RH) are described later, but when impurities such as low molecular components and water-soluble components abound in a raw material monomer at the time of polymerization, the performance of a resist for immersion exposure is adversely influenced, so that the purity of the monomer is preferably 99% or higher.

It is also preferred to use monomers containing a low percentage of metals, for example, monomers having metal content of 100 mass ppb or less are preferably used.

Polymerization Initiator:

As polymerization initiators, those generally used as radical generators can be used with no particular restriction, and peroxide series initiators and azo series initiators are ordinarily used.

As radical initiators, azo series initiators are preferably used, and azo series initiators having an ester group, a cyano group or a carboxyl group are preferred.

The specific examples of azo series initiators include azobisisobutyronitrile, 2,2'-azobis(2-methylbutyronitrile), 2,2'-azobis(2,4-dimethylvaleronitrile), azobisisodimethyl butyrate, and azobis(4-cyanovalerate).

The specific examples of peroxide series initiators include peroxy ester polymerization initiators, e.g., benzo peroxide, decanoyl peroxide, lauroyl peroxide, bis(3,5,5-trimethylhexanoyl) peroxide, succinic acid peroxide, t-butylperoxy-2-ethylhexanoate, and 1,1,3,3-tetramethylbutylperoxy-2-ethylhexanoate, ketone peroxide polymerization initiators, e.g., methyl ethyl ketone peroxide, peroxy ketal polymerization initiators, e.g., 1,1-bis(t-hexylperoxy)-3,3,5-trimethylcyclohexane, hydroperoxides polymerization initiators, e.g., 1,1,3,3-tetramethylbutylhydroperoxide, diacyl peroxide polymerization initiators, e.g., isobutyryl peroxide, and peroxydicarbonate polymerization initiators, e.g., di-n-propylperoxydicarbonate.

Chain Transfer Agent:

It is preferred to further add a chain transfer agent to a solution containing a monomer in the aspect of further restraining the formation of a polymeric product.

Chain transfer agents are not restricted so long as they are such compounds that radicals are capable of chain transfer, and thiol compounds and disulfide compounds are exemplified.

Chain transfer agents are preferably thiol compounds having one or more groups selected from an alkyl group, a hydroxyl group, a fluoroalkyl group, an ester group, an acid group, and a phenyl group.

Specifically, alkylthiol compounds, e.g., dodecanethiol, mercaptoethanol, and mercaptopropanol, thiol compounds having a hydroxyl group, e.g., mercaptoethanol, mercaptopropanol, and mercaptopropanediol, thiol compounds having a fluoroalkyl group, e.g., perfluorooctylthiol and perfluorodecanethiol, thiol compounds having an ester group, e.g., methyl thioglycolate, ethyl thioglycolate, n-butyl thioglycolate, methyl mercaptopropionate, and ethyl mercaptopropionate, thiol compounds having an acid group, e.g., mercaptoacetic acid and mercaptopropionic acid, and thiol compounds having a phenyl group, e.g., toluenethiol, fluorobenzenethiol, mercaptophenol, and mercaptobenzoic acid are exemplified.

The use amounts of polymerization initiators and chain transfer agents differ by the kinds of raw material monomers, polymerization initiators and chain transfer agents used in polymerization reaction, manufacturing conditions such as polymerization temperature, solvents used in polymerization, methods of polymerization and purification conditions, so that the amounts cannot be unconditionally prescribed, and optimal amounts are used to achieve desired molecular weight.

It is preferred to adjust the amounts so that the weight average molecular weight of the polymerizable monomer is in the range of from 2,000 to 20,000, and more preferably in the range of from 2,000 to 10,000.

Polymerization Solvent:

As the solvents for use in reaction, solvents capable of dissolving the composition of the invention, such as esters, e.g., ethyl acetate, butyl acetate, propylene glycol monomethyl ether monoacetate, ethyl lactate, ethyl 3-ethoxypropionate, ethyl pyruvate, 2-ethoxyethyl acetate, 2-(2-ethoxyethoxy)ethyl acetate, ethyl benzoate, and γ-butyrolactone, carbonates, e.g., propylene carbonate, ketones, e.g., acetone, ethyl methyl ketone, diethyl ketone, isobutyl methyl ketone, t-butyl methyl ketone, cyclopentanone, and cyclohexanone, ethers, e.g., diethyl ether, diisopropyl ether, t-butyl methyl ether, dibutyl ether, dimethoxyethane, propylene glycol monomethyl ether, anisole, dioxane, dioxolan, and tetrahydrofuran, alcohols, e.g., isopropanol and butanol, nitriles, e.g., acetonitrile and propionitrile, aromatic hydrocarbons, e.g., toluene and xylene, amide solvents, e.g., dimethylformamide and dimethylacetamide, and mixed solvents of these solvents are exemplified. Of these solvents, propylene glycol methyl ether acetate, propylene glycol methyl ether, ethyl lactate, γ-butyrolactone, cyclohexanone and cyclopentanone are preferred.

As the polymerization solvents, solvents capable of dissolving the later-described undried resins after re-precipitation, and the same solvents for use in a resist are preferred.

Radical Capturing Material:

It is preferred to remove a radical capturing material from at least one of (A) a mixed solution containing a monomer, a radical polymerization initiator, and a solvent, and (B) a solvent in the reaction vessel before initiation of polymerization.

The removal of a radical capturing material can be carried out by at least one process selected from (i) a process of blowing inert gas into at least one of (A) a mixed solution and (B) a solvent to remove the oxygen in the liquid, (ii) a process of reducing the pressure in at least one of the container containing (A) a mixed solution and the reaction vessel containing (B) a solvent to remove the oxygen, and blowing inert gas after removing the oxygen, and this operation is performed one or more times, (iii) a process of retaining at least one of the container containing (A) a mixed solution and the reaction vessel containing (B) a solvent in an inert gas atmosphere for 0.5 hours or more to reduce the oxygen in the liquid, and (iv) a process of boiling at least one of (A) a mixed solution and (B) a solvent in an inert gas atmosphere to remove the oxygen in the liquid.

By providing these processes, not only resin having a desired molecular weight (e.g., a weight average molecular weight) can be obtained but also unevenness of resins formed of every manufacturing lot can be conspicuously restrained, so that resins of constant quality can be stably manufactured. In particular, it is preferred to provide a process of removing a radical capturing material from at least (A) a mixed solution. Further, an aiming molecular weight of resin (e.g., a weight average molecular weight) can be set up by determining the composition of a monomer, the concentration of the monomer in (A) a mixed solution, the amount of a radical polymerization initiator, dropping rate of (A) a mixed solution, and the temperature of polymerization.

As the radical capturing materials, for example, oxygen and polymerization inhibitors are exemplified. As preferred processes for removing oxygen as the radical capturing material, (i) a process of blowing inert gas into at least one of (A) a mixed solution and (B) a solvent (e.g., from 5 minutes to 1 hour or so) to remove the oxygen in the liquid, (ii) a process of reducing the pressure in at least one of the container containing (A) a mixed solution and the reaction vessel containing (B) a solvent to remove the oxygen, and blowing inert gas after removing the oxygen, and this operation is performed one or more times (e.g., from 1 to 5 times), and preferably 2 or more times (e.g., from 2 to 5 times), (iii) a process of retaining at least one of the container containing (A) a mixed solution and the reaction vessel containing (B) a solvent in an inert gas atmosphere for 0.5 hours or more (e.g., from 0.5 hours to 1 day or so), preferably 0.75 hours or more (e.g., from 0.75 hours to 1 day or so), and more preferably 1 hour or more (e.g., from 1 hour to 1 day or so) to reduce the oxygen in the liquid, and (iv) a process of boiling at least one of (A) a mixed solution and (B) a solvent in an inert gas atmosphere to remove the oxygen in the liquid are exemplified. Two or more processes of these processes may be combined. Further, in the process of (iii), to increase removing efficiency of oxygen in the liquid, it is preferred to flow inert gas or to stir the liquid. As the inert gas, e.g., nitrogen and argon are exemplified.

When the radical capturing material is a solid or a liquid, (A) a mixed solution or the constituents thereof, or (B) a solvent can be distilled and the radical capturing material can be removed as distillation residue or as a distillate.

After removing the radical capturing material, resin can be obtained by an ordinary dropping polymerization method.

Polymerization Concentration:

The polymerization concentration in a polymerization system differs by combination of solute and solvent of each solution, but generally as the concentration of the total amount of the solute such as a monomer and a polymerization initiator after completion of the introduction of raw materials, the concentration is preferably from 5 to 60 mass %, and more preferably from 30 to 50 mass %.

Polymerization Temperature:

Polymerization temperature can be arbitrarily selected according to the monomer composition and the kind of radical polymerization initiators, and is generally from 30 to 150° C., and preferably from 60 to 100° C.

Precipitation Process and Re-precipitation Process:

The polymerization reaction solution containing resin obtained by polymerization reaction is dropped to a poor solvent alone, or a mixed solvent of a poor solvent and a good solvent to be precipitated and further, if necessary, the precipitate is washed to get rid of an unreacted monomer, an oligomer, a polymerization initiator, and reaction residues, and purified.

The polymerization reaction solution containing resin obtained by polymerization reaction is dropped to a poor solvent alone, or a mixed solvent of a poor solvent and a good solvent to be precipitated to thereby obtain resin as a precipitate (a precipitation process). Further, this operation may be repeated, that is, the precipitate may be redissolved in a good solvent, re-precipitated similarly to the above, and resin may be obtained as a precipitate (a re-precipitation process).

After that, if necessary, by washing and purification of the precipitate, unnecessary matters such as an unreacted monomer, an oligomer, a polymerization initiator, and reaction residues can be got rid of.

The poor solvents are not especially restricted so long as they do not dissolve resins, and they can be properly selected from the following solvents in accordance with the kinds of resins: for exaple, hydrocarbons (aliphatic hydrocarbons, e.g., pentane, hexane, heptane, and octane, alicyclic hydrocarbons, e.g., cyclohexane and methylcyclohexane, and aromatic hydrocarbons, e.g., benzene, toluene, and xylene), hydrocarbon halides (aliphatic hydrocarbon halides, e.g., methylene chloride, chloroform, and carbon tetrachloride, and aromatic hydrocarbon halides, e.g., chlorobenzene and dichlorobenzene), nitro compounds (e.g., nitromethane and nitroethane), nitriles (e.g., acetonitrile and benzonitrile), ethers (chain-like ethers, e.g., diethyl ether, diisopropyl ether, and dimethoxyethane, and cyclic ethers, e.g., tetrahydrofuran and dioxane), ketone (e.g., acetone, methyl ethyl ketone, and diisobutyl ketone), esters (e.g., ethyl acetate and butyl acetate), carbonates (e.g., dimethyl carbonate, diethyl carbonate, ethylene carbonate, and propylene carbonate), alcohols (e.g., methanol, ethanol, propanol, isopropyl alcohol, and butanol), carboxylic acid (acetic acid), water, and mixed solvents containing these solvents.

The preferred solvents of these are water, alcohols, such as methanol and isopropanol, and saturated hydrocarbons such as hexane and heptane. Further, the good solvents are not especially restricted so long as they are capable of dissolving a monomer, an oligomer, a polymerization initiator and the residues thereof, but from the point of the control of manufacturing processes, the same solvents as the polymerization solvents are preferred.

By bringing the reaction solution into contact with solvents in which the resins are hardly soluble or insoluble (poor solvents) in a volume amount of 10 times or less of the reaction solution, and preferably in a volume amount of from 10 to 5 times, the resins can be precipitated as solids.

The use amount of the solvent for precipitation or re-precipitation can be optionally selected considering the efficiency and the yield, but it is generally from 100 to 10,000 mass parts per 100 mass parts of the resin-containing solution, preferably from 200 to 2,000 mass parts, and more preferably from 300 to 1,000 mass parts.

The temperature at the time of precipitation or re-precipitation can be optionally selected considering the efficiency and the operational property, but the temperature is generally from 0 to 50° C. or so, and preferably around room temperature (e.g., from 20 to 35° C. or so). Precipitation or re-precipitation operation can be performed by well-known methods such as a batch system and a continuous system using a conventional mixing vessel such as a stirring tank.

Washing with Water:

It is also preferred to have a process of bringing the resin obtained by polymerization into contact with an aqueous solution.

At the time of contact, it is preferred that both are mixed so as to be well brought into contact with each other, by a single stage or multistage alternating or countercurrent treatment. As preferred contact means, an extraction means is exemplified. Extraction is performed such that the organic solvent solution and the aqueous solution are mixed one time, or a plurality of times by using a new aqueous solution each time, for example, by mixing 3 to 4 times repeatedly (alternating extraction or multistage alternating extraction), or mixing one time or several times by reusing the aqueous solution after alternating extraction (countercurrent extraction or multi-stage countercurrent extraction). In extraction, the conditions of temperature and time are not especially restricted so long as the resin is not adversely influenced, and preferably performed at 20 to 70° C. and 10 minutes or more per mixture of 1 time.

By bringing the resin into contact with water, aqueous components in the resin can be removed, so that elution of impurities into an immersion liquid can be reduced.

It is preferred to extract by dividing resin formed by polymerization to an organic solvent layer and water-soluble components as impurities to a water layer by extracting operation using an organic solvent and water.

The material to be treated in the extraction process is resin formed by polymerization or a solution containing the resin, that is, any of polymeric solution at the time of termination of polymerization, and solutions obtained by subjecting the polymeric solution to appropriate treatment such as dilution, concentration, filtration and washing may be used. As the organic solvents, any solvent can be used so long as it is capable of dissolving the resin and separating from water. The use amount of the organic solvent and water can be arbitrarily determined within the range of capable of separating an organic solvent layer and water layer. As a preferred embodiment, an organic solvent having a specific gravity of 0.95 or less (in particular, an organic solvent having a solubility parameter of 20 $MPa^{1/2}$ or less) and water are added to a polymeric solution obtained by a polymerization process and extracted (washed).

The water used here is preferably ion exchange water having electrical resistance value of 10 MΩ or more.

The aqueous solution is preferably acidic.

After contact with the aqueous solution containing such an acidic compound, the mixture of the resin separated from the aqueous solution and an organic solvent is preferably used in the contact treatment with ion exchange water. The ion exchange water used here is preferably ion exchange water having electrical resistance value of 10 MΩ or more. It is also the same in the case of using ion exchange water to dissolve an acidic compound. The contact treatment may be performed only one time, but it is also effective that the contact treatment is repeated a plurality of times such that liquid separation is performed after mixing the mixture with an organic solvent and ion exchange water, liquid separation is performed after adding and mixing ion exchange water again to an organic layer, and these operations are further repeated according to cases. The use proportion of both in the contact treatment, and conditions of the temperature and the time may be almost the same as in the case of the contact treatment with the aqueous solution containing an acidic compound described above. After termination of contact treatment with ion exchange water, the water content mixed in the mixture of (meth)acrylates and an organic solvent can be easily removed by vacuum distillation or azeotropic distillation.

Repulping Treatment and Rinsing Treatment Using Poor Solvents:

After precipitation purified the resin obtained by polymerization, it is preferred to perform (i) repulping treatment using the poor solvent of the resin, and (ii) rinsing treatment using the poor solvent of the resin. In connection with the repulping treatment and the rinsing treatment, JP-A-2003-231721 can be referred to.

It is preferred that the precipitation purified resin is further subjected to (iii) rinsing treatment using water.

As the solvents for use in (i) repulping treatment and (ii) rinsing treatment, poor solvents of the resin are sufficient and, for example, the solvents exemplified above as the solvents for precipitation can be used. Of these solvents, at least water, alcohol solvents such as methanol, and hydrocarbon solvents are preferred.

The use amount of the solvents in (i) repulping treatment (repulping solvents) is from 1 to 200 times by mass to the resin, preferably from 5 to 100 times by mass, and more preferably from 10 to 70 times by mass or so.

The use amount of the solvents in (ii) rinsing treatment (rinsing solvents) is from 1 to 100 times by mass to the resin, and preferably from 2 to 20 times by mass or so. (i) Repulping treatment and (ii) rinsing treatment can be performed one or two or more times respectively.

Although the temperature in performing (i) repulping treatment and (ii) rinsing treatment differs depending upon the kinds of solvents used, it is generally from 0 to 100° C., and preferably from 10 to 60° C. or so. (i) Repulping treatment and (ii) rinsing treatment are performed in an appropriate container.

Liquids after treatment (a repulping liquid and a rinsing liquid) are removed by decantation (including extracting operation of supernatants). When both (i) repulping treatment and (ii) rinsing treatment are performed, the order does not matter, but (i) repulping treatment is performed prior to (ii) rinsing treatment in many cases.

(iii) Rinsing Treatment Using Water:

Metal components are contained in polymeric solvents and precipitation solvents in many cases. When these metal components are adhered to the surface of resin, there are cases where resist performances are sharply deteriorated. Such metal components adhered to the surface of resin can be efficiently removed by performing (iii) rinsing treatment using water to the resin purified by precipitation.

The time of performing (iii) rinsing treatment using water is not especially restricted, and the rinsing treatment may be performed any of before and after (i) repulping treatment and before and after (ii) rinsing treatment.

The use amount of water used in (iii) rinsing treatment is from 1 to 100 times by mass to the resin, and preferably from 2 to 20 times by mass or so. (iii) Rinsing treatment can be performed one or two or more times.

The resin subjected to repulping treatment and rinsing treatment is dried and then dissolved in a solvent for resist with a photo-acid generator and various kinds of additives (according to necessity) to prepare a resin composition for a photo-resist. The drying temperature of the resin is from 20 to 120° C., and preferably from 40 to 100° C. or so. It is preferred to perform drying under reduced pressure.

Physical Properties and Composition of Resin (HR):

The resin (HR) locally distributed on the surface of a resist and hydrophobitizing the surface of the resist is sufficient to be resin that increases and improves the receding contact angle of the resist surface by the addition to the resist, but, as described above, it is extremely effective in patterning by immersion exposure that the content of a high molecular weight component having a molecular weight of 30,000 or more accounts for 0.1% or less.

As the resin (HR), when the resin (HR) alone is dissolved in a solvent, coated, and dried to form a film comprising the resin (HR) alone, the receding contact angle of the film is preferably from 70 to 110°.

When the resin (HR) is added to a resist, the addition amount of the resin (HR) is preferably from 0.1 to 20 mass % based on all the solids content of the resist composition, more preferably from 0.1 to 10 mass %, and still more preferably from 0.1 to 5 mass %.

It is preferred to set up the addition amount of the resin (HR) by properly adjusting so that the receding contact angle of the resist film becomes from 60 to 80°.

Here, the receding contact angle is the one under room temperature and atmospheric pressure. The receding contact angle is a receding contact angle when a droplet (an immersion liquid, pure water is representative) begins to drop by slanting a resist film.

In general, a receding contact angle almost correlates with a sliding angle, and the larger the receding contact angle and the smaller the sliding angle of a film, the better is the water repellency. A receding contact angle can be measured, for example, with a dynamic contact angle meter (manufactured by KYOWA INTERFACE SCIENCE CO., LTD.) by an expansion contraction method.

Incidentally, the resist (HR) can also be preferably used as a resist-protective film (hereinafter also referred to as "a topcoat") that is sometimes provided on a resist film in patterning by immersion exposure.

The resist-protective film is a film provided between a resist film and an immersion liquid so that the resist film is not directly in contact with the immersion liquid and hardly soluble in the immersion liquid. When the resin (HR) is used as a resist-protective film, the resin (HR) is dissolved in a solvent not dissolving the resist film (a non-water-soluble organic solvent) and coated on the resist film and used.

As described above, the resin (HR) is locally distributed on the interface, but it does not need to have a hydrophilic group in the molecule unlike a surfactant, and not necessary to contribute to homogeneous mixture of polar and non-polar materials.

As preferred resins (HR), resin having a fluorine atom (HR-F), resin having a silicon atom (HR-SI), and resin having a specific repeating unit (HR-C) as shown below can be exemplified. It is especially preferred not to have an acid-decomposable group and an alkali-soluble group.

Resin Having a Fluorine Atom (HR-F):

As partial structures having a fluorine atom, resins having an alkyl group having a fluorine atom, having a cycloalkyl group having a fluorine atom, and having an aryl group having a fluorine atom are preferred. These groups preferably have a perfluoroalkyl group having from 1 to 4 carbon atoms.

The alkyl group having a fluorine atom (preferably having from 1 to 10 carbon atoms, and more preferably having from 1 to 4 carbon atoms) is a straight chain or branched alkyl group having at least one hydrogen atom substituted with a fluorine atom, and which group may further have other substituents.

The cycloalkyl group having a fluorine atom is a monocyclic or polycyclic cycloalkyl group having at least one hydrogen atom substituted with a fluorine atom, and which group may further have other substituent.

The aryl group having a fluorine atom is a phenyl group or a naphthyl group in which at least one hydrogen atom is substituted with a fluorine atom, and which group may further have other substituent.

The formulae of the alkyl group having a fluorine atom, the cycloalkyl group having a fluorine atom, and the aryl group having a fluorine atom are shown below, but the invention is by no means restricted thereto.

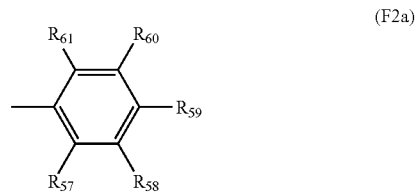

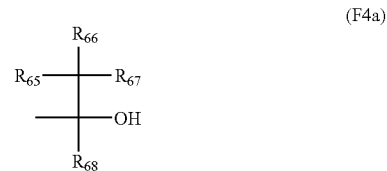

In formulae (F2a) to (F4a), each of $R_{57}$ to $R_{68}$ independently represents a hydrogen atom, a fluorine atom or an alkyl group, provided that at least one of $R_{57}$ to $R_{61}$, $R_{62}$ to $R_{64}$, and $R_{65}$ to $R_{68}$ represents a fluorine atom, or an alkyl group having at least one hydrogen atom substituted with a fluorine atom (preferably having from 1 to 4 carbon atoms). It is preferred that all of $R_{57}$ to $R_{61}$ and $R_{65}$ to $R_{67}$ represent a fluorine atom. Each of $R_{62}$, $R_{63}$ and $R_{68}$ preferably represents an alkyl group having at least one hydrogen atom substituted with a fluorine atom (preferably having from 1 to 4 carbon atoms), and more preferably a perfluoroalkyl group having from 1 to 4 carbon atoms. $R_{62}$ and $R_{63}$ may be linked to each other to form a ring.

As the specific examples of the groups represented by formula (F2a), e.g., a p-fluorophenyl group, a pentafluorophenyl group, and a 3,5-di(trifluoromethyl)phenyl group are exemplified.

As the specific examples of the groups represented by formula (F3a), e.g., a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluoro-cyclobutyl group, and a perfluorocyclohexyl group are exemplified. Of these groups, a hexafluoroisopropyl group, a heptafluoroisopropyl group, a hexafluoro(2-methyl)-isopropyl group, an octafluoroisobutyl group, a nonafluoro-t-butyl group, and a perfluoroisopentyl group are preferred, and a hexafluoroisopropyl group and a heptafluoroisopropyl group are more preferred.

As the specific examples of the groups represented by formula (F4a), e.g., —C(CF$_3$)$_2$OH, —C(C$_2$F$_5$)$_2$OH, —C(CF$_3$)(CH$_3$)OH, and —CH(CF$_3$)OH are exemplified, and —C(CF$_3$)$_2$OH is preferred.

The specific examples of the repeating units containing the group represented by any of formulae (F2a) to (F4a) are shown below.
In the following formulae, $X_1$ represents a hydrogen atom, —$CH_3$, —F or —$CF_3$.
$X_2$ represents —F or —$CF_3$.
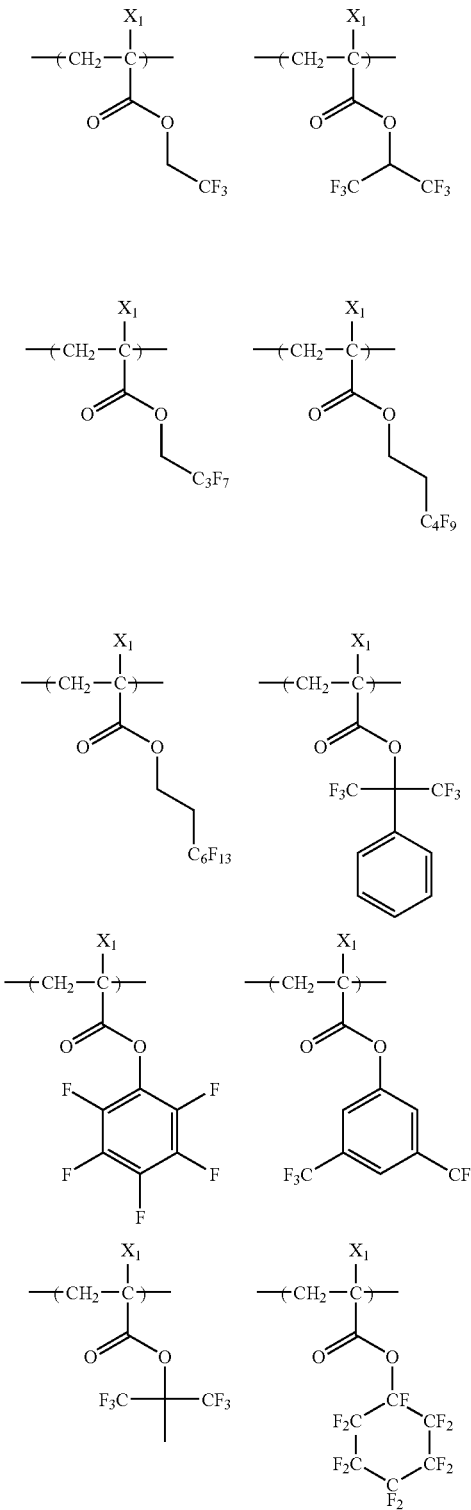
-continued
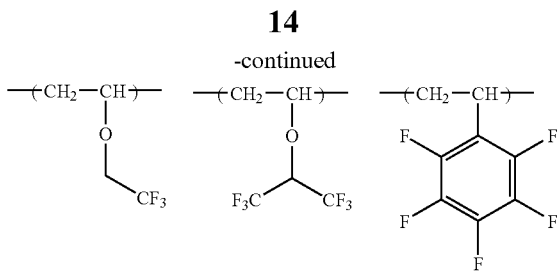
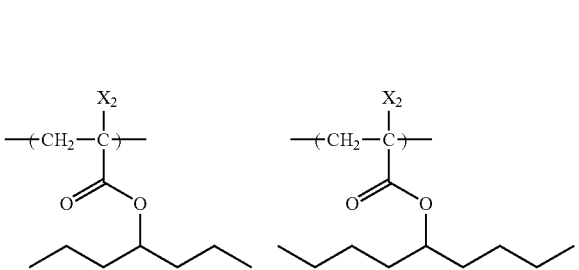
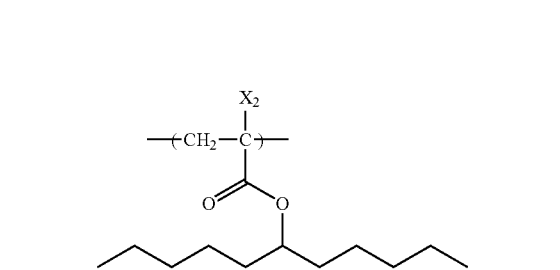
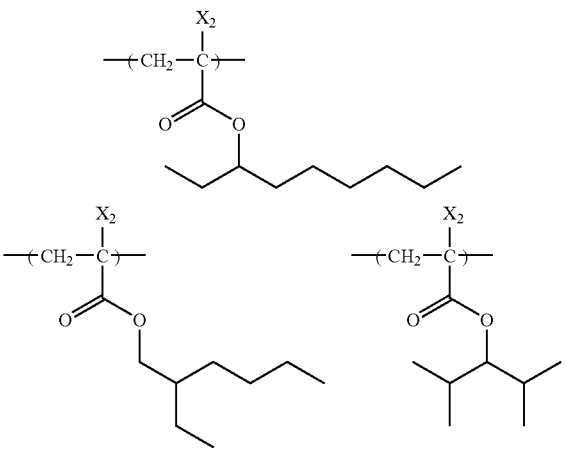
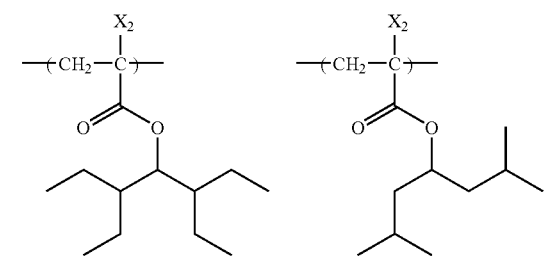
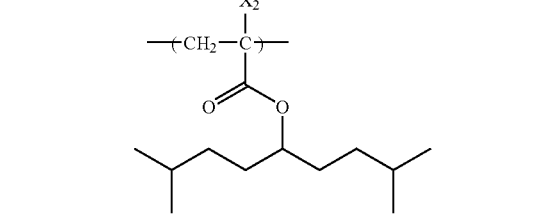

-continued

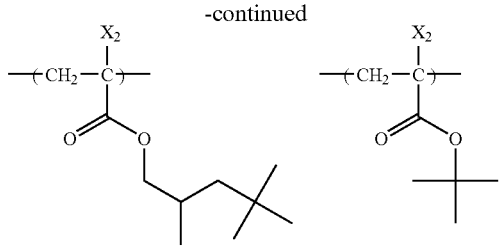

Resin Having a Silicon Atom (HR-SI):

As the partial structure having a silicon atom, the resin (HR) is preferably resin having an alkylsilyl structure (preferably a trialkylsilyl group), or a cyclic siloxane structure.

As the alkylsilyl structure and the cyclic siloxane structure, the groups represented by any of the following formulae (CS-1) to (CS-3) are specifically exemplified.

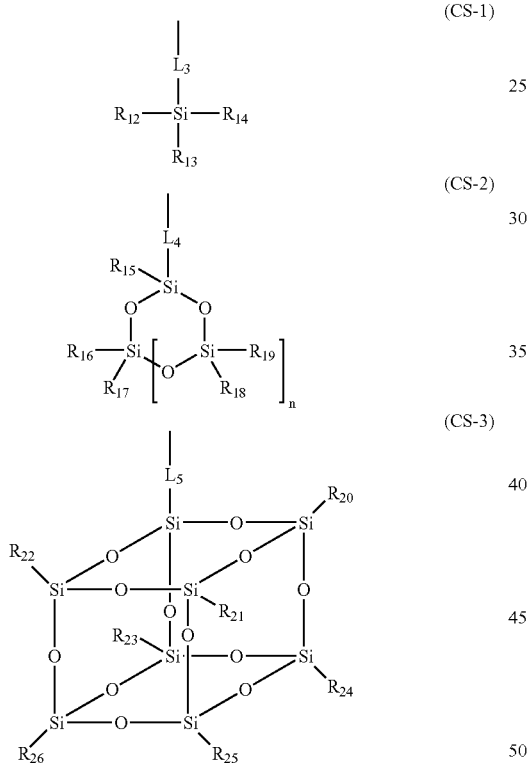

In formulae (CS-1) to (CS-3), each of $R_{12}$ to $R_{26}$ independently represents a straight chain or branched alkyl group (preferably having from 1 to 20 carbon atoms), or a cycloalkyl group (preferably having from 3 to 20 carbon atoms).

Each of $L_3$, $L_4$ and $L_5$ represents a single bond or a divalent linking group. As the divalent linking groups, a single group and a group of combination of two or more groups selected from the group consisting of an alkylene group, a phenylene group, an ether group, a thioether group, a carbonyl group, an ester group, an amido group, a urethane group, and a ureylene group are exemplified.

n represents an integer of from 1 to 5.

The specific examples of the repeating units containing the group represented by any of formulae (CS-1), (CS-2) and (CS-3) are shown below. In the following repeating units, $X_1$ represents a hydrogen atom, —$CH_3$, —F or —$CF_3$.

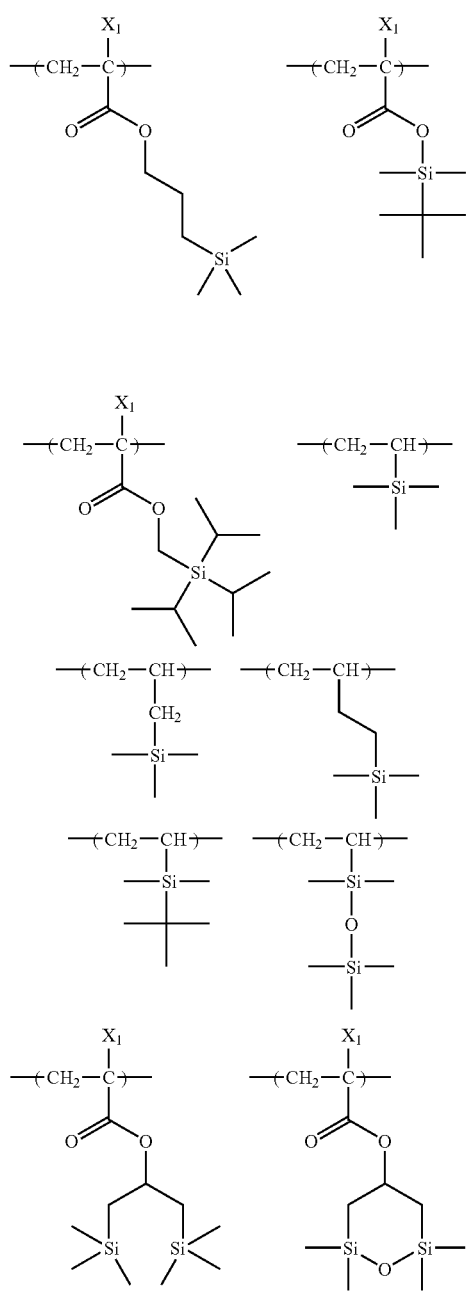

-continued

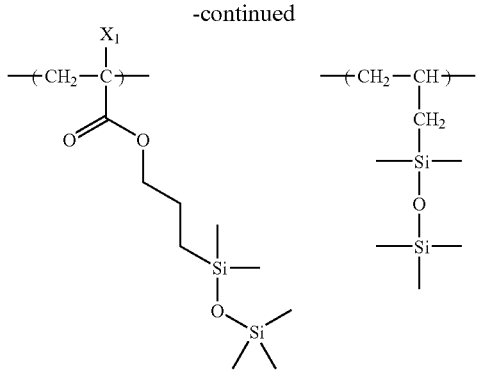

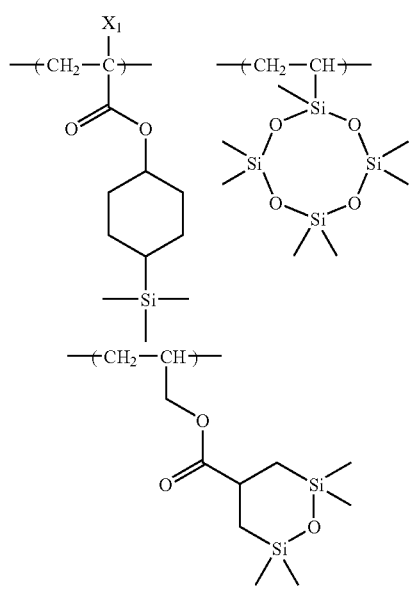

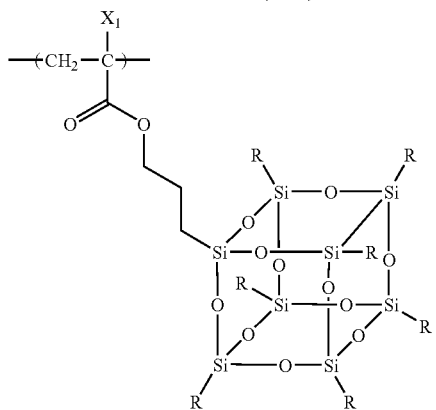

R = CH₃, C₂H₅, C₃H₇, C₄H₉

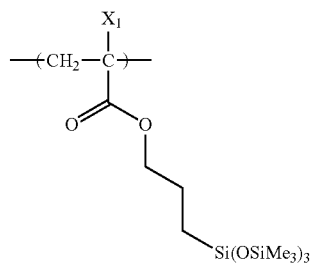

The case where resin (HR) is resin having a specific repeating unit (HR-C) is shown below.

Resins having a specific repeating unit (HR-C) are preferably resins having a repeating unit selected from the following formulae (C-I) to (C-III).

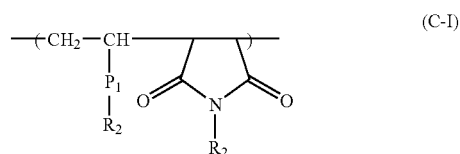  (C-I)

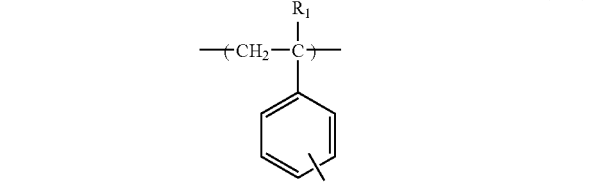  (C-II)

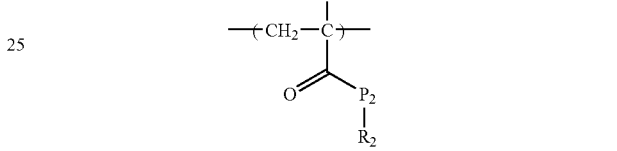  (C-III)

In formulae (C-I) to (C-III), $R_1$ represents a hydrogen atom or a methyl group.

$R_2$ represents a hydrocarbon group having one or more —$CH_3$ partial structures (i.e., a methyl group).

$P_1$ represents a single bond, or an alkylene group, an ether group, or a linking group having two or more of these groups.

$P_2$ represents a linking group selected from —O—, —NR— (where R represents a hydrogen atom or an alkyl group), and —$NHSO_2$—.

n represents an integer of from 1 to 4.

These repeating units may be used alone, or two or more repeating units may be used in combination.

As the hydrocarbon group having one or more —$CH_3$ partial structures (i.e., a methyl group) represented by $R_2$ in formulae (C-I) to (C-III), an alkyl group, alkyloxy group, alkyl-substituted cycloalkyl group, alkenyl group, alkyl-substituted alkenyl group, alkyl-substituted cycloalkenyl group, alkyl-substituted aryl group, and alkyl-substituted aralkyl group, each having one or more —$CH_3$ partial structures are exemplified, and an alkyl group and an alkyl-substituted cycloalkenyl group are preferred. It is more preferred for the hydrocarbon group having one or more —$CH_3$ partial structures represented by $R_2$ to have two or more —$CH_3$ partial structures.

The alkyl group having at least one —$CH_3$ partial structure represented by $R_2$ is preferably a branched alkyl group having from 3 to 20 carbon atoms. As preferred alkyl groups, an isopropyl group, an isobutyl group, a t-butyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group are specifically exemplified. More preferred alkyl groups are an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4- trimethylpentyl group, a 2-ethylhexyl group, a 2,6-dimethylheptyl group, a 1,5-dimethyl-3-heptyl group, and a 2,3,5,7-tetramethyl-4-heptyl group.

As the alkyl group having one —CH₃ partial structure represented by R₂, a straight chain alkyl group having from 1 to 20 carbon atoms is preferred. As preferred alkyl groups, a methyl group, an ethyl group, a propyl group, a butyl group, a pentyl group, a hexyl group, a heptyl group, an octyl group, and a nonyl group are specifically exemplified.

As the alkyloxy group having at least one —CH₃ partial structure represented by R₂, an alkyl group having at least two —CH₃ partial structures to which an ether group is bonded can be exemplified.

The cycloalkyl group represented by R₂ may be monocyclic or polycyclic. Specifically, a group having a monocyclic, bicyclic, tricyclic or tetracyclic structure and having 5 or more carbon atoms can be exemplified. The carbon atom number is preferably from 6 to 30, and especially preferably from 7 to 25. As preferred cycloalkyl groups, an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group can be exemplified. More preferred cycloalkyl groups are an adamantyl group, a norbornyl group, a cyclohexyl group, a cyclopentyl group, a tetracyclododecanyl group, and a tricyclodecanyl group. Still more preferred cycloalkyl groups are a norbornyl group, a cyclopentyl group and a cyclohexyl group.

As the alkenyl group represented by R₂, a straight chain or branched alkenyl group having from 2 to 20 carbon atoms is preferred, and a branched alkenyl group is more preferred.

The aryl group represented by R₂ is preferably an aryl group having from 6 to 20 carbon atoms, e.g., a phenyl group and a naphthyl group can be exemplified, and a phenyl group is preferred.

The aralkyl group represented by R₂ is preferably an aralkyl group having from 7 to 12 carbon atoms, e.g., a benzyl group, a phenethyl group and a naphthylmethyl group can be exemplified.

In formulae (C-I) and (C-II), as the hydrocarbon group having at least two —CH₃ partial structures represented by R₂, specifically an isopropyl group, an isobutyl group, a t-butyl group, a 3-pentyl group, a 2-methyl-3-butyl group, a 3-hexyl group, a 2,3-dimethyl-2-butyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group, a 4-t-butylcyclohexyl group, and an isobornyl group are exemplified. More preferred groups are an isobutyl group, a t-butyl group, a 2-methyl-3-butyl group, a 2,3-dimethyl-2-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group, a 4-t-butylcyclohexyl group, and an isobornyl group.

As the hydrocarbon group having at least two —CH₃ partial structures represented by R₂ in formula (C-III), specifically an isobutyl group, a t-butyl group, a 3-pentyl group, a 2,3-dimethylbutyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group, and a 4-t-butylcyclohexyl group are exemplified. More preferably, the carbon atom number is from 5 to 20, and preferred groups are a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group, and a 4-t-butylcyclohexyl group.

The total content of the repeating units selected from formulae (C-I) to (C-III) is preferably from 50 to 100 mol % to all the repeating units in the resin, more preferably from 80 to 100 mol %, and still more preferably from 90 to 100 mol %.

The preferred specific examples of the repeating units represented by formula (C-I) are shown below, however, the invention is not restricted thereto.

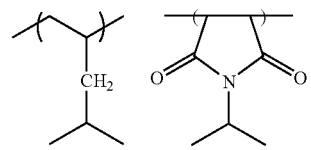

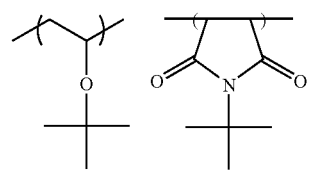

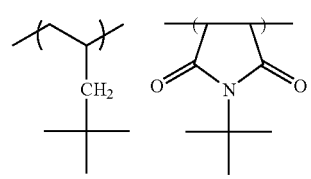

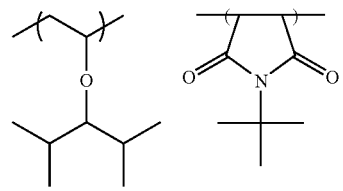

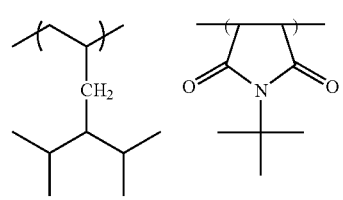

The preferred specific examples of the repeating units represented by formula (C-II) are shown below, however, the invention is not restricted thereto.

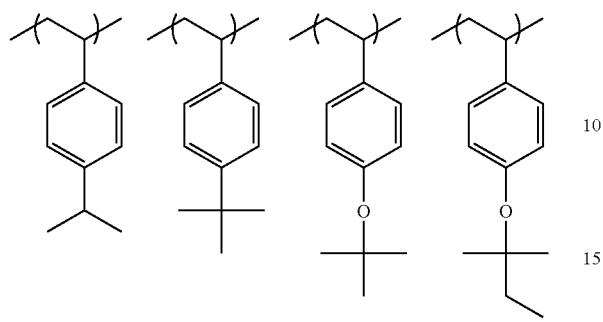

In formula (C-III), when $P_2$ represents an oxygen atom, the carbon atom directly bonding to the oxygen atom is preferably a secondary or tertiary carbon atom.

The preferred specific examples of the repeating units represented by formula (C-III) are shown below, however, the invention is not restricted thereto. In the specific examples, Rx represents a hydrogen atom or a methyl group, and each of Rxa to Rxc represents an alkyl group having from 1 to 4 carbon atoms.

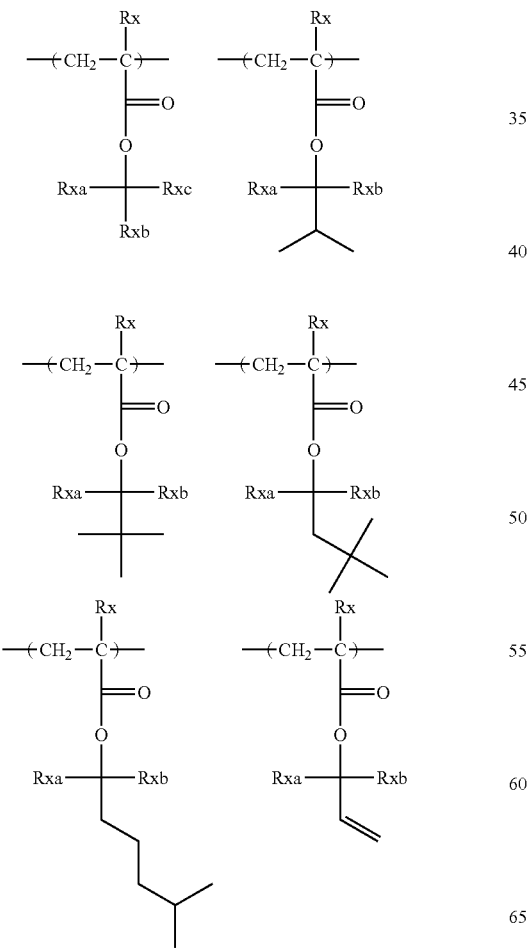

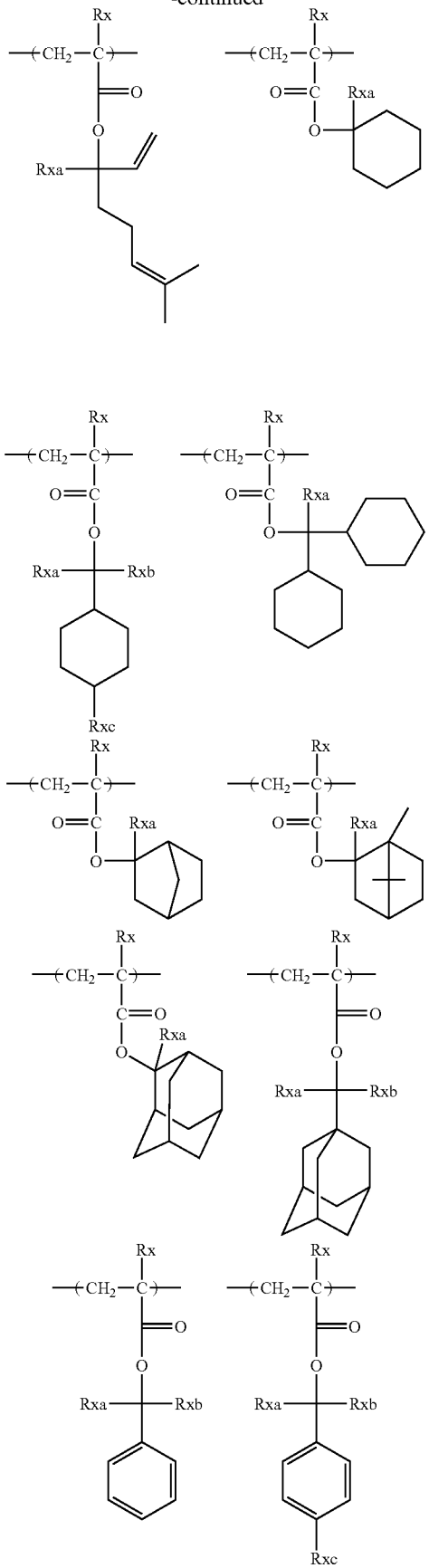

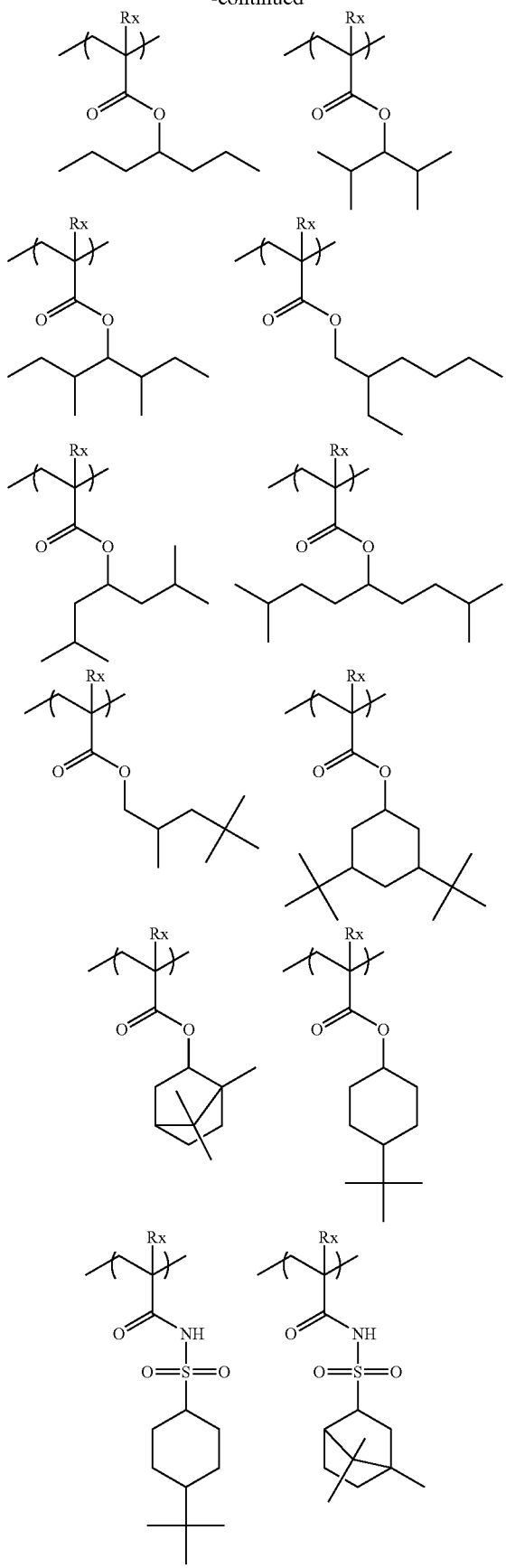

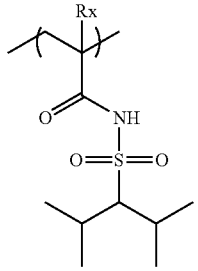

It is preferred that the resin of (HR-C) component does not have a silicon atom and a fluorine atom.

It is preferred that the resin of (HR-C) component does not have elements other than a carbon atom, a hydrogen atom, an oxygen atom, a nitrogen atom and a sulfur atom.

Further, the resin (HR) may have at least one group selected from the following (x) to (z).

(x) An alkali-soluble group, (y) A group capable of decomposing by the action of an alkali developing solution to increase the solubility in an alkali developing solution, and (z) A group capable of decomposing by the action of an acid.

However, it is preferred not to have a group selected from the group of (x) to (z).

As (x) alkali-soluble groups, a phenolic hydroxyl group, a carboxylic acid group, a fluorinated alcohol group, a sulfonic acid group, a sulfonamido group, a sulfonylimido group, a (sulfonyl)(carbonyl)methylene group, a (sulfonyl)(carbonyl)-imido group, a bis(carbonyl)methylene group, a bis(carbonyl)imido group, a bis(sulfonyl)methylene group, a bis(sulfonyl)imido group, a tris(carbonyl)methide group, and a tris(sulfonyl)methide group are exemplified.

As preferred alkali-soluble groups, a fluorinated alcohol group (preferably a hexafluoroisopropanol group: —C(CF$_3$)$_2$ (OH)), a sulfonimido group, and a bis(carbonyl)methylene group are exemplified.

As the repeating units having (x) an alkali-soluble group, a repeating unit to the main chain of which an alkali-soluble group is directly bonded such as repeating units by acrylic acid and methacrylic acid, and a repeating unit to the main chain of which an alkali-soluble group is bonded via a linking group are exemplified, and further, an alkali-soluble group can also be introduced to the terminal of a polymer chain by using a polymerization initiator and a chain transfer agent having an alkali-soluble group at the time of polymerization, and every case is preferred.

The content of the repeating unit having (x) an alkali-soluble group is preferably from 1 to 50 mol % to all the repeating units in the resin, more preferably from 3 to 35 mol %, and still more preferably from 5 to 20 mol %.

The specific examples of the repeating units having (x) an alkali-soluble group are shown below.

In the formulae, Rx represents H, —CH₃, —CF₃ or —CH₂OH.
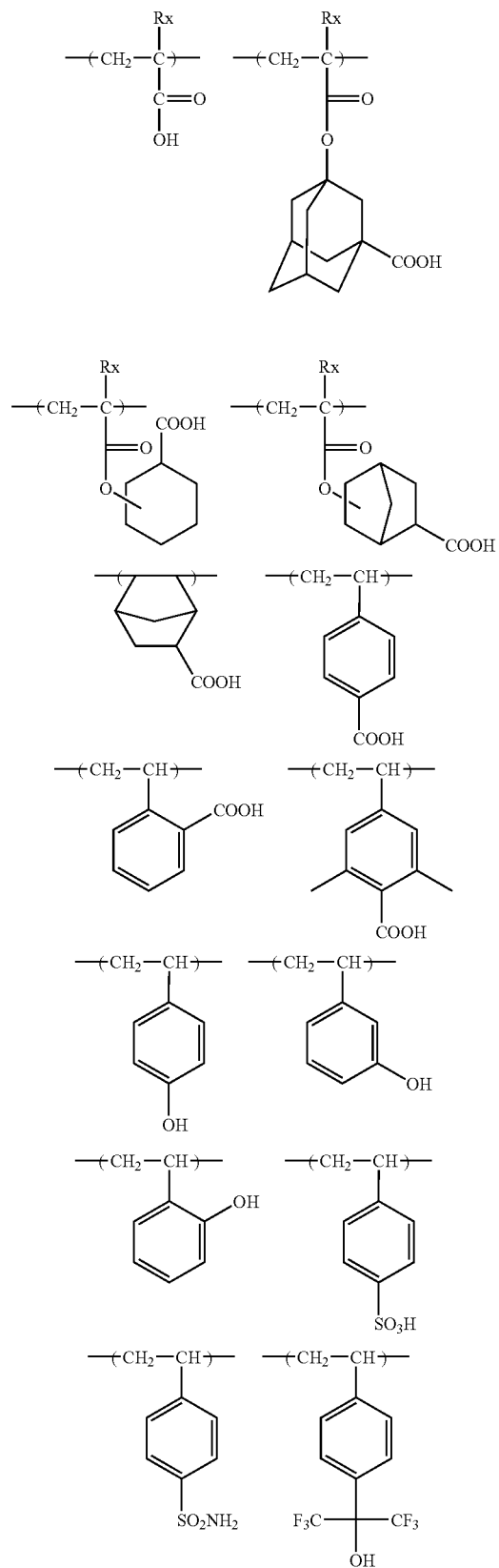
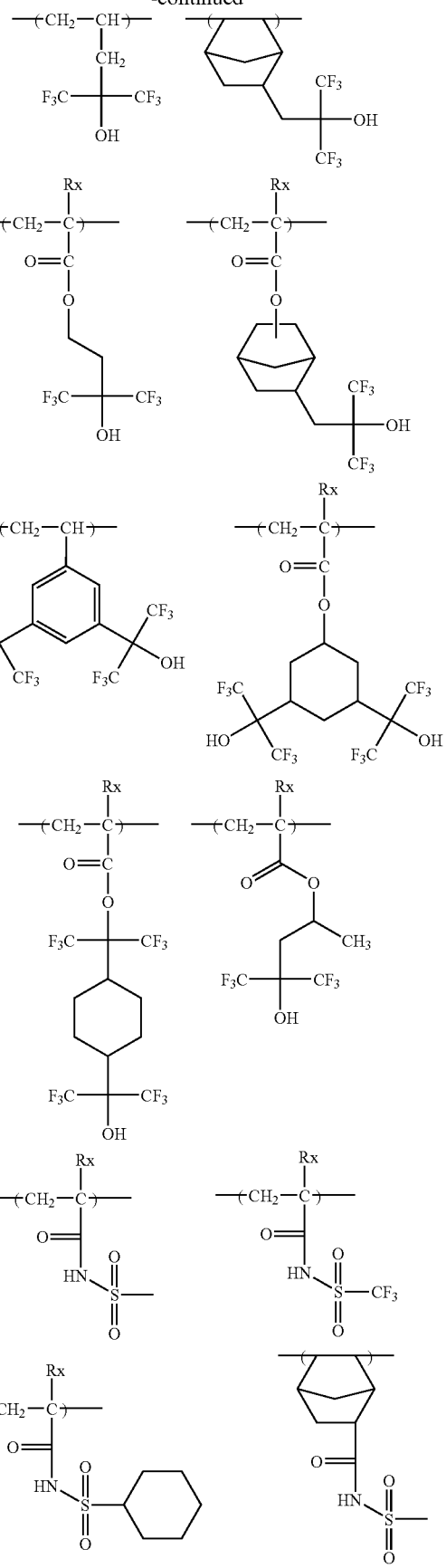

-continued

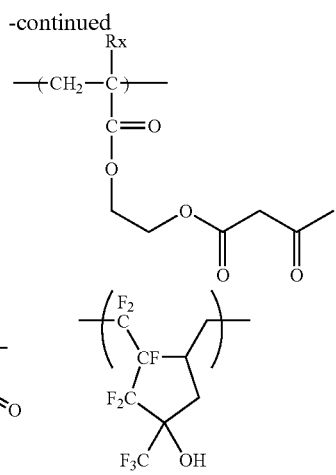

As (y) groups capable of decomposing by the action of an alkali developing solution to increase the solubility in an alkali developing solution, for example, a group having a lactone structure, an acid anhydride group, and an acid imido group are exemplified, and a group having a lactone structure is preferred.

As the repeating units having (y) a group capable of decomposing by the action of an alkali developing solution to increase the solubility in an alkali developing solution, a repeating unit to the main chain of which an alkali-soluble group is bonded via a linking group such as repeating units by acrylate and methacrylate can be exemplified, and (y) a group capable of increasing the solubility in an alkali developing solution can also be introduced to the terminal of a polymer chain by using a polymerization initiator and a chain transfer agent having (y) a group capable of increasing the solubility in an alkali developing solution at the time of polymerization, and every case is preferred.

The content of the repeating unit having (y) a group capable of increasing the solubility in an alkali developing solution is preferably from 1 to 40 mol % to all the repeating units in the resin, more preferably from 3 to 30 mol %, and still more preferably from 5 to 15 mol %.

As the specific examples of the repeating units having (y) a group capable of increasing the solubility in an alkali developing solution, the lactone structures exemplified later in resin (A), and the same structures as the structure represented by formula (VIII) can be exemplified.

As (z) a group capable of decomposing by the action of an acid, the same groups as the acid-decomposable group exemplified in resin (A) can be exemplified. As the repeating unit containing (z) a group capable of decomposing by the action of an acid, the same repeating units as the repeating unit containing an acid-decomposable group exemplified in resin (A) can be exemplified. The content of the repeating unit having (z) a group capable of decomposing by the action of an acid is preferably from 1 to 80 mol % to all the repeating units in the resin, more preferably from 10 to 80 mol %, and still more preferably from 20 to 60 mol %.

When the resin (HR) has a fluorine atom, the content of the fluorine atom is preferably from 5 to 80 mass % to the molecular weight of the resin (HR), and more preferably from 10 to 80 mass %. The content of the repeating unit containing a fluorine atom is preferably from 10 to 100 mass % in the resin (HR), and more preferably from 30 to 100 mass %.

When the resin (HR) has a silicon atom, the content of the silicon atom is preferably from 2 to 50 mass % to the molecular weight of the resin (C), and more preferably from 2 to 30 mass %. The content of the repeating unit containing a silicon atom is preferably from 10 to 100 mass % in the resin (C), and more preferably from 20 to 100 mass %.

The resin (HR) may have repeating units other than the above-described specific repeating units, and a monomer corresponding to the specific repeating unit and a monomer having an ordinarily polymerizable ethylenic double bond can be copolymerized.

The weight average molecular weight of standard polystyrene equivalent of the resin (HR) is preferably from 1,000 to 20,000, and more preferably from 2,000 to 10,000.

Similarly to the acid-decomposable resin (A), it is preferred that resin (HP) is as a matter of course little in impurities such as metals, and the amount of the residual monomers and oligomer components is preferably from 0 to 10 mass %, more preferably from 0 to 5 mass %, and still more preferably from 0 to 1 mass %, by which a resist free from foreign matters in the liquid and fluctuation of sensitivity with the lapse of time can be obtained. Further, in view of resolution, a resist form, the sidewalls of a resist pattern and roughness, the molecular weight distribution (Mw/Mn, also referred to as polydispersity) of resin (HR) is preferably from 1 to 5, and more preferably from 1 to 3.

The specific examples of resins are shown below. Further, in the following table, the molar ratio of repeating units (corresponding to each repeating unit from the left hand in order) in each resin, weight average molecular weight, and the polydispersity are shown.

TABLE 1

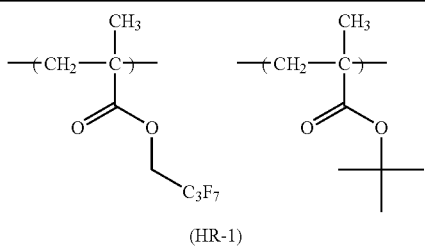

(HR-1)

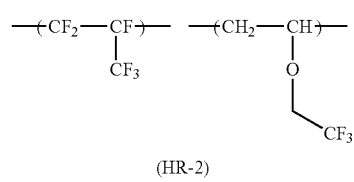

(HR-2)

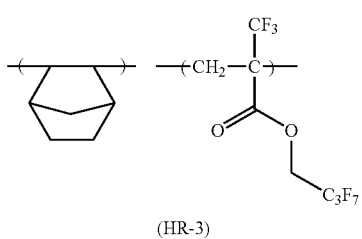

(HR-3)

TABLE 1-continued
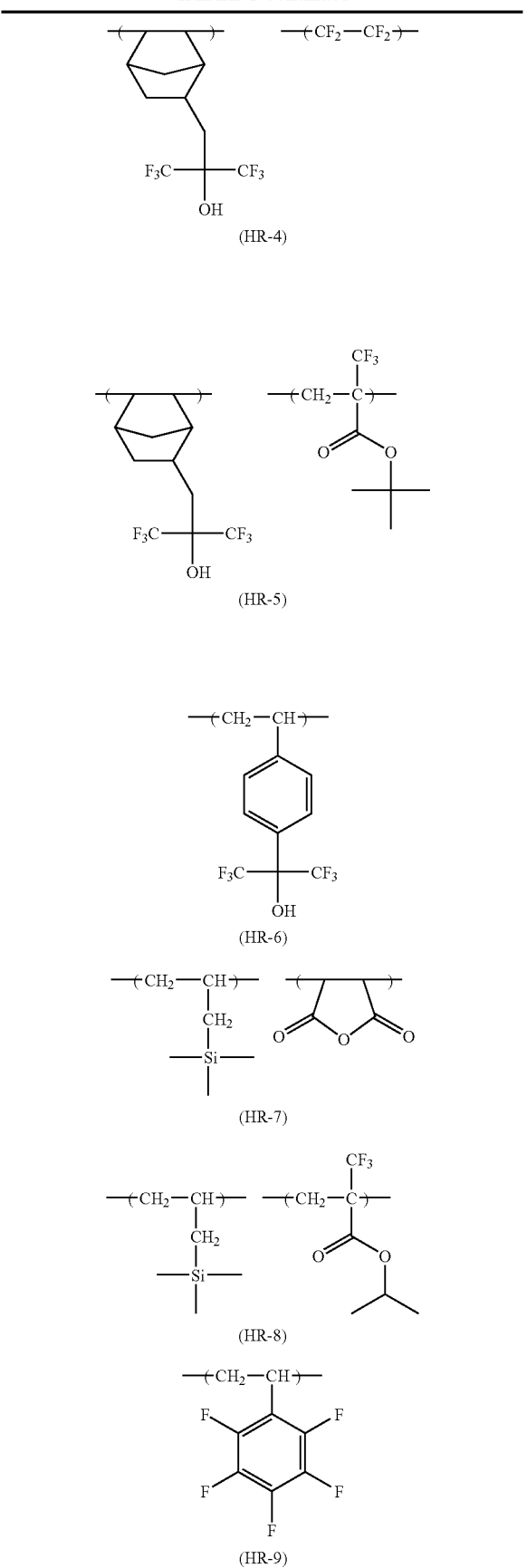
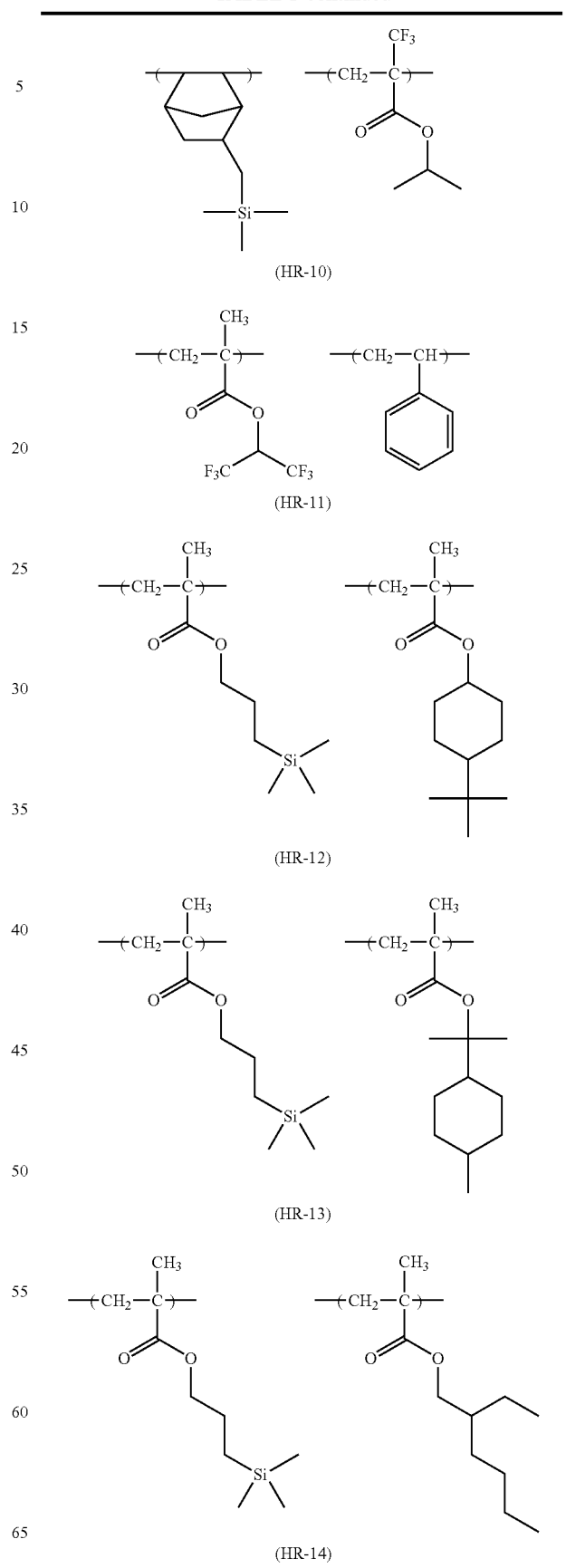

TABLE 1-continued
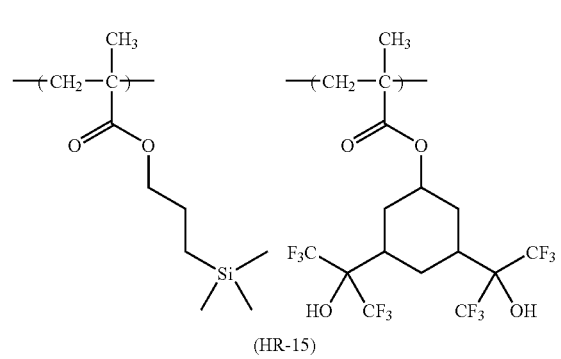
(HR-15)
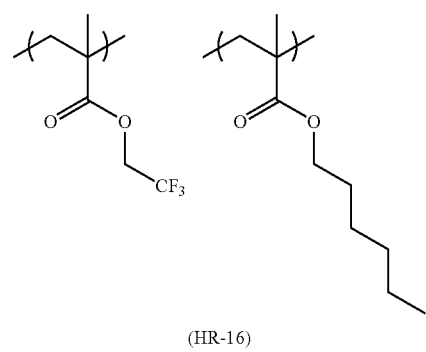
(HR-16)
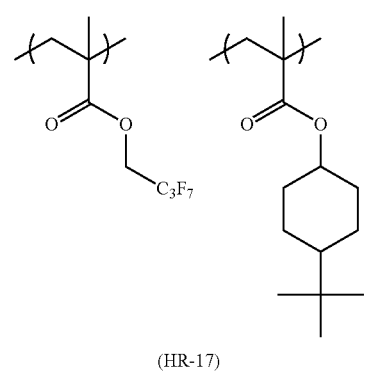
(HR-17)
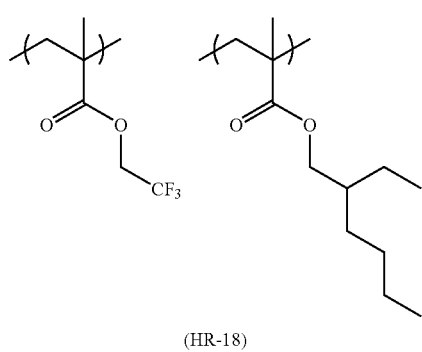
(HR-18)
TABLE 1-continued
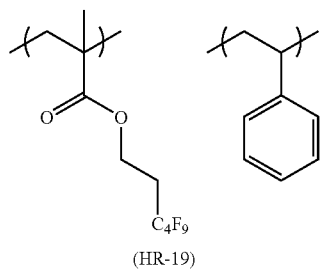
(HR-19)
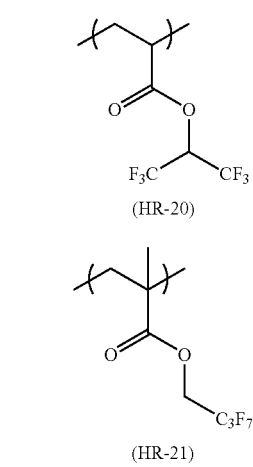
(HR-20)
(HR-21)
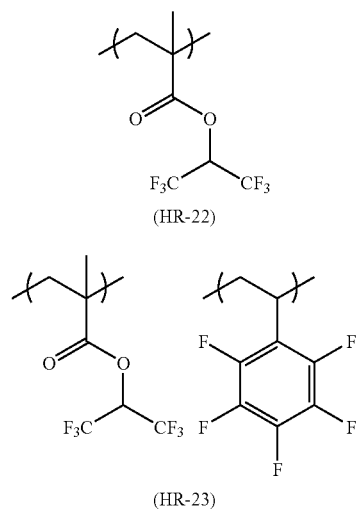
(HR-22)
(HR-23)
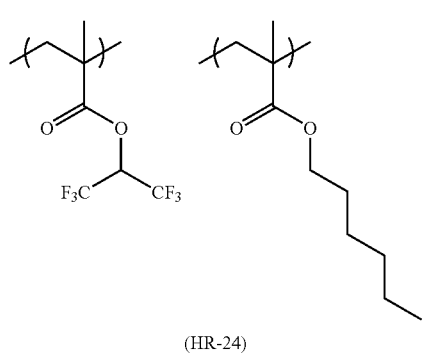
(HR-24)

TABLE 1-continued
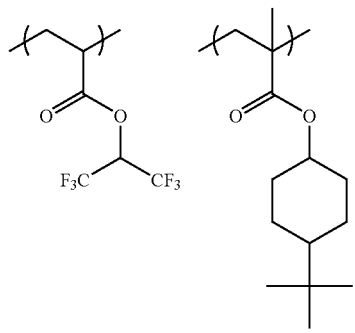
(HR-25)
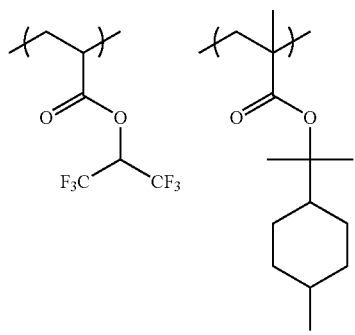
(HR-26)
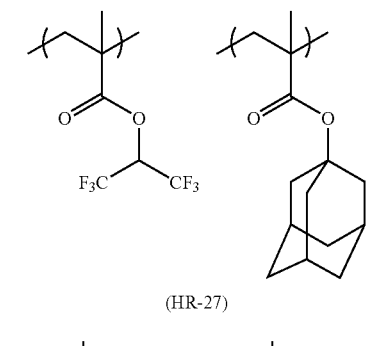
(HR-27)
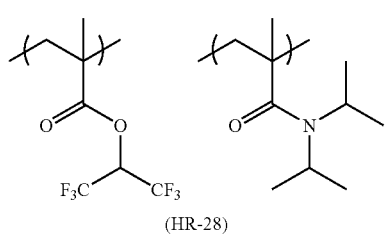
(HR-28)
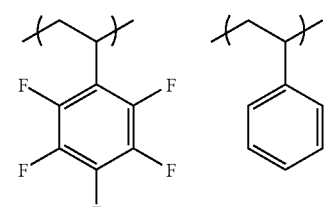
(HR-29)
TABLE 1-continued
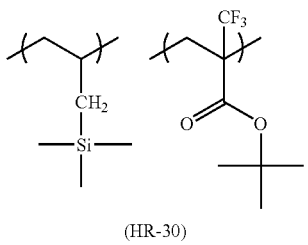
(HR-30)
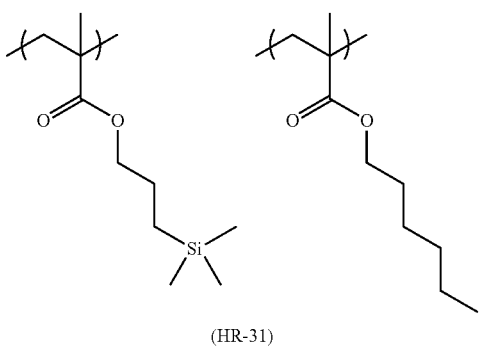
(HR-31)
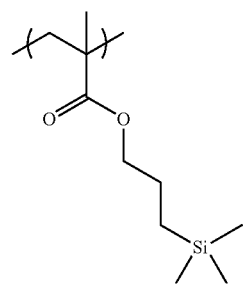
(HR-32)
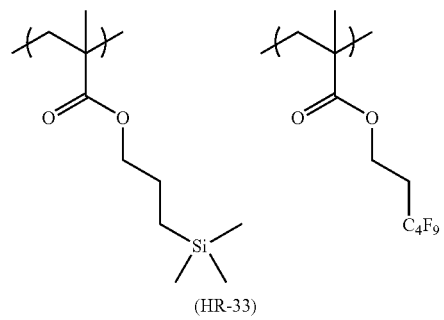
(HR-33)
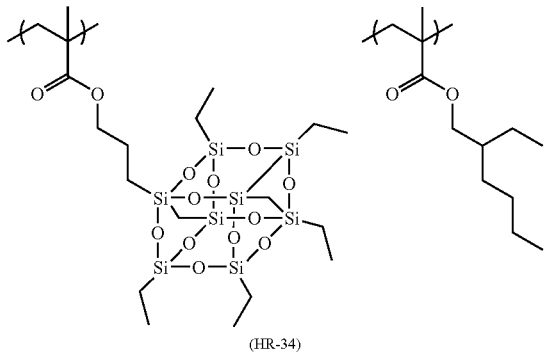
(HR-34)

TABLE 1-continued
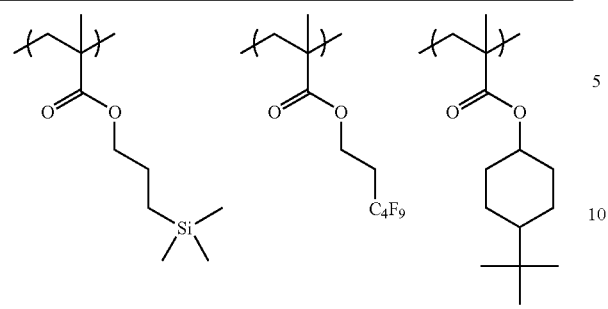
(HR-35)
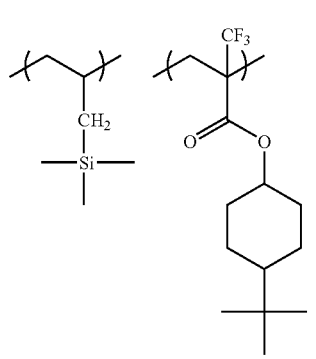
(HR-36)
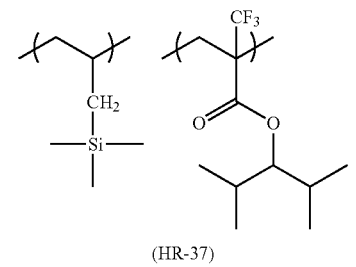
(HR-37)
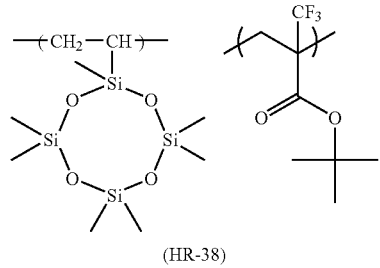
(HR-38)
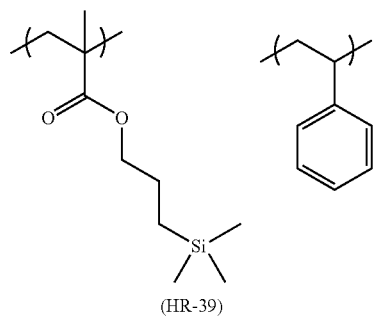
(HR-39)
TABLE 1-continued
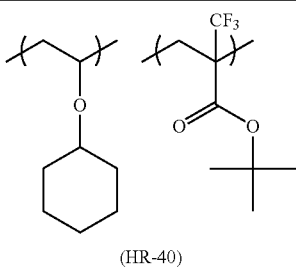
(HR-40)
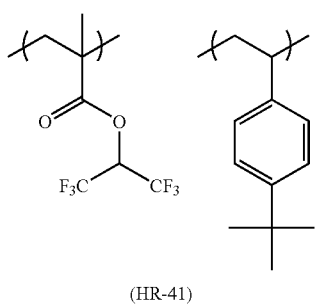
(HR-41)
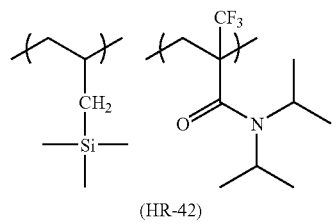
(HR-42)
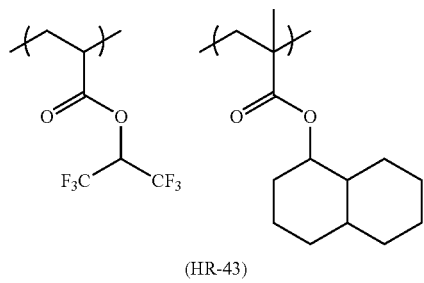
(HR-43)
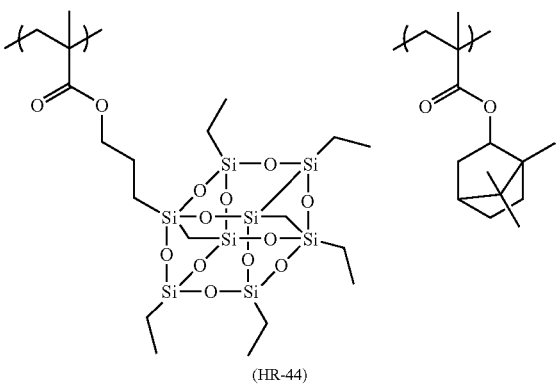
(HR-44)

TABLE 1-continued
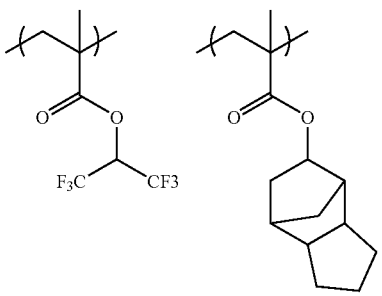
(HR-45)
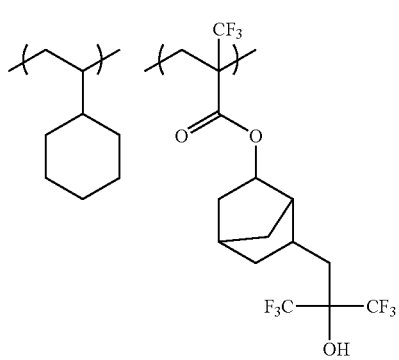
(HR-46)
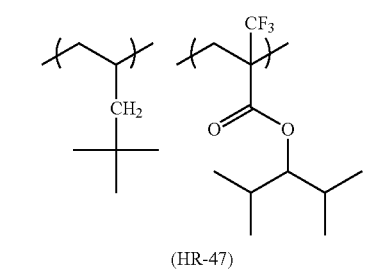
(HR-47)
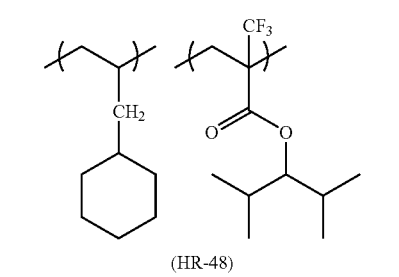
(HR-48)
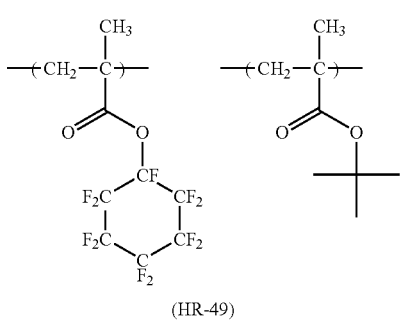
(HR-49)
TABLE 1-continued
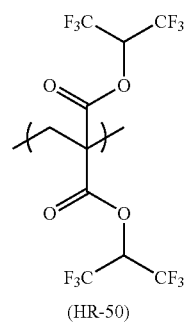
(HR-50)
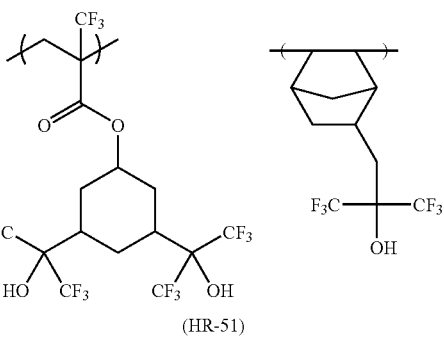
(HR-51)
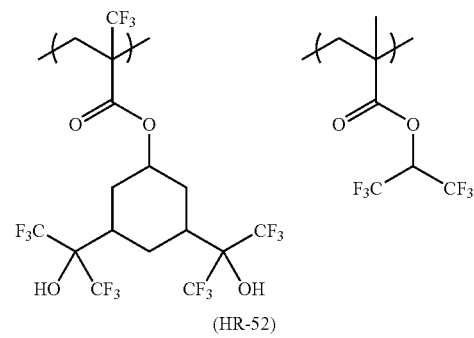
(HR-52)
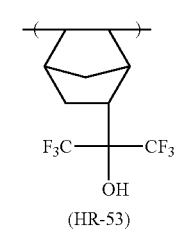
(HR-53)
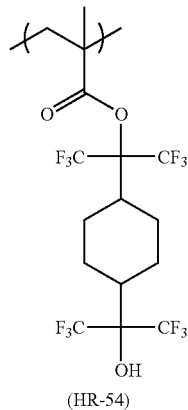
(HR-54)

TABLE 1-continued
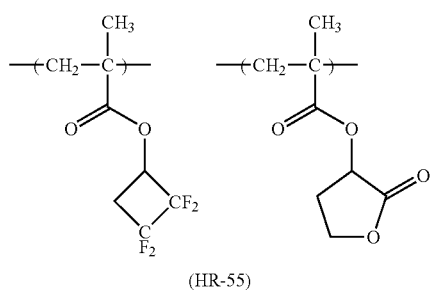
(HR-55)
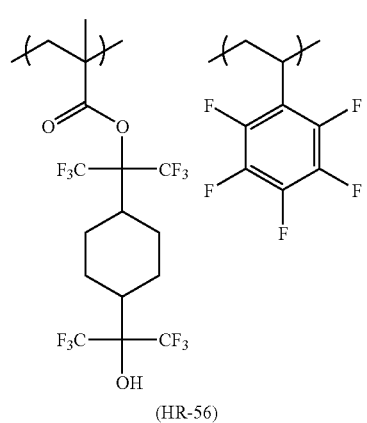
(HR-56)
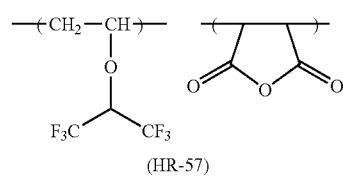
(HR-57)
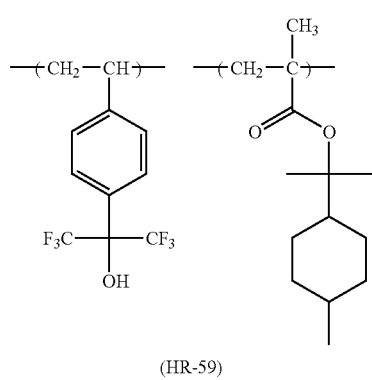
(HR-58)
(HR-59)
TABLE 1-continued
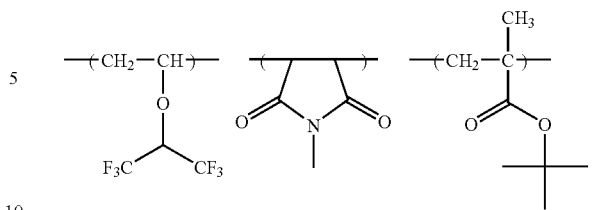
(HR-60)
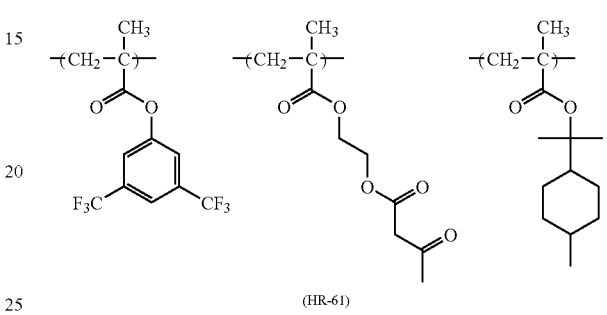
(HR-61)
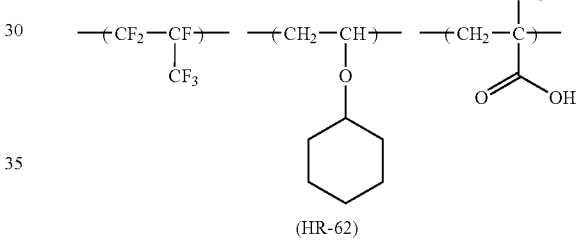
(HR-62)
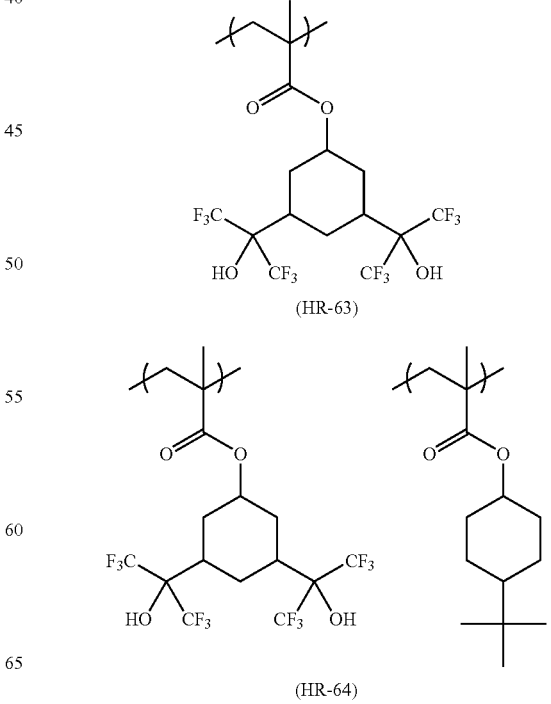
(HR-63)
(HR-64)

TABLE 1-continued
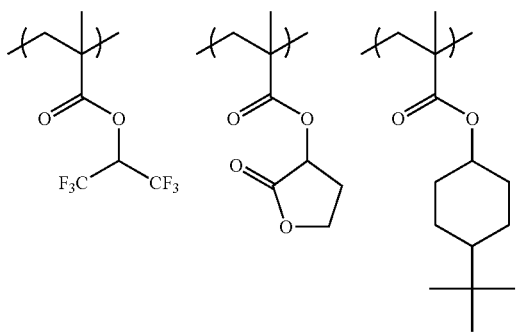
(HR-65)
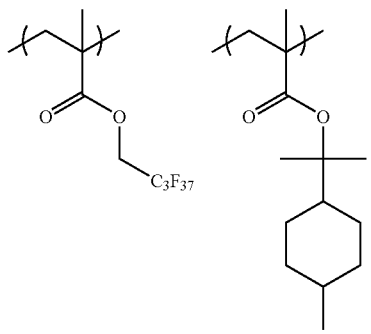
(HR-69)
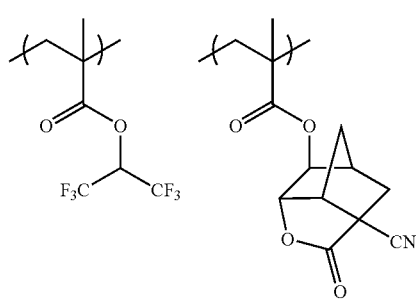
(HR-66)
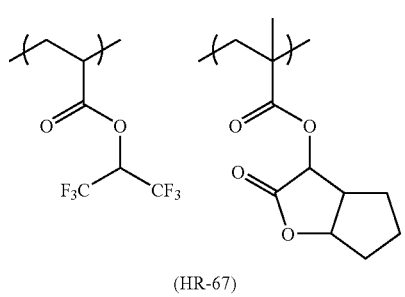
(HR-67)
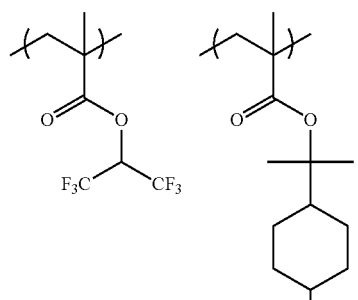
(HR-68)
(HR-70)
(HR-71)
(HR-72)
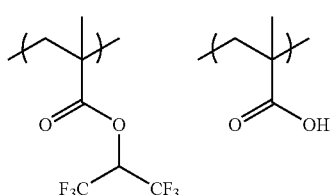
(HR-73)

TABLE 1-continued
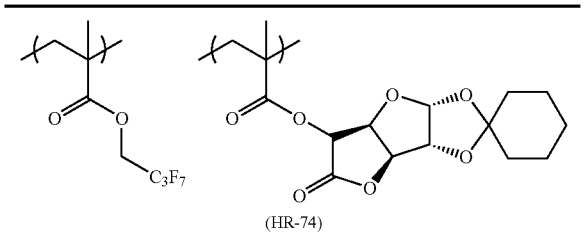
(HR-74)
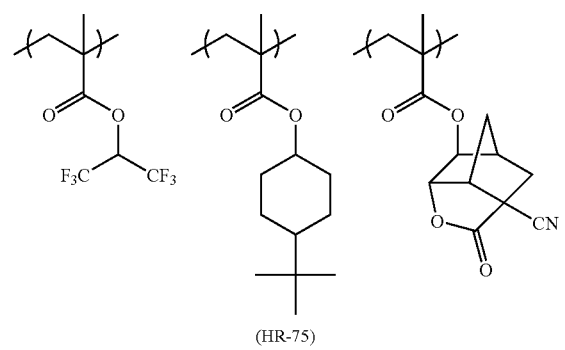
(HR-75)
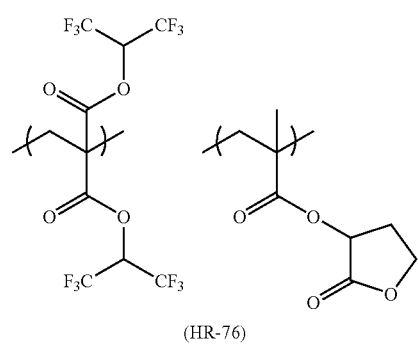
(HR-76)
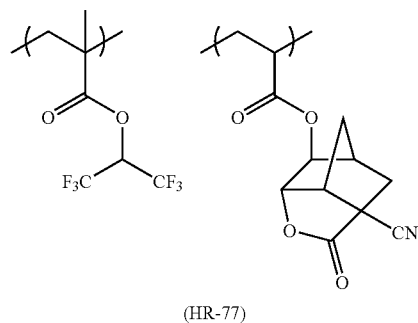
(HR-77)
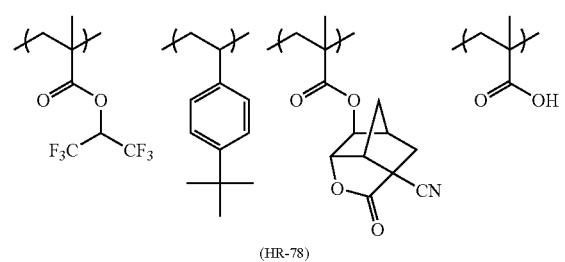
(HR-78)
TABLE 1-continued
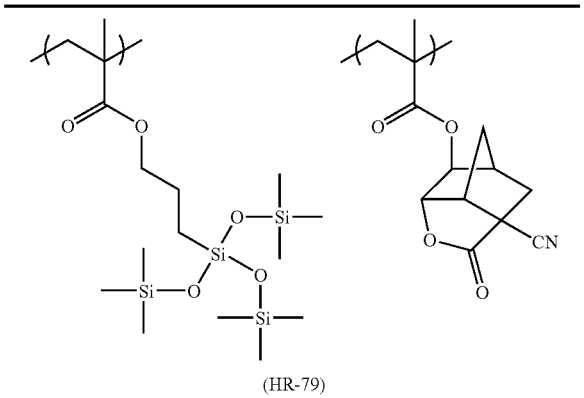
(HR-79)
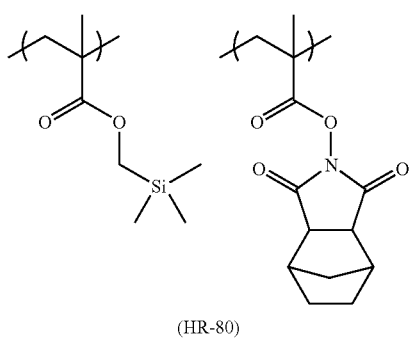
(HR-80)
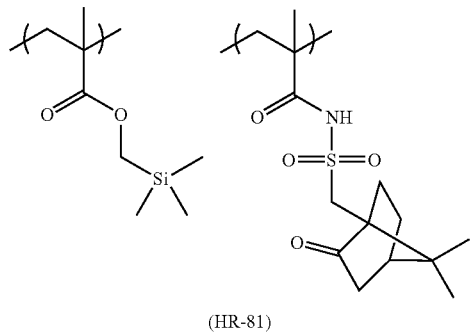
(HR-81)
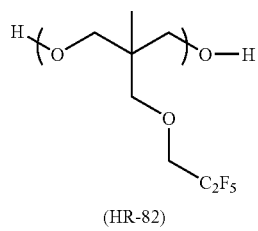
(HR-82)
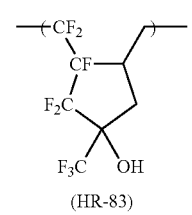
(HR-83)

TABLE 1-continued

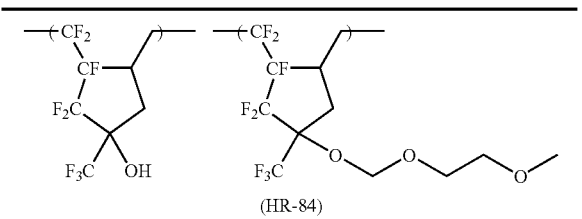

(HR-84)

| Resin | Composition | Mw | Mw/Mn |
|---|---|---|---|
| HR-1 | 50/50 | 8,800 | 2.1 |
| HR-2 | 50/50 | 5,200 | 1.8 |
| HR-3 | 50/50 | 4,800 | 1.9 |
| HR-4 | 50/50 | 5,300 | 1.9 |
| HR-5 | 50/50 | 6,200 | 1.9 |
| HR-6 | 100 | 12,000 | 2.0 |
| HR-7 | 50/50 | 5,800 | 1.9 |
| HR-8 | 50/50 | 6,300 | 1.9 |
| HR-9 | 100 | 5,500 | 2.0 |
| HR-10 | 50/50 | 7,500 | 1.9 |
| HR-11 | 70/30 | 10,200 | 2.2 |
| HR-12 | 40/60 | 8,000 | 2.2 |
| HR-13 | 40/60 | 13,000 | 2.2 |
| HR-14 | 80/20 | 11,000 | 2.2 |
| HR-15 | 60/40 | 9,800 | 2.2 |
| HR-16 | 50/50 | 8,000 | 2.2 |
| HR-17 | 50/50 | 7,600 | 2.0 |
| HR-18 | 50/50 | 12,000 | 2.0 |
| HR-19 | 20/80 | 6,500 | 1.8 |
| HR-20 | 100 | 6,500 | 1.2 |
| HR-21 | 100 | 6,000 | 1.6 |
| HR-22 | 100 | 3,000 | 1.6 |
| HR-23 | 50/50 | 6,000 | 1.7 |
| HR-24 | 50/50 | 8,800 | 1.9 |
| HR-25 | 50/50 | 15,000 | 2.1 |
| HR-26 | 50/50 | 8,000 | 2.0 |
| HR-27 | 80/20 | 8,000 | 1.8 |
| HR-28 | 30/70 | 7,000 | 1.7 |
| HR-29 | 50/50 | 6,500 | 1.6 |
| HR-30 | 40/60 | 6,500 | 1.6 |
| HR-31 | 50/50 | 9,000 | 1.8 |
| HR-32 | 100 | 10,000 | 1.6 |
| HR-33 | 70/30 | 8,000 | 2.0 |
| HR-34 | 10/90 | 8,000 | 1.8 |
| HR-35 | 30/30/40 | 9,000 | 2.0 |
| HR-36 | 50/50 | 6,000 | 1.4 |
| HR-37 | 40/60 | 5,500 | 1.5 |
| HR-38 | 50/50 | 4,800 | 1.8 |
| HR-39 | 60/40 | 5,200 | 1.8 |
| HR-40 | 50/50 | 8,000 | 1.5 |
| HR-41 | 20/80 | 7,500 | 1.8 |
| HR-42 | 50/50 | 6,200 | 1.6 |
| HR-43 | 60/40 | 16,000 | 1.8 |
| HR-44 | 80/20 | 10,200 | 1.8 |
| HR-45 | 50/50 | 12,000 | 2.6 |
| HR-46 | 50/50 | 10,900 | 1.9 |
| HR-47 | 50/50 | 6,000 | 1.4 |
| HR-48 | 50/50 | 4,500 | 1.4 |
| HR-49 | 50/50 | 6,900 | 1.9 |
| HR-50 | 100 | 2,300 | 2.6 |
| HR-51 | 60/40 | 8,800 | 1.5 |
| HR-52 | 68/32 | 11,000 | 1.7 |
| HR-53 | 100 | 8,000 | 1.4 |
| HR-54 | 100 | 8,500 | 1.4 |
| HR-55 | 80/20 | 13,000 | 2.1 |
| HR-56 | 70/30 | 18,000 | 2.3 |
| HR-57 | 50/50 | 5,200 | 1.9 |
| HR-58 | 50/50 | 10,200 | 2.2 |
| HR-59 | 60/40 | 7,200 | 2.2 |
| HR-60 | 32/32/36 | 5,600 | 2.0 |
| HR-61 | 30/40/30 | 9,600 | 1.6 |
| HR-62 | 40/40/20 | 12,000 | 2.0 |
| HR-63 | 100 | 6,800 | 1.6 |
| HR-64 | 50/50 | 7,900 | 1.9 |
| HR-65 | 40/30/30 | 5,600 | 2.1 |
| HR-66 | 50/50 | 6,800 | 1.7 |
| HR-67 | 50/50 | 5,900 | 1.6 |
| HR-68 | 49/51 | 6,200 | 2.1 |
| HR-69 | 50/50 | 8,000 | 1.9 |
| HR-70 | 30/40/30 | 9,600 | 2.3 |
| HR-71 | 30/40/30 | 9,200 | 2.0 |
| HR-72 | 40/29/31 | 3,200 | 2.1 |
| HR-73 | 90/10 | 6,500 | 2.2 |
| HR-74 | 50/50 | 7,900 | 1.9 |
| HR-75 | 20/30/50 | 10,800 | 1.6 |
| HR-76 | 50/50 | 2,200 | 1.9 |
| HR-77 | 50/50 | 5,900 | 2.1 |
| HR-78 | 40/20/30/10 | 14,000 | 2.2 |
| HR-79 | 50/50 | 5,500 | 1.8 |
| HR-80 | 50/50 | 10,600 | 1.9 |
| HR-81 | 50/50 | 8,600 | 2.3 |
| HR-82 | 100 | 15,000 | 2.1 |
| HR-83 | 100 | 6,900 | 2.5 |
| HR-84 | 50/50 | 9,900 | 2.3 |

[2] Positive Resist Composition to Which Resin (HR) is Added:

The resin (HR) can be added to various compositions to hydrophobitiz a film surface, and it is preferred to add it to a positive resist for use in patterning by immersion exposure, and it is especially preferred to add it to a positive resist composition containing (A) resin having a monocyclic or polycyclic alicyclic hydrocarbon structure and capable of increasing the solubility in an alkali developing solution by the action of an acid, (B) a compound capable of generating an acid upon irradiation with actinic ray or radiation, and (D) a solvent.

Each component of a positive resist composition to which the resin (HR) is added will be described below.

(A) Resin Having a Monocyclic or Polycyclic Alicyclic Hydrocarbon Structure and Capable of Increasing the Solubility in an Alkali Developing Solution by the Action of an Acid:

The resin for use in a positive resist composition in the invention is a resin having a monocyclic or polycyclic alicyclic hydrocarbon structure and capable of increasing the solubility in an alkali developing solution by the action of an acid, and having a group capable of decomposing by the action of an acid to generate an alkali-soluble group (hereinafter also referred to as "an acid-decomposable group") on the main chain or side chain or both of the main chain and side chain of the resin (hereafter also referred to as "acid-decomposable resin", "acid-decomposable resin (A)", or "resin (A)").

As alkali-soluble groups, a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group are exemplified.

As preferred alkali-soluble groups, a carboxylic acid group, a fluorinated alcohol group (preferably hexafluoroisopropanol), and a sulfonic acid group are exemplified.

The preferred groups capable of decomposing by the action of an acid (acid-decomposable groups) are groups obtained by substituting the hydrogen atoms of these alkali-soluble groups with groups capable of separation by the action of an acid.

As the group capable of separation by the action of an acid, $-C(R_{36})(R_{37})(R_{38})$, $-C(R_{36})(R_{37})(OR_{39})$, $-C(R_{01})(R_{02})(OR_{39})$ and the like can be exemplified.

In the formulae, each of $R_{36}$ to $R_{39}$ independently represents an alkyl group, a cycloalkyl group, an aryl group, an aralkyl group, or an alkenyl group. $R_{36}$ and $R_{37}$ may be bonded to each other to form a ring.

Each of $R_{01}$ and $R_{02}$ independently represents a hydrogen atom, an alkyl group, a cycloalkyl group, an aryl group, an aralkyl group, or an alkenyl group.

The preferred acid-decomposable groups are a cumyl ester group, an enol ester group, an acetal ester group, a tertiary alkyl ester group, etc., and the more preferred group is a tertiary alkyl ester group.

The positive resist composition in the invention having a monocyclic or polycyclic alicyclic hydrocarbon structure and containing the resin capable of increasing the solubility in an alkali developing solution by the action of an acid can be preferably used in the case of irradiation with ArF excimer laser rays.

The resin having a monocyclic or polycyclic alicyclic hydrocarbon structure and decomposed by the action of an acid to increase solubility in an alkali developing solution (hereinafter also referred to as "alicyclic hydrocarbon series acid-decomposable resin") is preferably resin containing at least one repeating unit selected from the group consisting of a repeating unit having a partial structure containing alicyclic hydrocarbon represented by any of the following formulae (pI) to (pV), and a repeating unit represented by the following formula (II-AB).

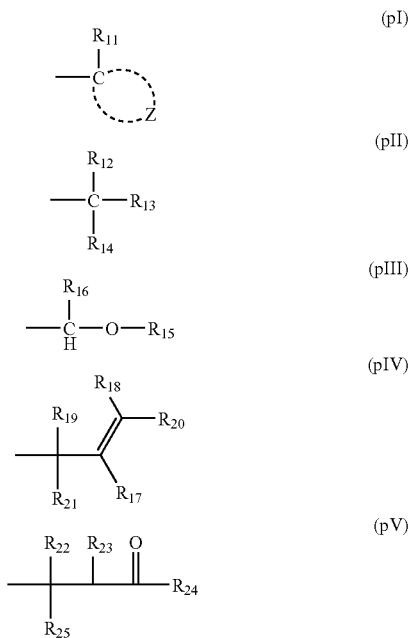

In formulae (pI) to (pV), $R_{11}$ represents a methyl group, an ethyl group, an n-propyl group, an isopropyl group, an n-butyl group, an isobutyl group, or a sec-butyl group; and Z represents an atomic group necessary to form a cycloalkyl group together with a carbon atom.

Each of $R_{12}$, $R_{13}$, $R_{14}$, $R_{15}$ and $R_{16}$ independently represents a straight chain or branched alkyl group having from 1 to 4 carbon atoms, or a cycloalkyl group, provided that at least one of $R_{12}$ to $R_{14}$, or either $R_{15}$ or $R_{16}$ represents a cycloalkyl group.

Each of $R_{17}$, $R_{18}$, $R_{19}$, $R_{20}$ and $R_{21}$ independently represents a hydrogen atom, a straight chain or branched alkyl group having from 1 to 4 carbon atoms, or a cycloalkyl group, provided that at least one of $R_{17}$ to $R_{21}$ represents a cycloalkyl group, and either $R_{19}$ or $R_{21}$ represents a straight chain or branched alkyl group having from 1 to 4 carbon atoms, or a cycloalkyl group.

Each of $R_{22}$, $R_{23}$, $R_{24}$ and $R_{25}$ independently represents a hydrogen atom, a straight chain or branched alkyl group having from 1 to 4 carbon atoms, or a cycloalkyl group, provided that at least one of $R_{22}$ to $R_{25}$ represents a cycloalkyl group, and $R_{23}$ and $R_{24}$ may be bonded to each other to form a ring.

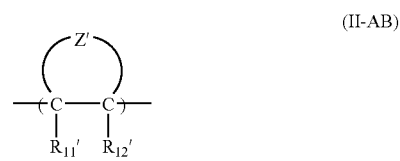

In formula (II-AB), each of $R_{11}'$ and $R_{12}'$ independently represents a hydrogen atom, a cyano group, a halogen atom, or an alkyl group.

Z' contains bonded two carbon atoms (C—C) and represents an atomic group to form an alicyclic structure.

The repeating unit represented by formula (II-AB) is preferably a repeating unit represented by the following formula (II-AB1) or (II-AB2).

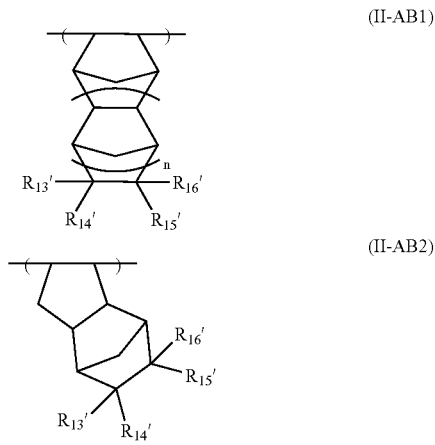

In formulae (II-AB1) and (II-AB2), each of $R_{13}'$, $R_{14}'$, $R_{15}'$ and $R_{16}'$ independently represents a hydrogen atom, a halogen atom, a cyano group, —COOH, —COOR$_5$, a group capable of decomposing by the action of an acid, —C(=O)—X-A'-$R_{17}'$, an alkyl group, or a cycloalkyl group, and at least two of $R_{13}'$ to $R_{16}'$ may be bonded to form a ring.

$R_5$ represents an alkyl group, a cycloalkyl group, or a group having a lactone structure.

X represents an oxygen atom, a sulfur atom, —NH—, —NHSO$_2$—, or —NHSO$_2$NH—.

A' represents a single bond or a divalent linking group.

$R_{17}'$ represents —COOH, —COOR$_5$, —CN, a hydroxyl group, an alkoxyl group, —CO—NH—R$_6$, —CO—NH—SO$_2$—R$_6$, or a group having a lactone structure.

$R_6$ represents an alkyl group or a cycloalkyl group.

n represents 0 or 1.

In formulae (pI) to (pV), the alkyl group represented by $R_{12}$ to $R_{25}$ is a straight chain or branched alkyl group having from 1 to 4 carbon atoms.

The cycloalkyl groups represented by $R_{11}$ to $R_{25}$ or the cycloalkyl groups formed by Z and carbon atoms may be monocyclic or polycyclic. Specifically, groups having a monocyclic, bicyclic, tricyclic or tetracyclic structure having 5 or more carbon atoms can be exemplified. The carbon atom number of these cycloalkyl groups is preferably from 6 to 30, and especially preferably from 7 to 25. These cycloalkyl groups may each have a substituent.

As preferred cycloalkyl groups, an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group can be exemplified. More preferred cycloalkyl groups are an adamantyl group, a norbornyl group, a cyclohexyl group, a cyclopentyl group, a tetracyclododecanyl group, and a tricyclodecanyl group.

As the further substituents of these alkyl groups and cycloalkyl groups, an alkyl group (having from 1 to 4 carbon atoms), a halogen atom, a hydroxyl group, an alkoxyl group (having from 1 to 4 carbon atoms), a carboxyl group, and an alkoxycarbonyl group (having from 2 to 6 carbon atoms) can be exemplified. As further substituents of these alkyl group, alkoxyl group and alkoxycarbonyl group, a hydroxyl group, a halogen atom and an alkoxyl group are exemplified.

The structures represented by formulae (pI) to (pV) in the above resins can be used for the protection of the alkali-soluble groups. As the alkali-soluble groups, various groups known in this technical field can be exemplified.

Specifically, such structures that the hydrogen atoms of a carboxylic acid group, a sulfonic acid group, a phenol group and a thiol group are substituted with the structures represented by formulae (pI) to (pV) are exemplified, and preferably the structures that the hydrogen atoms of a carboxylic acid group and a sulfonic acid group are substituted with the structures represented by formulae (pI) to (pV) are exemplified.

As the repeating unit having the alkali-soluble group protected with the structure represented by any of formulae (pI) to (pV), a repeating unit represented by the following formula (pA) is preferred.

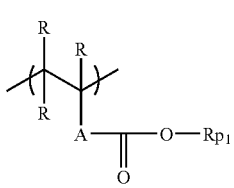

(pA)

In formula (pA), R represents a hydrogen atom, a halogen atom, or a straight chain or branched alkyl group having from 1 to 4 carbon atoms. A plurality of R's may be the same or different.

A represents a single group or a combination of two or more groups selected from the group consisting of a single bond, an alkylene group, an ether group, a thioether group, a carbonyl group, an ester group, an amido group, a sulfonamido group, a urethane group, and a ureylene group, and preferably a single bond.

$Rp_1$ represents a group represented by any of formulae (pI) to (pV).

The repeating unit represented by formula (pA) is most preferably a repeating unit by 2-alkyl-2-adamantyl (meth)acrylate, or dialkyl(1-adamantyl)methyl(meth)acrylate.

The specific examples of the repeating units represented by formula (pA) are shown below, but the invention is not restricted thereto.

In the formulae, Rx represents H, $CH_3$, or $CH_2OH$, and each of Rxa and Rxb represents an alkyl group having from 1 to 4 carbon atoms.

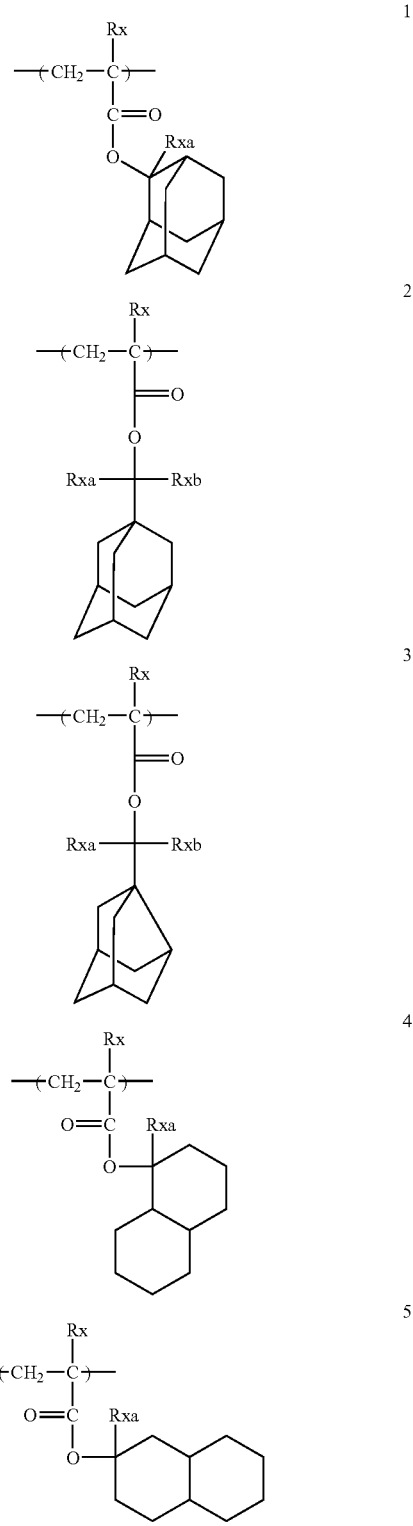

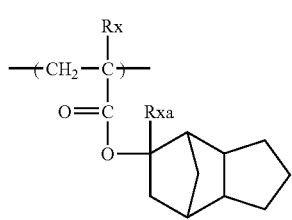
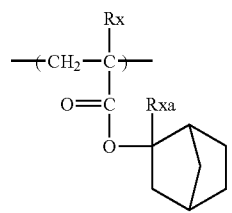
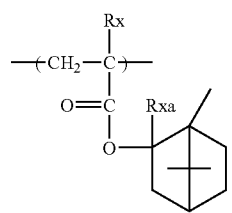
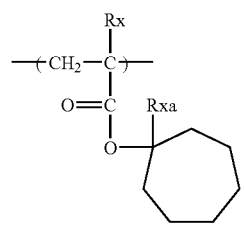
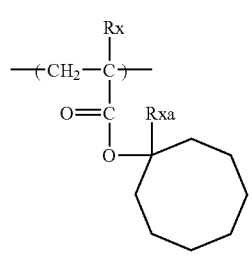
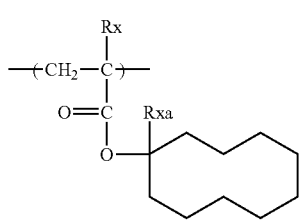
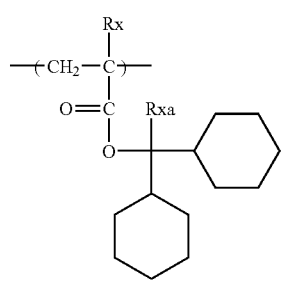
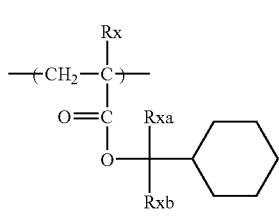
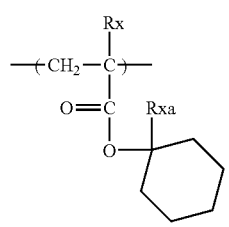
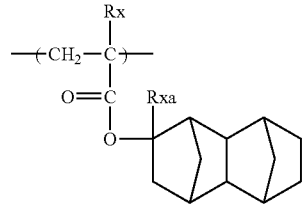
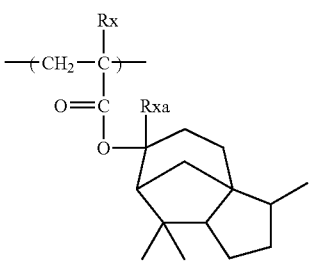
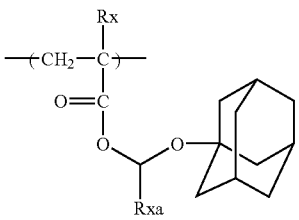
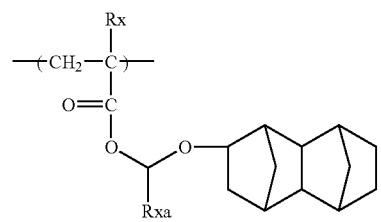
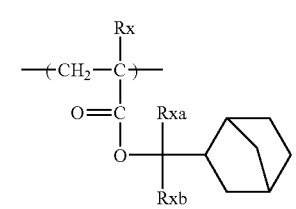

20 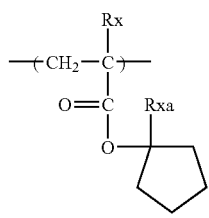

21 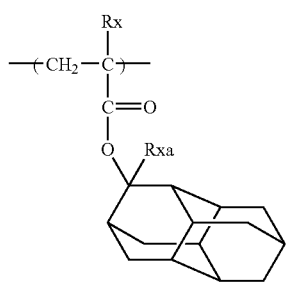

22 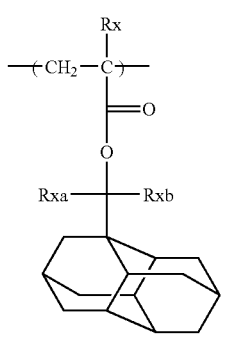

23 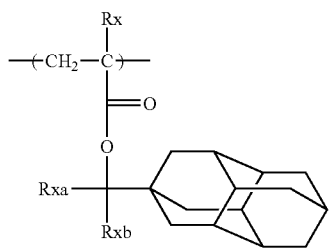

24 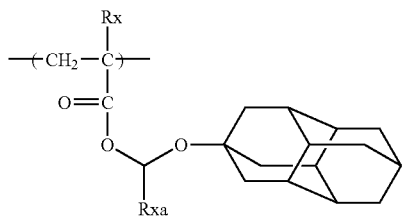

25 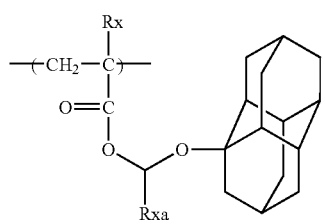

26 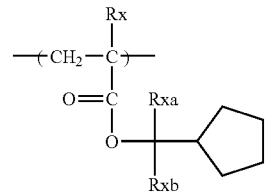

As the halogen atoms represented by $R_{11}'$ and $R_{12}'$ in formula (II-AB), a chlorine atom, a bromine atom, a fluorine atom and an iodine atom are exemplified.

As the alkyl groups represented by $R_{11}'$ and $R_{12}'$, straight chain or branched alkyl groups having from 1 to 10 carbon atoms are exemplified.

The atomic group for forming an alicyclic structure represented by Z' is an atomic group to form a repeating unit of alicyclic hydrocarbon that may have a substituent in the resin, and an atomic group to form a bridged alicyclic structure for forming a bridged alicyclic hydrocarbon repeating unit is especially preferred.

As the skeleton of the alicyclic hydrocarbon formed, the same alicyclic hydrocarbon groups as the alicyclic hydrocarbon groups represented by $R_{12}$ to $R_{25}$ in formulae (pI) to (pV) are exemplified.

The skeleton of the alicyclic hydrocarbon may have a substituent, and as the substituents, the groups represented by $R_{13}'$ to $R_{16}'$ in formula (II-AB1) or (II-AB2) can be exemplified.

In the alicyclic hydrocarbon series acid-decomposable resin in the invention, a group capable of decomposing by the action of an acid can be contained in at least one repeating unit of the repeating unit having a partial structure containing the alicyclic hydrocarbon represented by any of formulae (pI) to (pV), the repeating unit represented by formula (II-AB), and a repeating unit of the later-described copolymer component.

Various substituents of $R_{13}'$ to $R_{16}'$ in formula (II-AB1) or (II-AB2) can also be used as the substituents of the atomic group to form an alicyclic structure, or atomic group Z' to form a bridged alicyclic structure in formula (II-AB).

The specific examples of the repeating units represented by formula (II-AB1) or (II-AB2) are shown below, but the invention is not restricted to these specific examples.

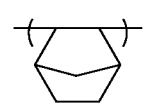  [II-1]

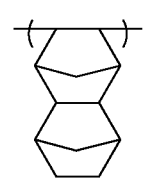  [II-2]

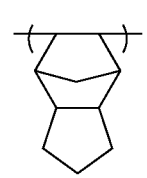  [II-3]

[II-4] 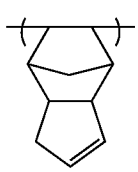
[II-5] 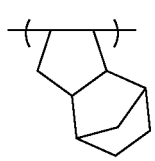
[II-6] 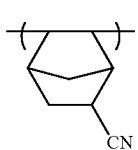
[II-7] 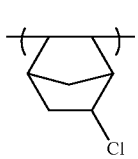
[II-8] 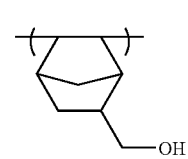
[II-9] 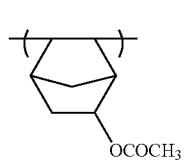
[II-10] 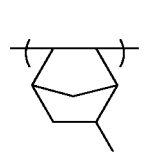
[II-11] 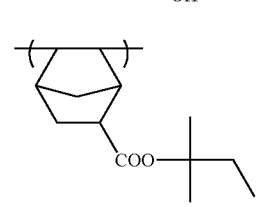
[II-12] 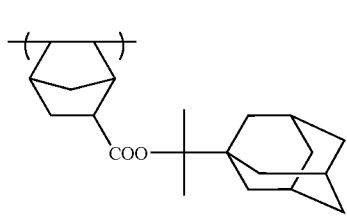
[II-13] 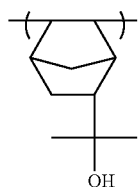
[II-14] 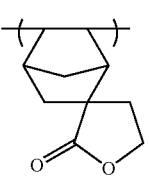
[II-15] 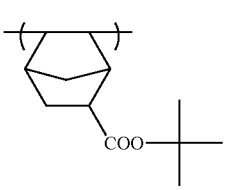
[II-16] 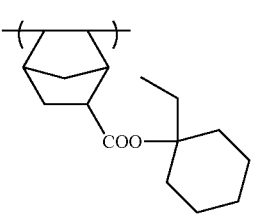
[II-17] 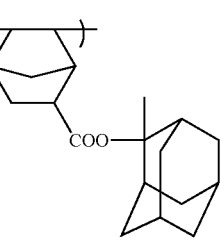
[II-18] 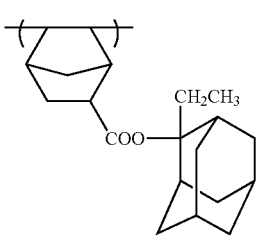
[II-19] 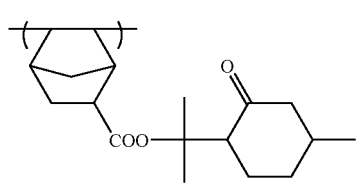
[II-20] 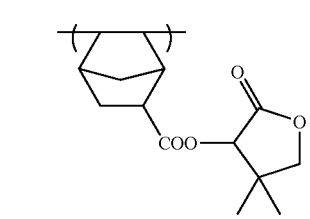

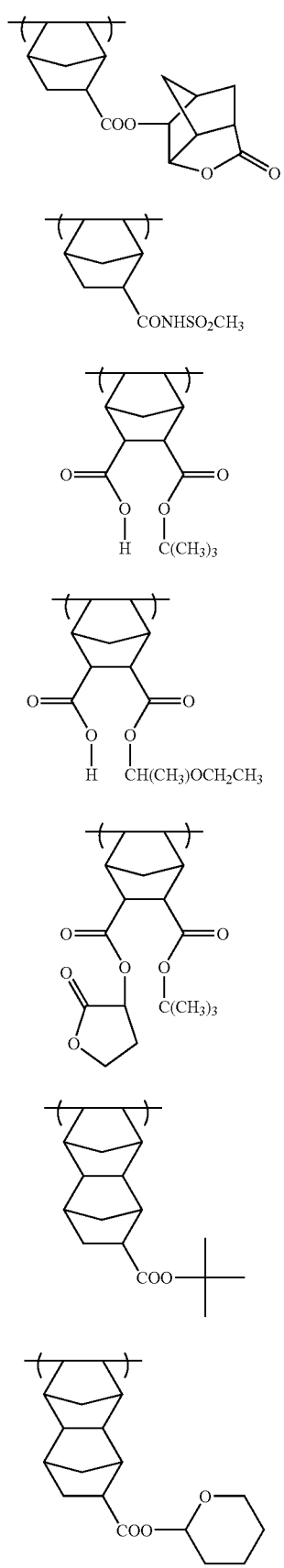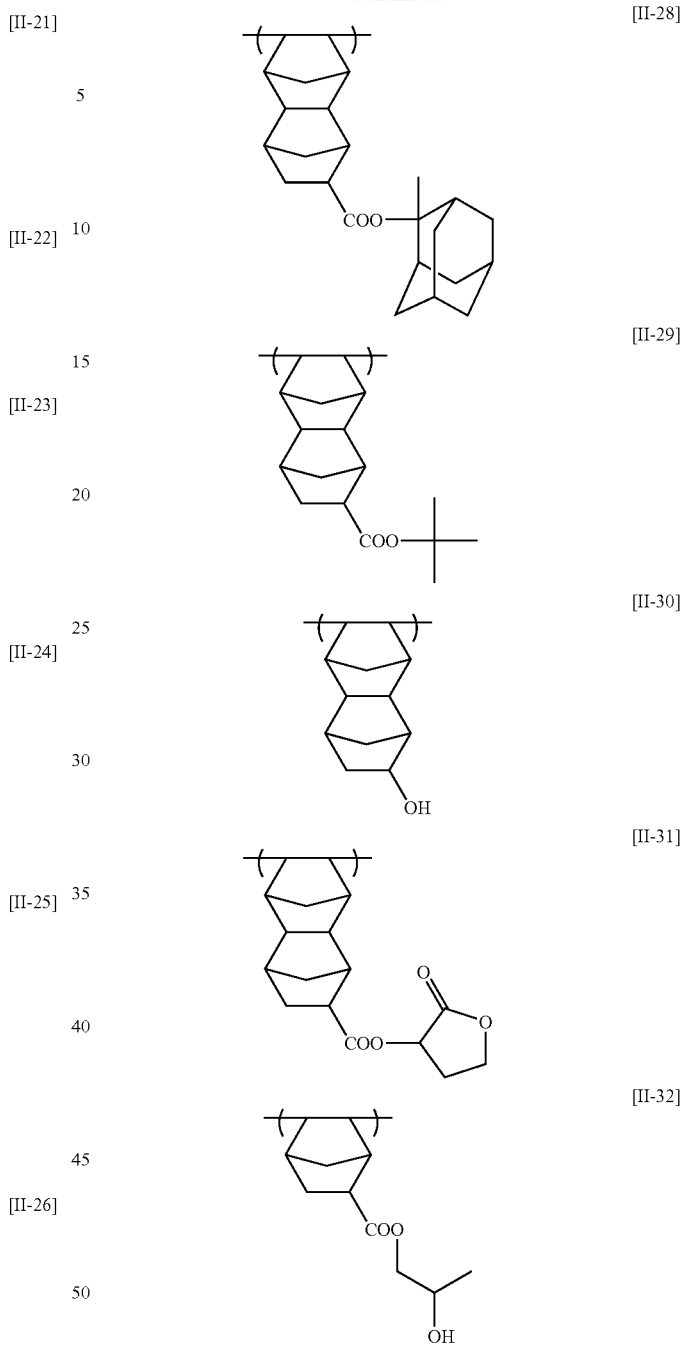

It is preferred for the alicyclic hydrocarbon series acid-decomposable resin in the invention to have a lactone group. As the lactone group, any group having a lactone structure can be used, but groups having a 5- to 7-membered ring lactone structure are preferred, and groups having a 5- to 7-membered ring lactone structure condensed with other ring structures in the form of forming a bicyclo structure or a spiro structure are preferred. It is more preferred to have a repeating unit having a group having a lactone structure represented by any of the following formulae (LC1-1) to (LC1-16). A group having a lactone structure may be directly bonded to the main chain of a repeating unit. Preferred lactone structures are groups represented by (LC1-1), (LC1-4), (LC1-5), (LC1-6), (LC1-13)

and (LC1-14). By the use of a specific lactone structure, line edge roughness and development defect are bettered.
LC1-1
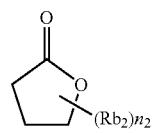
LC1-2
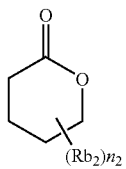
LC1-3
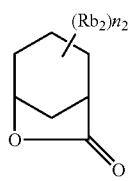
LC1-4
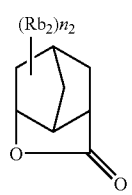
LC1-5
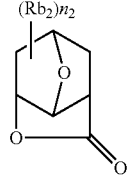
LC1-6
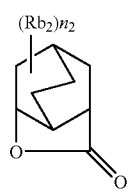
LC1-7
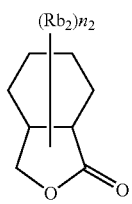
LC1-8
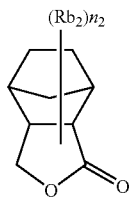
LC1-9
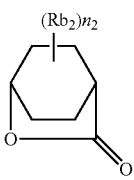
LC1-10
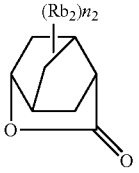
LC1-11
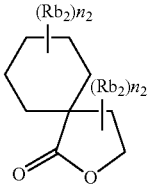
LC1-12
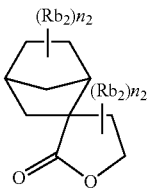
LC1-13
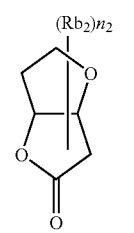
LC1-14
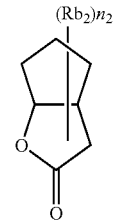
LC1-15
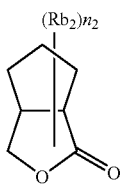

LC1-16

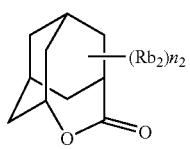

A lactone structure moiety may have or may not have a substituent (Rb$_2$). As preferred substituent (Rb$_2$), an alkyl group having from 1 to 8 carbon atoms, a cycloalkyl group having from 4 to 7 carbon atoms, an alkoxyl group having from 1 to 8 carbon atoms, an alkoxycarbonyl group having from 2 to 8 carbon atoms, a carboxyl group, a halogen atom, a hydroxyl group, a cyano group, and an acid-decomposable group are exemplified. n$_2$ represents an integer of from 0 to 4. When n$_2$ is 2 or more, a plurality of Rb$_2$'s may be the same or different, and a plurality of Rb$_2$'s may be bonded to each other to form a ring.

As the repeating units having a group having a lactone structure represented by any of formulae (LC1-1) to (LC1-16), a repeating unit represented by formula (II-AB1) or (II-AB2) in which at least one of R$_{13}$' to R$_{16}$' has a group represented by any of formulae (LC1-1) to (LC1 -16) (for example, R$_5$ of —COOR$_5$ represents a group represented by any of formulae (LC1-1) to (LC1-16)), or a repeating unit represented by the following formula (AI) can be exemplified.

(AI)

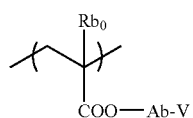

In formula (AI), Rb$_0$ represents a hydrogen atom, a halogen atom, or an alkyl group having from 1 to 4 carbon atoms.

As the preferred substituents that the alkyl group represented by Rb$_0$ may have, a hydroxyl group and a halogen atom are exemplified.

As the halogen atom represented by Rb$_0$, a fluorine atom, a chlorine atom, a bromine atom and an iodine atom can be exemplified.

Rb$_0$ preferably represents a hydrogen atom, a methyl group, a hydroxymethyl group or a trifluoromethyl group, and more preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent linking group combining these groups. Ab preferably represents a single bond or a linking group represented by -Ab$_1$-CO$_2$—. Ab$_1$ represents a straight chain or branched alkylene group, or a monocyclic or polycyclic cycloalkylene group, and preferably a methylene group, an ethylene group, a cyclohexylene group, an adamantylene group, or a norbornylene group.

V represents a group represented by any of formulae (LC1-1) to (LC1-16).

Repeating units having a lactone structure generally have optical isomers, and any optical isomer may be used. One kind of optical isomer may be used alone, or a plurality of optical isomers may be used as mixture. When one kind of optical isomer is mainly used, the optical purity (ee) of the optical isomer is preferably 90 or more, and more preferably 95 or more.

The specific examples of repeating units having a group having a lactone structure are shown below, but the invention is not restricted thereto.

(In the formulae, Rx represents H, CH$_3$, CH$_2$OH or CF$_3$.)

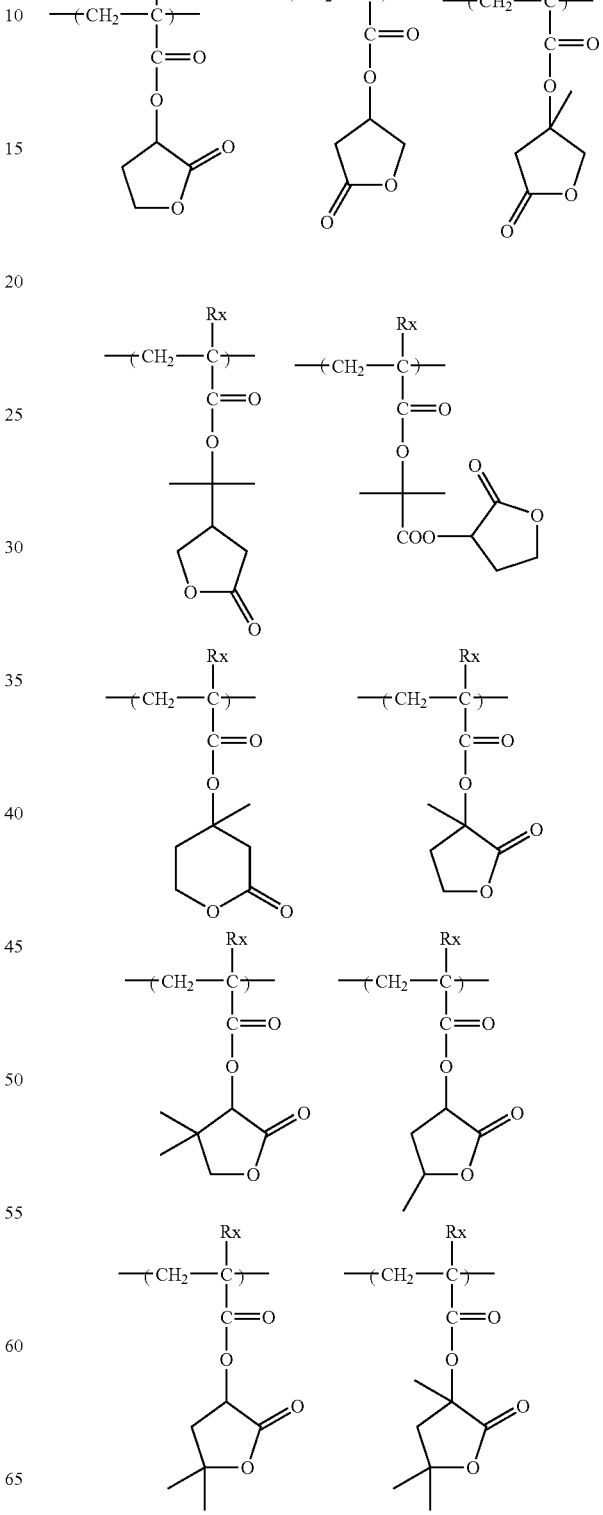

-continued
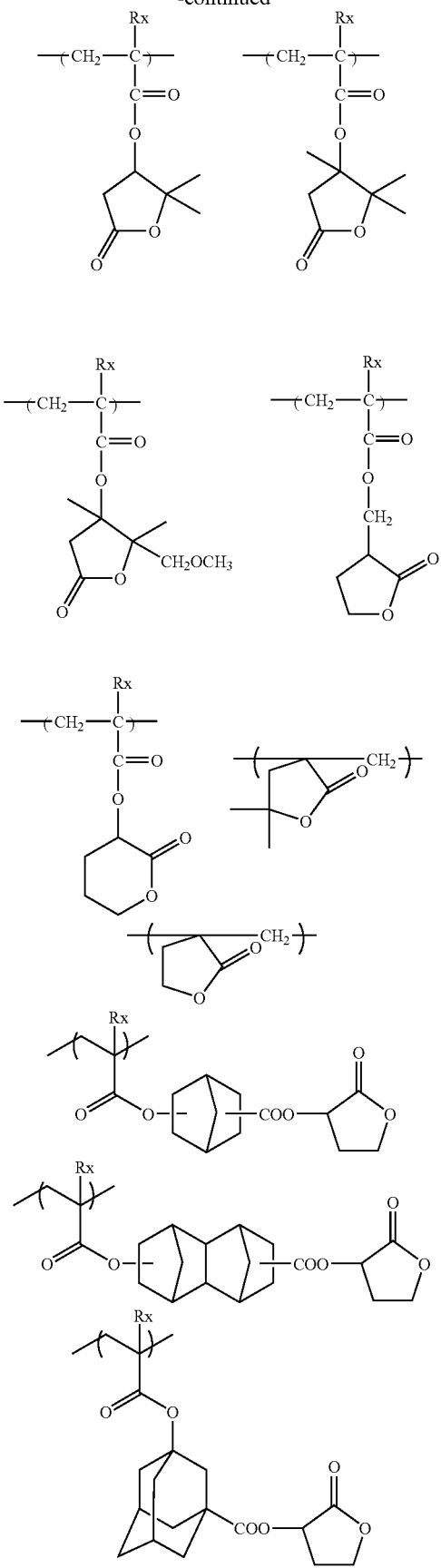
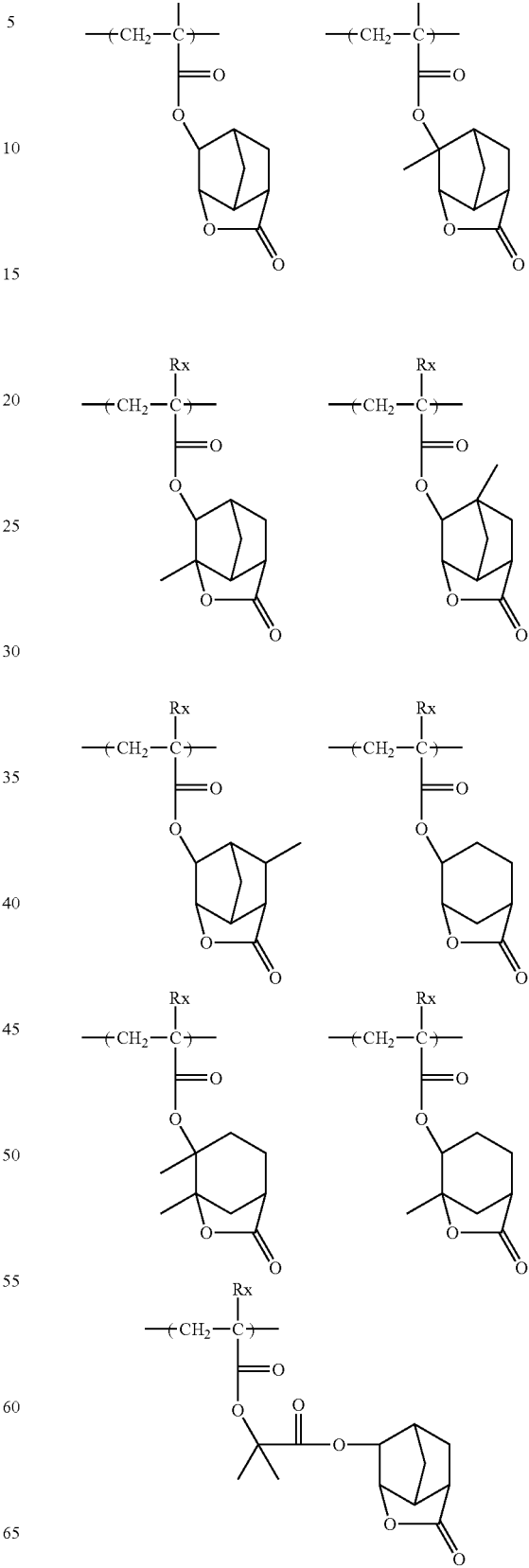
(In the formulae, Rx represents H, CH₃, CH₂OH or CF₃.)

65
-continued
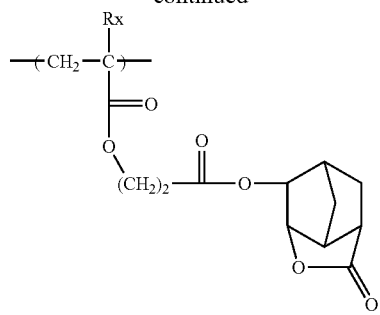
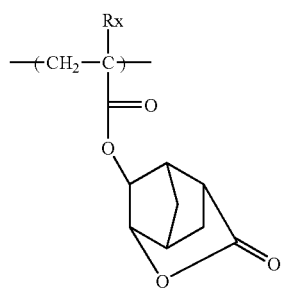 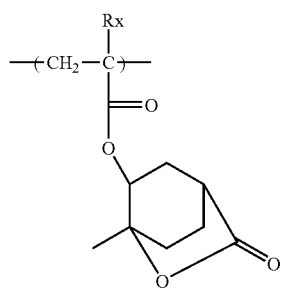
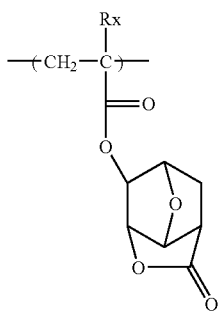 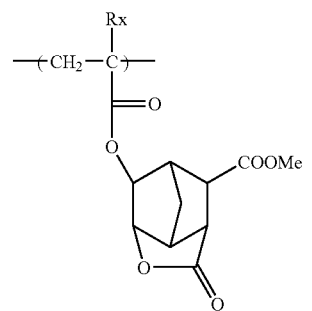
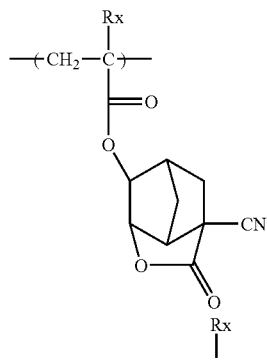
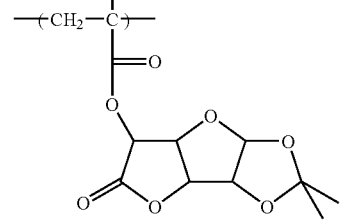
66
-continued
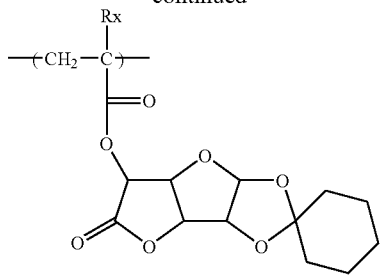
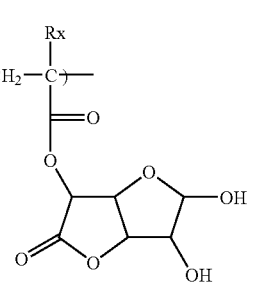 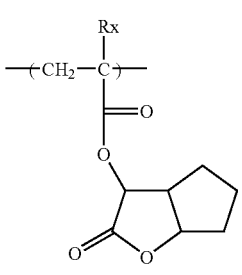
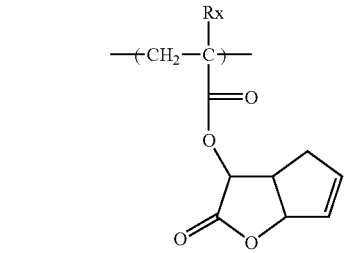
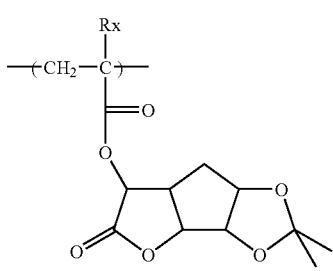
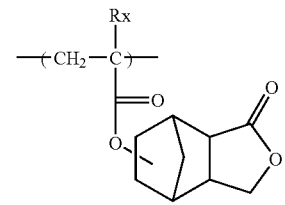
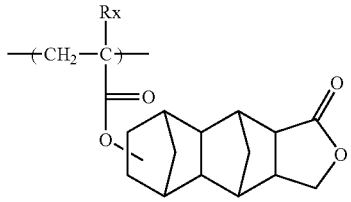

(In the formulae, Rx represents H, CH₃, CH₂OH or CF₃.)

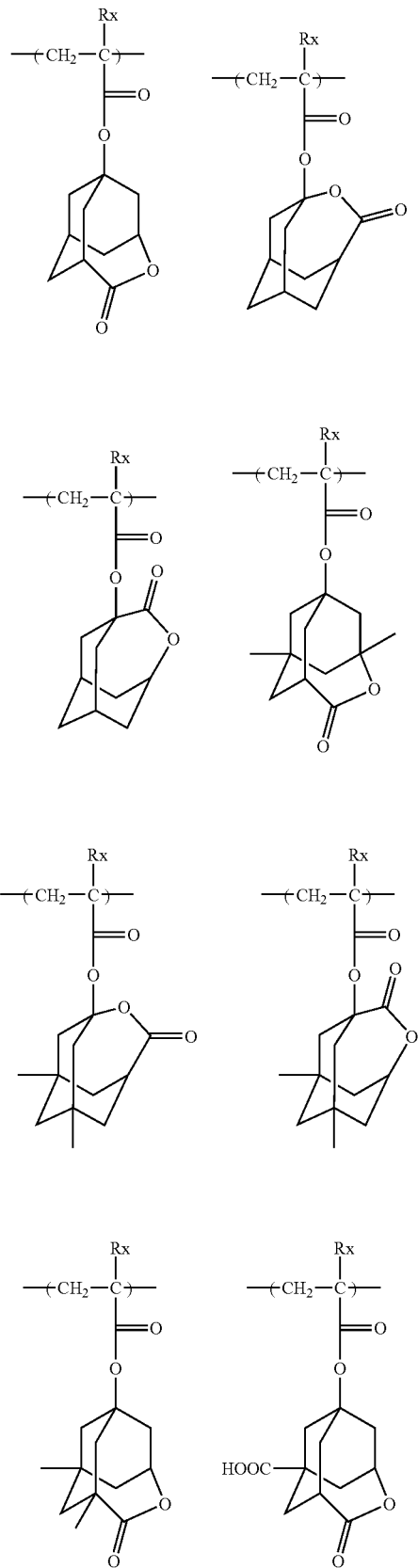

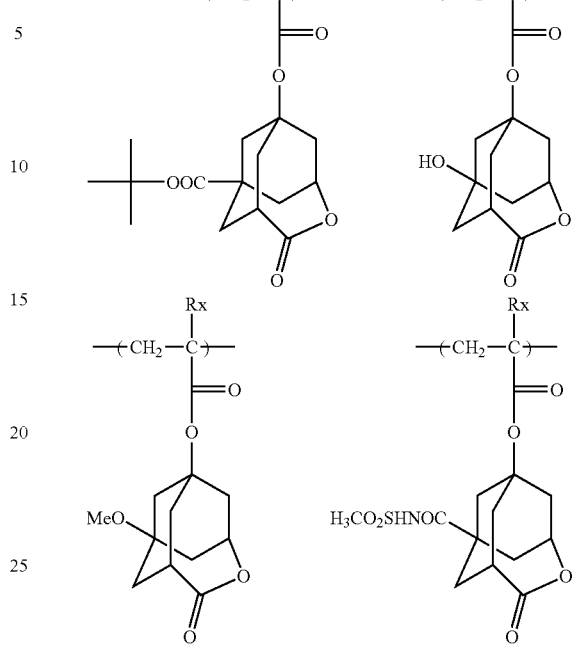

It is preferred for alicyclic hydrocarbon series acid-decomposable resin of the invention to have a repeating unit having an organic group having a polar group, in particular to have a repeating unit having an alicyclic hydrocarbon structure substituted with a polar group, by which adhesion with a substrate and affinity with a developing solution are improved. As the alicyclic hydrocarbon structure of the alicyclic hydrocarbon structure substituted with a polar group, an adamantyl group, a diamantyl group, and a norbornane group are preferred. As the polar groups, a hydroxyl group and a cyano group are preferred.

As the alicyclic hydrocarbon structure substituted with a polar group, a partial structure represented by any of the following formulae (VIIa) to (VIId) is preferred.

(VIIa)
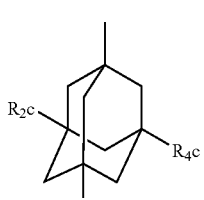

(VIIb)
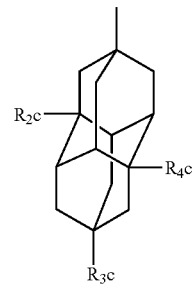

-continued (VIIc)
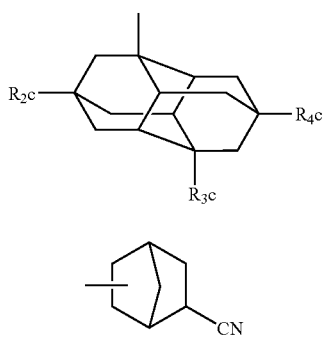

(VIId)
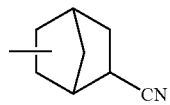

In formula (VIIa) to (VIIc), each of $R_{2c}$, $R_{3c}$ and $R_{4c}$ independently represents a hydrogen atom, a hydroxyl group, or a cyano group, provided that at least one of $R_{2c}$, $R_{3c}$ and $R_{4c}$ represents a hydroxyl group or a cyano group. Preferably one or two of $R_{2c}$, $R_{3c}$ and $R_{4c}$ represent a hydroxyl group and the remainder represent a hydrogen atom.

In formula (VIIa), it is more preferred that two of $R_{2c}$, $R_{3c}$ and $R_{4c}$ represent a hydroxyl group and the remainder represents a hydrogen atom.

As the repeating unit having a group represented by any of formulae (VIIa) to (VIId), a repeating unit represented by formula (II-AB1) or (II-AB2) in which at least one of $R_{13}'$ to $R_{16}'$ has a group represented by any of formulae (VIIa) to (VIId) (for example, $R_5$ of —$COOR_5$ represents a group represented by any of formulae (VIIa) to (VIId)), or a repeating unit represented by any of the following formulae (AIIa) to (AIId) can be exemplified.

-continued (AIIc)
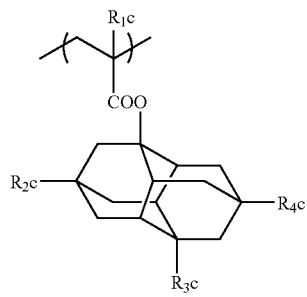

(AIId)
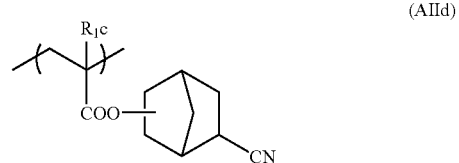

In formulae (AIIa) to (AIId), $R_{1c}$ represents a hydrogen atom, a methyl group, a trifluoromethyl group, or a hydroxymethyl group.

$R_{2c}$, $R_{3c}$ and $R_{4c}$ have the same meaning as $R_{2c}$ to $R_{4c}$ in formulae (VIIa) to (VIIc).

The specific examples of the repeating units having the structure represented by any of formulae (AIIa) to (AIId) are shown below, but the invention is not restricted thereto.

(AIIa)

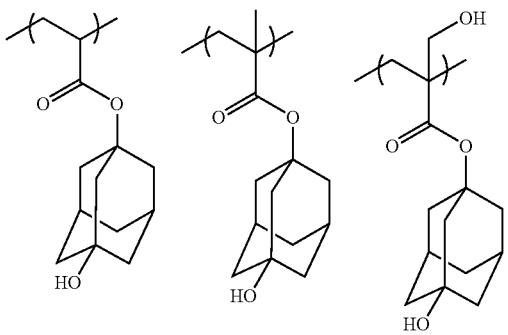

(AIIb)
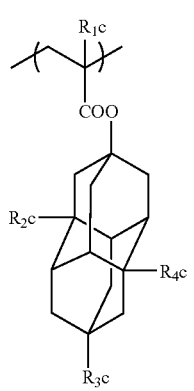

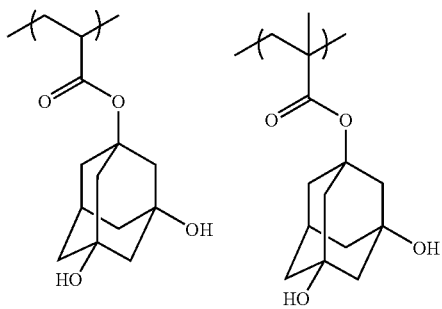

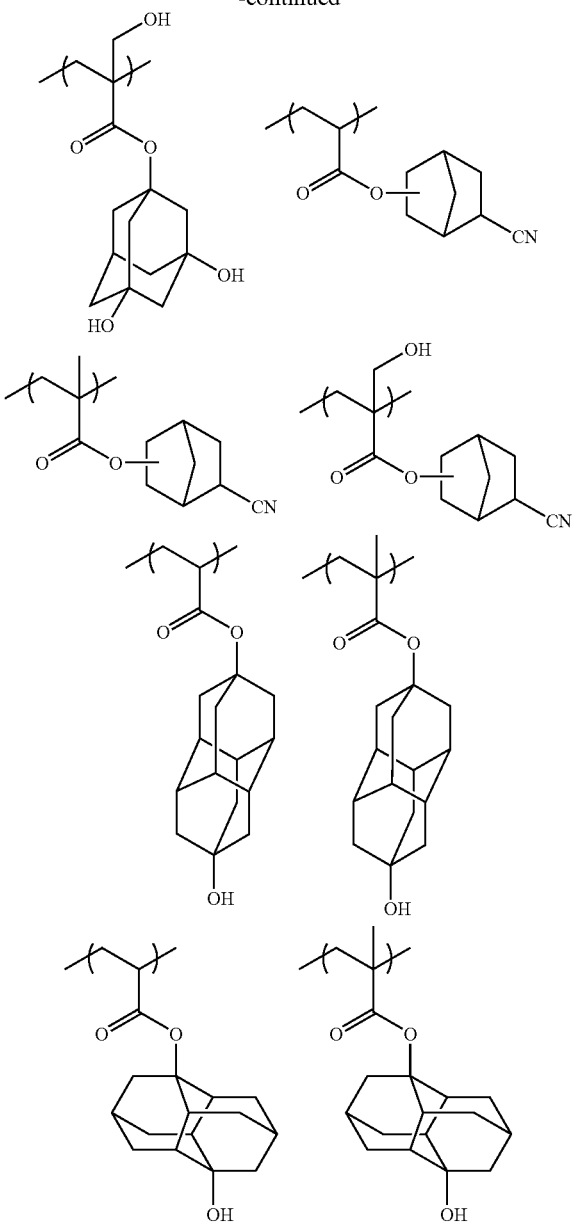

The alicyclic hydrocarbon series acid-decomposable resin in the invention may have a repeating unit represented by the following formula (VIII).

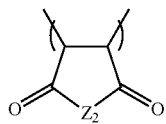
(VIII)

In formula (VIII), $Z_2$ represents —O— or —N(R$_{41}$)—. $R_{41}$ represents a hydrogen atom, a hydroxyl group, an alkyl group, or —OSO$_2$—R$_{42}$. $R_{42}$ represents an alkyl group, a cycloalkyl group, or a camphor residue. The alkyl group represented by $R_{41}$ and $R_{42}$ may be substituted with a halogen atom (preferably a fluorine atom) and the like.

As the specific examples of the repeating units represented by formula (VIII), the following compounds are exemplified, but the invention is not restricted thereto.

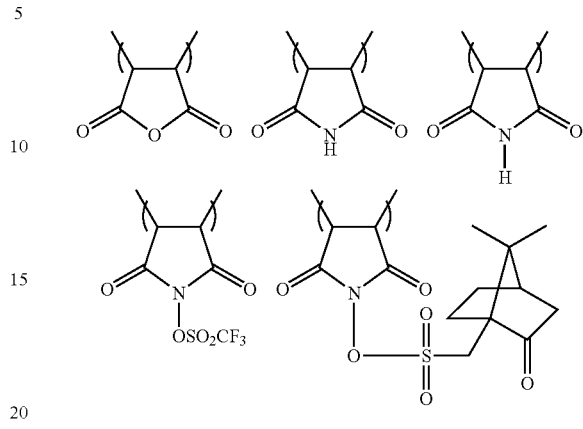

It is preferred for the alicyclic hydrocarbon series acid-decomposable resin in the invention to have a repeating unit having an alkali-soluble group, and it is more preferred to have a repeating unit having a carboxyl group, by which the resolution in the use for contact hole is enhanced. As the repeating units having a carboxyl group, a repeating unit having a carboxyl group directly bonded to the main chain of a resin such as a repeating unit by acrylic acid or methacrylic acid, a repeating unit having a carboxyl group bonded to the main chain of a resin via a linking group, and a repeating unit having a carboxyl group introduced to the terminals of a polymer chain by polymerization with a polymerization initiator and a chain transfer agent having an alkali-soluble group are exemplified, and any of these repeating units is preferably used. The linking group may have a monocyclic or polycyclic hydrocarbon structure. The repeating unit by acrylic acid or methacrylic acid is especially preferred.

The alicyclic hydrocarbon series acid-decomposable resin in the invention may further have a repeating unit having one to three groups represented by the following formula (F1), by which line edge roughness property is improved.

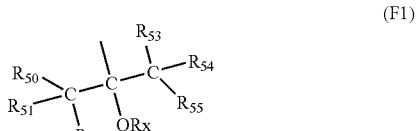
(F1)

In formula (F1), each of $R_{50}$, $R_{51}$, $R_{52}$, $R_{53}$, $R_{54}$ and $R_{55}$ independently represents a hydrogen atom, a fluorine atom, or an alkyl group, provided that at least one of $R_{50}$ to $R_{55}$ represents a fluorine atom, or an alkyl group having at least one hydrogen atom substituted with a fluorine atom.

Rx represents a hydrogen atom or an organic group (preferably an acid-decomposable protective group, an alkyl group, a cycloalkyl group, an acyl group, or an alkoxycarbonyl group).

The alkyl group represented by $R_{50}$ to $R_{55}$ may be substituted with a halogen atom, e.g., a fluorine atom, or a cyano group, and preferably an alkyl group having from 1 to 3 carbon atoms, e.g., a methyl group and a trifluoromethyl group can be exemplified.

It is preferred that all of $R_{50}$ to $R_{55}$ represent a fluorine atom.

As the organic group represented by Rx, an acid-decomposable protective group, and an alkyl group, a cycloalkyl group, an acyl group, an alkylcarbonyl group, an alkoxycarbonyl group, an alkoxycarbonylmethyl group, an alkoxymethyl group, and a 1-alkoxyethyl group, each of which may have a substituent, are preferred.

The repeating unit having the group represented by formula (F1) is preferably a repeating unit represented by the following formula (F2).

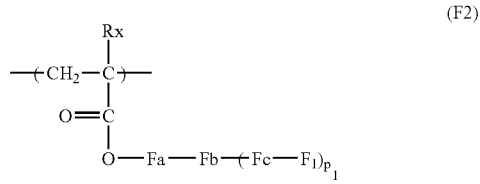

(F2)

In formula (F2), Rx represents a hydrogen atom, a halogen atom, or an alkyl group having from 1 to 4 carbon atoms. As preferred substituents that the alkyl group represented by Rx may have, a hydroxyl group and a halogen atom are exemplified.

Fa represents a single bond or a straight chain or branched alkylene group, and preferably a single bond.

Fb represents a monocyclic or polycyclic hydrocarbon group.

Fc represents a single bond or a straight chain or branched alkylene group, and preferably a single bond or a methylene group.

$F_1$ represents a group represented by formula (F1).

$P_1$ is from 1 to 3.

As the cyclic hydrocarbon group represented by Fb, a cyclopentyl group, a cyclohexyl group, or a norbornyl group is preferred.

The specific examples of the repeating units having the group represented by formula (F1) are shown below, but the invention is not restricted thereto.

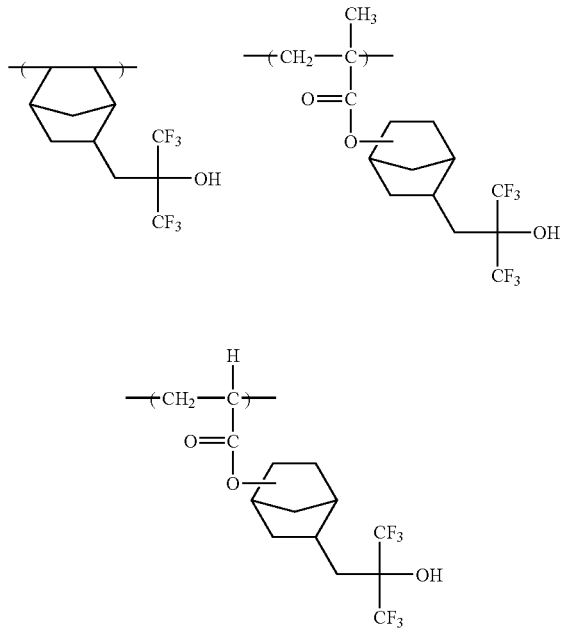

The alicyclic hydrocarbon series acid-decomposable resin in the invention may further contain a repeating unit having an alicyclic hydrocarbon structure and not showing acid decomposability, by containing such a repeating unit, the elution of low molecular weight components from the resist film into the immersion liquid can be reduced at the time of immersion exposure. As such repeating units, e.g., 1-adamantyl(meth)acrylate, tricyclodecanyl(meth)acrylate, and cyclohexyl (meth)acrylate are exemplified.

Examples of the repeating units having alicyclic hydrocarbon structures and not showing acid decomposability include repeating units containing neither a hydroxy group nor a cyano group, and are preferably repeating units represented by the following formula (IX).

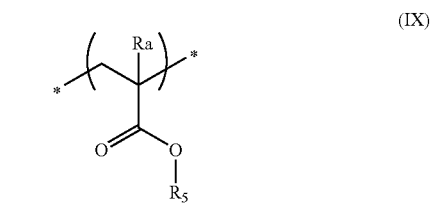

(IX)

In the formula (IX), $R_5$ represents a hydrocarbon group having at least one cyclic structure and containing neither a hydroxyl group nor a cyano group.

Ra represents a hydrogen atom, an alkyl group or —$CH_2$—O—$Ra_2$. Herein, $Ra_2$ represents a hydrogen atom, an alkyl group or an acyl group. Ra is preferably a hydrogen atom, a methyl group, a hydroxymethyl group or a trifluoromethyl group, and more preferably a hydrogen atom or a methyl group.

The cyclic structure contained in $R_5$ may be a monocyclic hydrocarbon group or a polycyclic hydrocarbon group. Examples of the monocyclic hydrocarbon group include 3-12C cycloalkyl groups such as a cyclopentyl group, a cyclohexyl group, a cycloheptyl group and a cyclooctyl group, and 3-12C cycloalkenyl groups such as a cyclohexenyl group. Of these monocyclic hydrocarbon groups, 3-7C monocyclic hydrocarbon groups, especially a cyclopentyl group and a cyclohexyl group, are preferred over the others.

The polycyclic hydrocarbon group may be an assembled-ring hydrocarbon group or a bridged-ring hydrocarbon group. Examples of the assembled-ring hydrocarbon group include a bicyclohexyl group and a perhydronaphthalenyl group. Examples of the bridged hydrocarbon ring include bicyclic hydrocarbon rings such as a pinane ring, a bornane ring, a norpinane ring, a norbornane ring and bicyclooctane rings (e.g., a bicyclo[2.2.2]octane ring, a bicyclo[3.2.1]octane ring), tricyclic hydrocarbon rings such as a homobredane ring, an adamantane ring, a tricyclo[5.2.1.0$^{2,6}$]decane ring and a tricyclo[4.3.1.1$^{2,5}$]undecane ring, and tetracyclic hydrocarbon rings such as a tetracyclo[4.4.0.1$^{2,5}$.1$^{7,10}$]dodecane ring and a perhydro-1,4-methano-5,8-methanonaphthalene ring. And additional examples of the bridged hydrocarbon ring include condensed hydrocarbon rings formed by fusing together two or more of 5- to 8-membered cycloalkane rings such as perhydronaphthalene(decaline), perhydroanthracene, perhydrophenanthrene, perhydroacenaphthene, perhydrofluorene, perhydroindene and perhydrophenalene rings.

Examples of a bridged-ring hydrocarbon group suitable as the cyclic structure of $R_5$ include a norbornyl group, an adamantyl group, a bicyclooctanyl group and a tricyclo[5.2.1.0$^{2,6}$]decanyl group. Of these groups, a norbornyl group and an adamantyl group are preferred over the others.

Each of the alicyclic hydrocarbon groups recited above may have a substituent. Examples of a substituent suitable for those groups each include a halogen atom, an alkyl group, a hydroxyl group protected by a protective group, and an amino group protected by a protective group. Suitable examples of the halogen atom include bromine, chlorine and fluorine atoms. Suitable examples of the alkyl group include methyl, ethyl, butyl and t-butyl groups. These alkyl groups each may further have a substituent. Examples of the substituent include a halogen atom, an alkyl group, a hydroxyl group protected by a protective group and an amino group protected by a protective group.

Examples of such protective groups include an alkyl group, a cycloalkyl group, an aralkyl group, a substituted methyl group, a substituted ethyl group, an acyl group, an alkoxycarbonyl group and an aralkyloxycarbonyl group. Suitable examples of the alkyl group include 1-4C alkyl groups, those of the substituted methyl group include methoxymethyl, methoxythiomethyl, benzyloxymethyl, t-butoxymethyl and 2-methoxyethoxymethyl groups, those of the substituted ethyl group include 1-ethoxyethyl and 1-methyl-1-methoxyethyl groups, those of the acyl group include 1-6C aliphatic acyl groups such as formyl, acetyl, propionyl, butyryl, isobutyryl, valeryl and pivaloyl groups, and those of the alkoxycarbonyl group include 1-4C alkoxycarbonyl groups.

The proportion of repeating units represented by the formula (IX), which have neither a hydroxyl group nor a cyano group is preferably from 0 to 40 mole %, far preferably from 0 to 20 mole %, with respect to the total repeating units of the alicyclic hydrocarbon-containing acid-decomposable resin.

Examples of a repeating unit represented by the formula (IX) are illustrated below, but these examples should not be construed as limiting the scope of the invention.

In the following structural formulae, Ra represents H, CH$_3$, CH$_2$OH or CF$_3$.

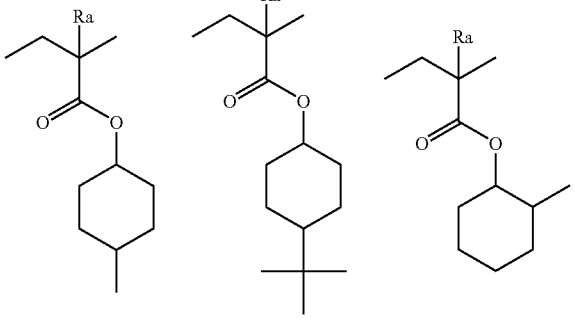

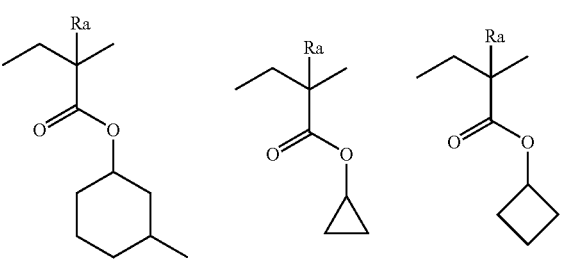

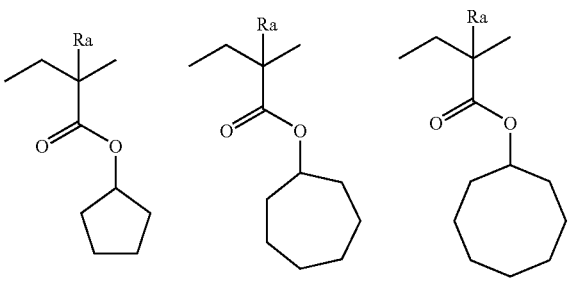

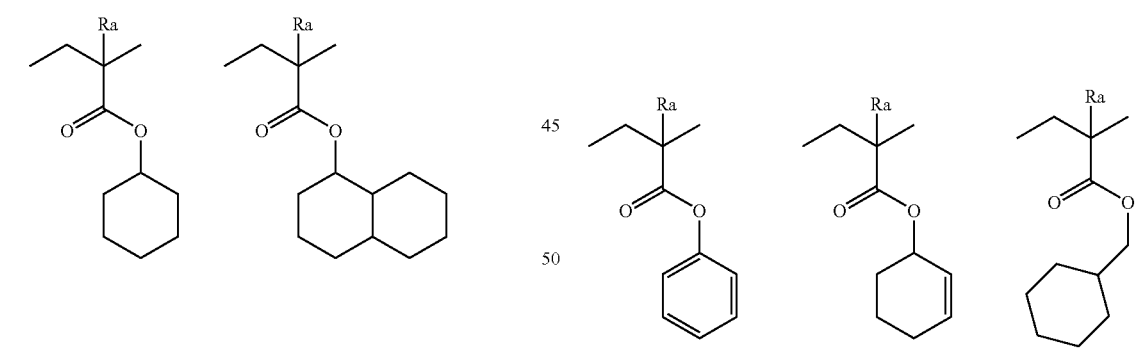

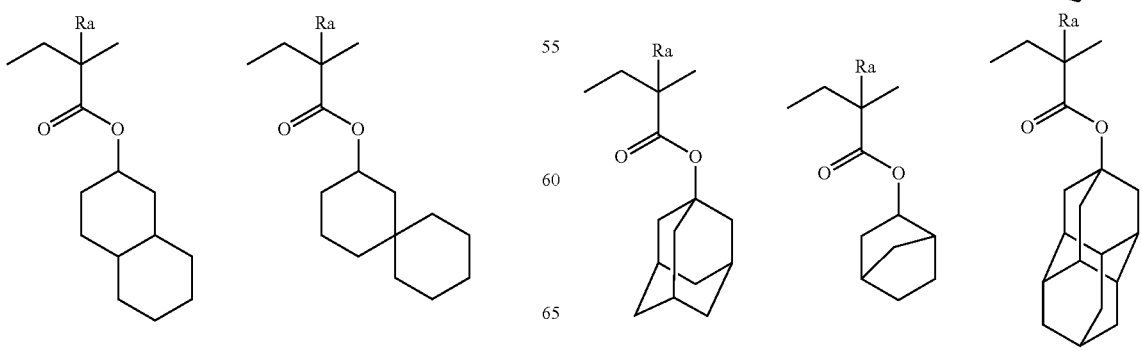

-continued

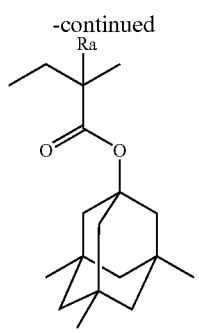

The alicyclic hydrocarbon series acid-decomposable resin in the invention can contain various kinds of repeating structural units, besides the above repeating structural units, for the purpose of the adjustments of dry etching resistance, suitability for standard developing solutions, adhesion to a substrate, resist profile, and further, general requisite characteristics of resists, e.g., resolution, heat resistance and sensitivity.

As these repeating structural units, the repeating structural units corresponding to the monomers shown below can be exemplified, but the invention is not restricted thereto.

By containing such repeating structural units, fine adjustment of performances required of the resin of the alicyclic hydrocarbon series acid-decomposable resin, in particular the following performances, becomes possible, that is,
(1) Solubility in a coating solvent,
(2) A film-forming property (a glass transition temperature),
(3) An alkali developing property,
(4) Decrease of layer thickness (hydrophobic-hydrophilic property, selection of an alkali-soluble group),
(5) Adhesion of an unexposed part to a substrate, and
(6) Dry etching resistance.

The examples of such monomers include compounds having one addition polymerizable unsaturated bond selected from acrylates, methacrylates, acrylamides, methacrylamides, allyl compounds, vinyl ethers, vinyl esters, etc.

In addition to the aforementioned compounds, addition polymerizable unsaturated compounds copolymerizable with the monomers corresponding to the above various repeating structural units may be used for copolymerization.

In the alicyclic hydrocarbon series acid-decomposable resin, the molar ratio of the content of each repeating structural unit is arbitrarily set to adjust dry etching resistance and suitability for standard developing solutions of a resist, adhesion to a substrate, and resist profile, further, general requisite characteristics of a resist, e.g., resolution, heat resistance and sensitivity.

As preferred embodiments of the alicyclic hydrocarbon series acid-decomposable resin in the invention, the following resins are exemplified.
(1) A resin containing the repeating unit having the partial structure containing the alicyclic hydrocarbon represented by any of formulae (pI) to (pV) (a side chain type), preferably a resin containing a (meth)acrylate repeating unit having the structure of any of formulae (pI) to (pV);
(2) A resin containing the repeating unit represented by formula (II-AB) (a main chain type); and the following is further exemplified as embodiment (2):
(3) A resin containing the repeating unit represented by formula (II-AB), a maleic anhydride derivative and a (meth)acrylate structure (a hybrid type).

In the alicyclic hydrocarbon series acid-decomposable resin, the content of the repeating unit having an acid-decomposable group is preferably from 10 to 60 mol % in all the repeating structural units, more preferably from 20 to 50 mol %, and still more preferably from 25 to 40 mol %.

In the acid-decomposable resin, the content of the repeating unit having an acid-decomposable group is preferably from 10 to 60 mol % in all the repeating structural units, more preferably from 20 to 50 mol %, and still more preferably from 25 to 40 mol %.

In the alicyclic hydrocarbon series acid-decomposable resin, the content of the repeating unit having the partial structure containing the alicyclic hydrocarbon represented by any of formulae (pI) to (pV) is preferably from 20 to 70 mol % in all the repeating structural units, more preferably from 20 to 50 mol %, and still more preferably from 25 to 40 mol %.

In the alicyclic hydrocarbon series acid-decomposable resin, the content of the repeating unit represented by formula (II-AB) is preferably from 10 to 60 mol % in all the repeating structural units, more preferably from 15 to 55 mol %, and still more preferably from 20 to 50 mol %.

In the acid-decomposable resin, the content of the repeating unit having a lactone ring is preferably from 10 to 70 mol % in all the repeating structural units, more preferably from 20 to 60 mol %, and still more preferably from 25 to 40 mol %.

In the acid-decomposable resin, the content of the repeating unit having an organic group having a polar group is preferably from 1 to 40 mol % in all the repeating structural units, more preferably from 5 to 30 mol %, and still more preferably from 5 to 20 mol %.

The content of the repeating structural units on the basis of the monomers of further copolymerization components in the resin can also be optionally set according to desired resist performances, and the content is generally preferably 99 mol % or less based on the total mol number of the repeating structural unit having the partial structure containing the alicyclic hydrocarbon represented by any of formulae (pI) to (pV) and the repeating unit represented by formula (II-AB), more preferably 90 mol % or less, and still more preferably 80 mol % or less.

When the positive resist composition in the invention is for ArF exposure, it is preferred that the resin does not have an aromatic group from the aspect of transparency to ArF rays.

The alicyclic hydrocarbon series acid-decomposable resin for use in the invention is preferably such that all the repeating units consist of (meth)acrylate repeating units. In this case, every of the following cases can be used, that is, a case where all the repeating units consist of methacrylate repeating units, a case where all the repeating units consist of acrylate repeating units, and a case where all the repeating units consist of mixture of methacrylate repeating units and acrylate repeating units, but it is preferred that acrylate repeating units account for 50 mol % or less of all the repeating units.

The alicyclic hydrocarbon series acid-decomposable resin is preferably a copolymer containing at least three kinds of repeating units of a (meth)acrylate repeating unit having a lactone ring, a (meth)acrylate repeating unit having an organic group substituted with at least either a hydroxyl group or a cyano group, and a (meth)acrylate repeating unit having an acid-decomposable group.

The alicyclic hydrocarbon series acid-decomposable resin is preferably a ternary copolymer comprising from 20 to 50 mol % of a repeating unit having the partial structure containing the alicyclic hydrocarbon represented by any of formulae (pI) to (pV), from 20 to 50 mol % of a repeating unit having a lactone structure, and from 5 to 30 mol % of a repeating unit having an alicyclic hydrocarbon structure substituted with a polar group, or a quaternary copolymer further containing from 0 to 20 mol % of other repeating units.

An especially preferred resin is a ternary copolymer containing from 20 to 50 mol % of a repeating unit having an acid-decomposable group represented by any of the following formulae (ARA-1) to (ARA-5), from 20 to 50 mol % of a repeating unit having a lactone group represented by any of the following formulae (ARL-1) to (ARL-6), and from 5 to 30 mol % of a repeating unit having an alicyclic hydrocarbon structure substituted with a polar group represented by any of the following formulae (ARH-1) to (ARH-3), or a quaternary copolymer further containing from 5 to 20 mol % of a repeating unit having a carboxyl group or a structure represented by formula (F1), or a repeating unit having an alicyclic hydrocarbon structure and not showing acid decomposability.

(In the following formulae, $Rxy_1$ represents a hydrogen atom or a methyl group, and $Rxa_1$ and $Rxb_1$ each represents a methyl group or an ethyl group.)

ARA-1
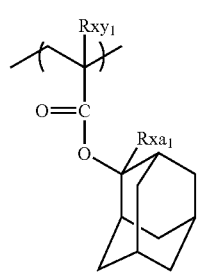

ARA-2
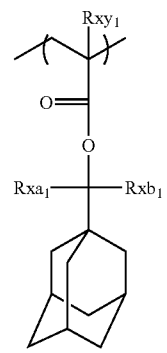

ARA-3
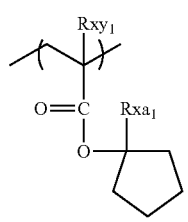

ARA-4
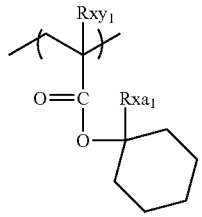

-continued

ARA-5
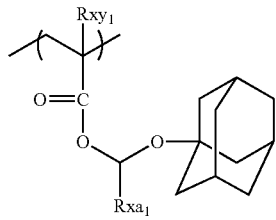

ARL-1
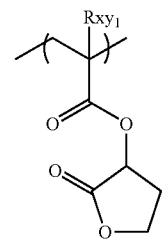

ARL-2
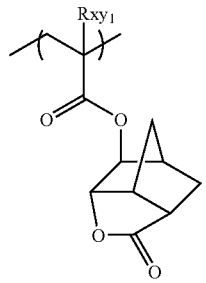

ARL-3
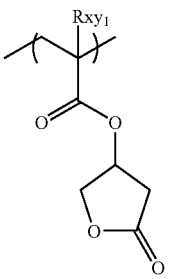

ARL-4
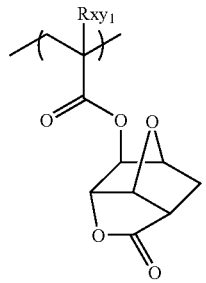

ARL-5
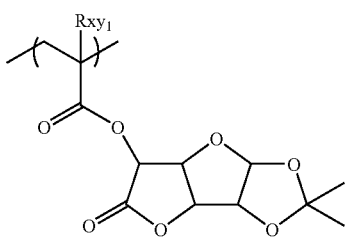

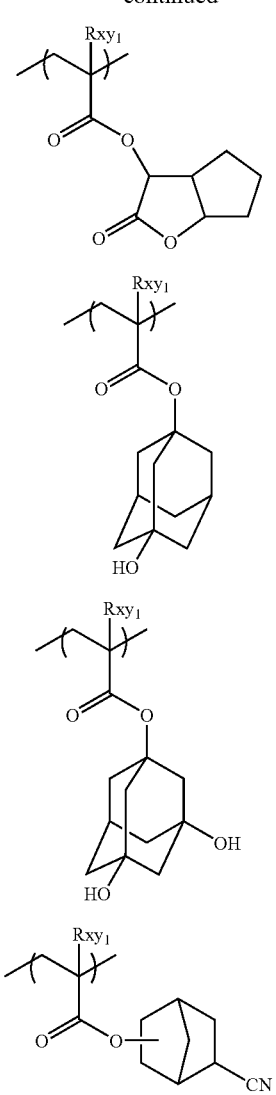

ARL-6
ARH-1
ARH-2
ARH-3

The alicyclic hydrocarbon series acid-decomposable resin for use in the invention can be synthesized according to ordinary methods (for example, radical polymerization). As ordinary synthesizing methods, for example, a batch polymerization method of dissolving a monomer seed and an initiator in a solvent and heating the solution to perform polymerization, and a dropping polymerization method of adding a solution of a monomer seed and an initiator to a heated solvent over 1 to 10 hours by dropping are exemplified, and the dropping polymerization method is preferred. As reaction solvents, ethers, e.g., tetrahydrofuran, 1,4-dioxane, diisopropyl ether, etc., ketones, e.g., methyl ethyl ketone, methyl isobutyl ketone, etc., ester solvents, e.g., ethyl acetate, amide solvents, e.g., dimethylformamide and dimethyacetamide, and the later-described solvents capable of dissolving the composition of the invention, e.g., propyelne glycol monomethyl ether acetate, propylene glycol monomethyl ether, and cyclohexanone are exemplified. It is more preferred to use the same solvent as the solvent used in the positive resist composition of the invention in the polymerization, by which the generation of particles during preservation can be restrained.

It is preferred to perform the polymerization reaction in an atmosphere of inert gas such as nitrogen or argon. Polymerization is initiated with commercially available radical initiators (e.g., azo initiators, peroxide, etc.). As radical initiators, azo initiators are preferred, and azo initiators having an ester group, a cyano group, or a carboxyl group are preferred. As preferred initiators, azobisisobutyronitrile, azobisdimethylvaleronitrile, dimethyl-2,2'-azobis(2-methylpropionate), etc., are exemplified. Initiators are added additionally or dividedly, if desired, and after termination of the reaction, the reaction product is put into a solvent and an objective resin is recovered as powder or in a solid state. The reaction concentration is from 5 to 50 mass %, and preferably from 10 to 30 mass %. The reaction temperature is generally from 10 to 150° C., preferably from 30 to 120° C., and more preferably from 60 to 100° C.

In purification, the same method as in the purification of the above resin (HR) can be used. Ordinary methods can be applied to the purification, e.g., a method of liquid-liquid extraction of removing residual monomer and oligomer components by washing with water and combining appropriate solvents, a method of purification in a state of solution, such as ultrafiltration of removing only monomers having a molecular weight lower than a specific molecular weight by extraction, a re-precipitation method of removing residual monomers by dropping a resin solution to a poor solvent to thereby solidify the resin in the poor solvent, and a method of purification in a solid state by washing filtered resin slurry with a poor solvent can be used.

The weight average molecular weight of the acid-decomposable resin in the invention is preferably from 1,000 to 200,000 as the polystyrene equivalent by the GPC method, more preferably from 3,000 to 20,000, and most preferably from 5,000 to 15,000. By making the weight average molecular weight from 1,000 to 200,000, deteriorations of heat resistance and dry etching resistance can be prevented, and degradations of developing property and film-forming property due to increase in viscosity can be prevented.

Polydispersity (molecular weight distribution) of the acid-decomposable resin is generally from 1 to 5, preferably from 1 to 3, more preferably from 1.2 to 3.0, and especially preferably from 1.2 to 2.0. The smaller the polydispersity, the more excellent is the resin in resolution and the resist form, and the more smooth is the sidewall of the resist pattern, and the more excellent is the roughness property.

In the positive resist composition in the invention, the blending amount of all the resins in the composition as a whole is preferably from 50 to 99.9 mass % in all the solids content, and more preferably from 60 to 99.0 mass %.

Further, in the invention, the acid-decomposable resin may be used by one kind alone, or two or more kinds may be used in combination.

It is preferred for the alicyclic hydrocarbon series acid-decomposable resin not to contain a fluorine atom and a silicon atom from the compatibility with the resin (HR).

(B) Compounds Capable of Generating an Acid Upon Irradiation with Actinic Ray or Radiation:

The positive resist composition in the invention contains a compound capable of generating an acid upon irradiation with actinic ray or radiation (hereinafter also referred to as "a photo-acid generator" or "component (B)").

As such photo-acid generators, photo-initiators for cationic photopolymerization, photo-initiators for radical photopolymerization, photodecoloring agent for dyestuffs, photodiscoloring agents, well-known compounds capable of generating an acid upon irradiation with actinic ray or radiation that are used in micro-resists and the like, and mixtures of these compounds can be optionally selected and used.

For example, diazonium salt, phosphonium salt, sulfonium salt, iodonium salt, imidosulfonate, oximesulfonate, diazodisulfone, disulfone, and o-nitrobenzylsulfonate are exemplified as acid generators.

Further, compounds obtained by introducing a group or a compound capable of generating an acid upon irradiation with actinic ray or radiation into the main chain or side chain of polymers, for example, the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc., can be used.

The compounds capable of generating an acid by the action of lights as disclosed in U.S. Pat. No. 3,779,778, EP 126,712, etc., can also be used.

Of the compounds capable of decomposing upon irradiation with actinic ray or radiation and generating an acid, the compounds represented by any of the following formulae (ZI), (ZII) and (ZIII) can be exemplified as preferred compounds.

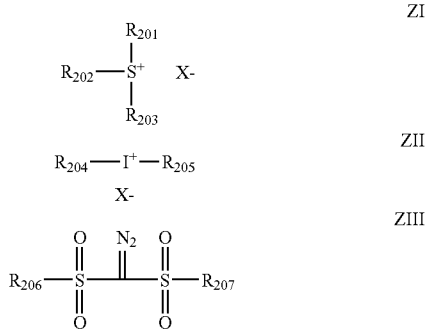

In formula (ZI), each of $R_{201}$, $R_{202}$ and $R_{203}$ independently represents an organic group.

$X^-$ represents a non-nucleophilic anion, preferably a sulfonate anion, a carboxylate anion, a bis(alkylsulfonyl)amide anion, a tris(alkylsulfonyl)methide anion, $BF_4^-$, $PF_6^-$, $SbF_6^-$, etc., are exemplified, and preferably an organic anion containing a carbon atom.

As preferred organic anions, organic anions represented by the following formulae are exemplified.

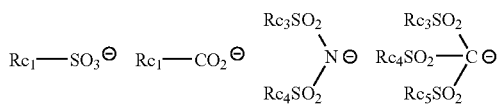

In the above formulae, $Rc_1$ represents an organic group.

As the organic group represented by $Rc_1$, an organic group having from 1 to 30 carbon atoms is exemplified, preferably an alkyl group, an aryl group, each of which groups may be substituted, and a group obtained by linking a plurality of these groups with a linking group such as a single bond, —O—, —CO$_2$—, —S—, —SO$_3$— or —SO$_2$N(Rd$_1$)- can be exemplified. $Rd_1$ represents a hydrogen atom or an alkyl group.

Each of $Rc_3$, $Rc_4$ and $Rc_5$ independently represents an organic group. As preferred organic groups represented by $Rc_3$, $Rc_4$ and $RC_5$, the same organic groups as the preferred organic groups in $Rc_1$ can be exemplified, and a perfluoroalkyl group having from 1 to 4 carbon atoms is most preferred.

$Rc_3$ and $Rc_4$ may be bonded to each other to form a ring. As the group formed by bonding $Rc_3$ and $Rc_4$, an alkylene group and an arylene group are exemplified, and a perfluoroalkylene group having from 2 to 4 carbon atoms is preferred.

The especially preferred organic groups represented by $Rc_1$, $Rc_3$ to $Rc_5$ are an alkyl group substituted with a fluorine atom or a fluoroalkyl group on the 1-position, and a phenyl group substituted with a fluorine atom or a fluoroalkyl group. By the presence of a fluorine atom or a fluoroalkyl group, the acidity of the acid generated upon light irradiation increases to enhance sensitivity. Further, by the presence of a ring formed by bonding $Rc_3$ and $Rc_4$, the acidity of the acid generated upon light irradiation increases to improve sensitivity.

The number of carbon atoms of the organic groups represented by $R_{201}$, $R_{202}$ and $R_{203}$ is generally from 1 to 30, and preferably from 1 to 20.

Any two of $R_{201}$, $R_{202}$ and $R_{203}$ may be bonded to each other to form a cyclic structure, and an oxygen atom, a sulfur atom, an ester bond, an amido bond or a carbonyl group may be contained in the ring. As the group formed by any two of $R_{201}$, $R_{202}$ and $R_{203}$ by bonding, an alkylene group (e.g., a butylene group and a pentylene group) can be exemplified.

As the specific examples of the organic groups represented by $R_{201}$, $R_{202}$ and $R_{203}$, the corresponding groups in compounds (ZI-1), (ZI-2) and (ZI-3) described later can be exemplified.

The compound represented by formula (ZI) may be a compound having a plurality of structures represented by formula (ZI). For instance, compound (ZI) may be a compound having a structure that at least one of $R_{201}$, $R_{202}$ and $R_{203}$ of the compound represented by formula (ZI) is bonded to at least one of $R_{201}$, $R_{202}$ and $R_{203}$ of another compound represented by formula (ZI).

As further preferred component (ZI), the following compounds (ZI-1), (ZI-2) and (ZI-3) can be exemplified.

Compound (ZI-1) is an arylsulfonium compound in the case where at least one of $R_{201}$, $R_{202}$ and $R_{203}$ in formula (ZI) represents an aryl group, that is, a compound having arylsulfonium as the cation.

All of $R_{201}$, $R_{202}$ and $R_{203}$ of the arylsulfonium compound may be aryl groups, or a part of $R_{201}$, $R_{202}$ and $R_{203}$ may be an aryl group and the remainder may be an alkyl group.

As the arylsulfonium compound, e.g., a triarylsulfonium compound, a diarylalkylsulfonium compound, an aryldialkylsulfonium compound, a diarylcycloalkylsulfonium compound, and an aryldicycloalkylsulfonium compound can be exemplified.

As the aryl group of the arylsulfonium compound, an aryl group, e.g., a phenyl group and a naphthyl group, and a hetero-aryl group, e.g., an indole residue and a pyrrole residue are preferred, and a phenyl group and an indole residue are more preferred. When the arylsulfonium compound has two or more aryl groups, these two or more aryl groups may be the same or different.

The alkyl group incorporated into the arylsulfonium compound according to necessity is preferably a straight chain or branched alkyl group having from 1 to 15 carbon atoms, e.g., a methyl group, an ethyl group, a propyl group, an n-butyl group, a sec-butyl group, a t-butyl group, etc., can be exemplified.

The cycloalkyl group incorporated into the arylsulfonium compound according to necessity is preferably a cycloalkyl group having from 3 to 15 carbon atoms, e.g., a cyclopropyl group, a cyclobutyl group, a cyclohexyl group, etc., can be exemplified.

The aryl group, alkyl group and cycloalkyl group represented by $R_{201}$, $R_{202}$ and $R_{203}$ may have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain, branched, or cyclic alkoxyl group having from 1 to 12 carbon atoms, and especially preferred substituents are an alkyl group having from 1 to 4 carbon atoms, and an alkoxyl group having from 1 to 4 carbon atoms. The substituent may be substituted on any one of three of $R_{201}$, $R_{202}$ and $R_{203}$, or may be substituted on all of the three. When $R_{201}$, $R_{202}$ and $R_{203}$ each represents an aryl group, it is preferred that the substituent is substituted on the p-position of the aryl group.

Compound (ZI-2) is described below. Compound (ZI-2) is a compound in the case where $R_{201}$, $R_{202}$ and $R_{203}$ in formula (ZI) each represents an organic group not having an aromatic ring. The aromatic ring here also includes an aromatic ring containing a hetero atom.

The organic group not having an aromatic ring represented by $R_{201}$, $R_{202}$ and $R_{203}$ generally has from 1 to 30 carbon atoms, and preferably from 1 to 20 carbon atoms.

Each of $R_{201}$, $R_{202}$ and $R_{203}$ independently preferably represents an alkyl group, a cycloalkyl group, an allyl group, or a vinyl group, more preferably a straight chain, branched or cyclic 2-oxoalkyl group, or an alkoxycarbonylmethyl group, and especially preferably a straight chain or branched 2-oxoalkyl group.

The alkyl group represented by $R_{201}$, $R_{202}$ and $R_{203}$ may be either straight chain or branched, preferably a straight chain or branched alkyl group having from 1 to 10 carbon atoms, e.g., a methyl group, an ethyl group, a propyl group, a butyl group, and a pentyl group can be exemplified. The alkyl group represented by $R_{201}$, $R_{202}$ and $R_{203}$ is preferably a straight chain or branched 2-oxoalkyl group or an alkoxycarbonylmethyl group.

The cycloalkyl group represented by $R_{201}$, $R_{202}$ and $R_{203}$ is preferably a cycloalkyl group having from 3 to 10 carbon atoms, e.g., a cyclopentyl group, a cyclohexyl group, and a norbonyl group can be exemplified. The cycloalkyl group represented by $R_{201}$, $R_{202}$ and $R_{203}$ is preferably a cyclic 2-oxoalkyl group.

The straight chain, branched or cyclic 2-oxoalkyl group represented by $R_{201}$, $R_{202}$ and $R_{203}$ is preferably a group having >C=O on the 2-position of the above alkyl group and cycloalkyl group.

As the alkoxyl group in the alkoxycarbonylmethyl group represented by $R_{201}$, $R_{202}$ and $R_{203}$, preferably an alkoxyl group having from 1 to 5 carbon atoms, e.g., a methoxy group, an ethoxy group, a propoxy group, a butoxy group, and a pentoxy group can be exemplified.

$R_{201}$, $R_{202}$ and $R_{203}$ may further be substituted with a halogen atom, an alkoxyl group (e.g., having from 1 to 5 carbon atoms), a hydroxyl group, a cyano group, or a nitro group.

Compound (ZI-3) is a compound represented by the following formula (ZI-3) and having a phenacylsulfonium salt structure.

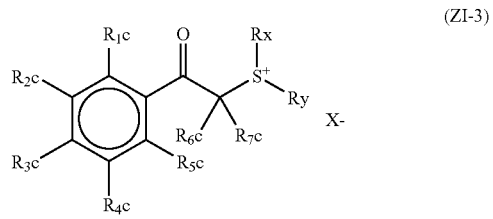

In formula (ZI-3), each of $R_{1c}$, $R_{2c}$, $R_{3c}$, $R_{4c}$ and $R_{5c}$ independently represents a hydrogen atom, an alkyl group, a cycloalkyl group, an alkoxyl group, or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group, or a vinyl group.

Any two or more of $R_{1c}$ to $R_{7c}$, and $R_x$ and $R_y$ may be bonded to each other to form cyclic structures, respectively, and the cyclic structures may contain an oxygen atom, a sulfur atom, an ester bond, or an amido bond. As the groups formed by any two or more of $R_{1c}$ to $R_{7c}$, and $R_x$ and $R_y$, by bonding, a butylene group, a pentylene group, etc., can be exemplified.

$X^-$ represents a non-nucleophilic anion, and the same anion as the non-nucleophilic anion represented by $X^-$ in formula (ZI) can be exemplified.

The alkyl group represented by $R_{1c}$ to $R_{7c}$ may be either straight chain or branched, e.g., a straight chain or branched alkyl group having from 1 to 20 carbon atoms, preferably a straight chain or branched alkyl group having from 1 to 12 carbon atoms, e.g., a methyl group, an ethyl group, a straight chain or branched propyl group, a straight chain or branched butyl group, and a straight chain or branched pentyl group can be exemplified.

As the cycloalkyl group represented by $R_{1c}$ to $R_{7c}$, preferably a cycloalkyl group having from 3 to 8 carbon atoms, e.g., a cyclopentyl group and a cyclohexyl group can be exemplified.

The alkoxyl group represented by $R_{1c}$ to $R_{5c}$ may be any of straight chain, branched, or cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, and a straight chain or branched pentoxy group), a cyclic alkoxyl group having from 3 to 8 carbon atoms (e.g., a cyclopentyloxy group, and a cyclohexyloxy group) can be exemplified.

It is preferred that any of $R_{1c}$ to $R_{5c}$ represents a straight chain or branched alkyl group, a cycloalkyl group, or a straight chain, branched, or cyclic alkoxyl group, and more preferably the sum total of the carbon atoms of $R_{1c}$ to $R_{5c}$ is from 2 to 15, by which the solubility in a solvent is bettered and the generation of particles during preservation can be restrained.

As the alkyl group represented by $R_x$ and $R_y$, the same alkyl groups as represented by $R_{1c}$ to $R_{7c}$ can be exemplified. The alkyl group represented by $R_x$ and $R_y$ is preferably a straight chain or branched 2-oxoalkyl group or an alkoxycarbonylmethyl group.

As the cycloalkyl group represented by $R_x$ and $R_y$, the same cycloalkyl groups as represented by $R_{1c}$ to $R_{7c}$ can be exemplified. The cycloalkyl group represented by $R_x$ and $R_y$ is preferably a cyclic 2-oxoalkyl group.

As the straight chain, branched, or cyclic 2-oxoalkyl group, a group having >C=O on the 2-position of the alkyl group or the cycloalkyl group represented by $R_{1c}$ to $R_{7c}$ can be exemplified.

As the alkoxyl group in the alkoxycarbonylmethyl group, the same alkoxyl groups as represented by $R_{1c}$ to $R_{5c}$ can be exemplified.

$R_x$ and $R_y$ each preferably represents an alkyl group having 4 or more carbon atoms, more preferably 6 or more carbon atoms, and still more preferably an alkyl group having 8 or more carbon atoms.

In formulae (ZII) and (ZIII), each of $R_{204}$, $R_{205}$, $R_{206}$ and $R_{207}$ independently represents an aryl group, an alkyl group, or a cycloalkyl group.

The aryl group represented by $R_{204}$ to $R_{207}$ is preferably a phenyl group or a naphthyl group, and more preferably a phenyl group.

The alkyl group represented by $R_{204}$ to $R_{207}$ may be either straight chain or branched, and preferably a straight chain or branched alkyl group having from 1 to 10 carbon atoms, e.g., a methyl group, an ethyl group, a propyl group, a butyl group, and a pentyl group can be exemplified.

The cycloalkyl group represented by $R_{204}$ to $R_{207}$ is preferably a cycloalkyl group having from 3 to 10 carbon atoms, e.g., a cyclopentyl group, a cyclohexyl group, and a norbonyl group can be exemplified.

$R_{204}$ to $R_{207}$ may each have a substituent. As the examples of the substituents that $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group, a phenylthio group, etc., can be exemplified.

$X^-$ represents a non-nucleophilic anion, and the same anion as the non-nucleophilic anion represented by $X^-$ in formula (ZI) can be exemplified.

Of the compounds capable of generating an acid upon irradiation with actinic ray or radiation, the compounds represented by the following formula (ZIV), (ZV) or (ZVI) can further be exemplified as preferred compounds.

$$Ar_3 \text{---} SO_2 \text{---} SO_2 \text{---} Ar_4 \quad \text{ZIV}$$

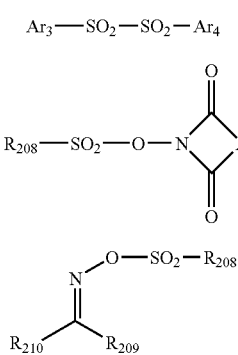

In formulae (ZIV) to (ZVI), each of $Ar_3$ and $Ar_4$ independently represents an aryl group.

$R_{208}$ represents an alkyl group or an aryl group.

$R_{208}$ and $R_{209}$ each represents an alkyl group, an aryl group, or an electron attractive group. $R_{209}$ preferably represents an aryl group.

$R_{210}$ preferably represents an electron attractive group, and more preferably a cyano group or a fluoroalkyl group.

A represents an alkylene group, an alkenylene group, or an arylene group.

As the compound capable of generating an acid upon irradiation with actinic ray or radiation, the compounds represented by any of formulae (ZI), (ZII) and (ZIII) are preferred.

Compound (B) is preferably a compound capable of generating an aliphatic sulfonic acid having a fluorine atom or a benzenesulfonic acid having a fluorine atom upon irradiation with actinic ray or radiation.

Compound (B) preferably has a triphenylsulfonium structure.

Compound (B) is preferably a triphenylsulfonium salt compound having an alkyl group or cycloalkyl group not substituted with a fluorine atom at the cationic portion.

Of the compounds capable of generating an acid upon irradiation with actinic ray or radiation, particularly preferred examples are shown below.

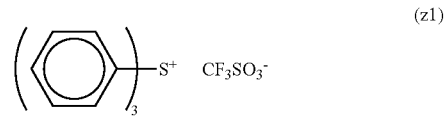
(z1)

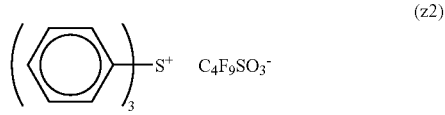
(z2)

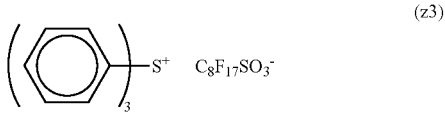
(z3)

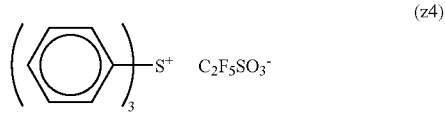
(z4)

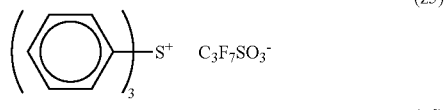
(z5)

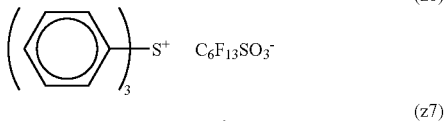
(z6)

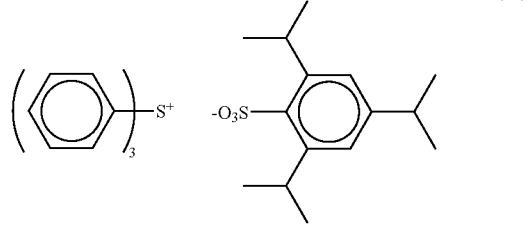
(z7)

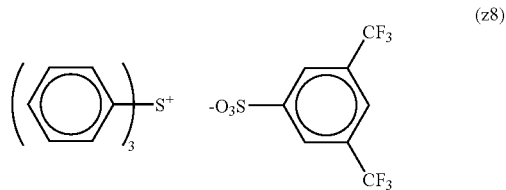
(z8)

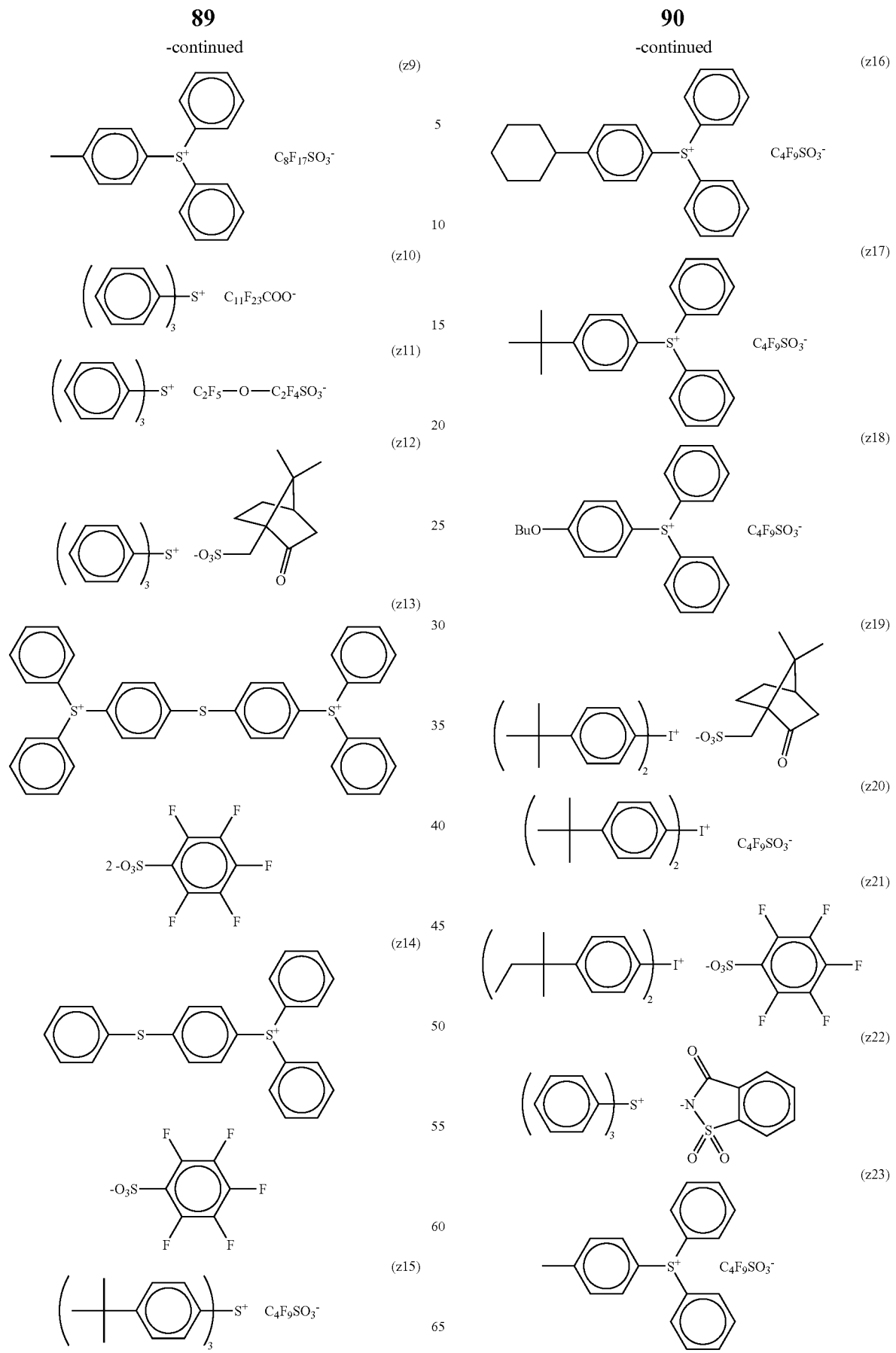

-continued
(z24)
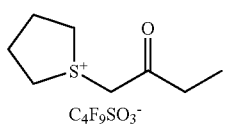
(z25)
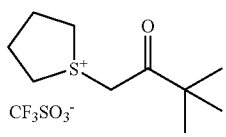
(z26)
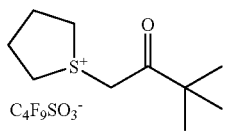
(z27)
(z28)
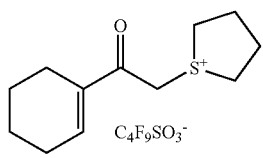
(z29)
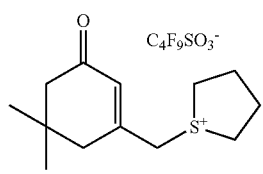
(z30)
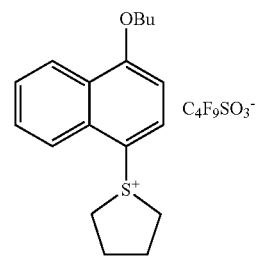
(z31)
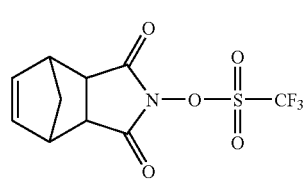
(z32)
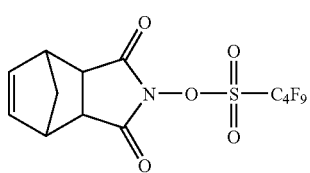
-continued
(z33)
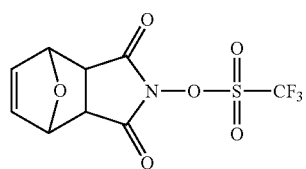
(z34)
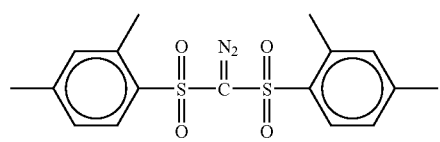
(z35)
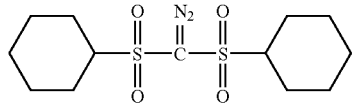
(z36)
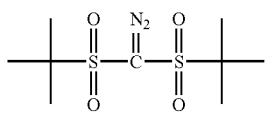
(z37)
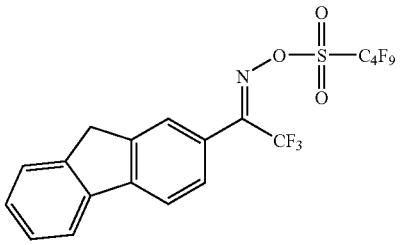
(z38)
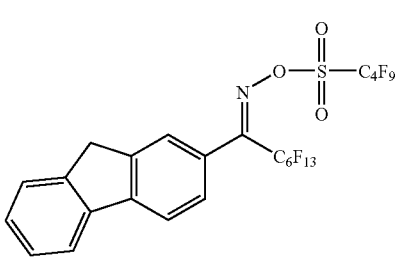
(z39)
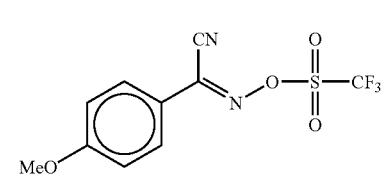
(z40)
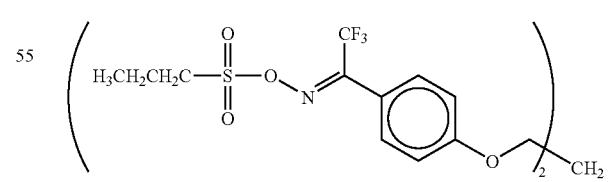
(z41)
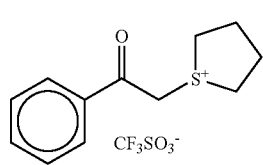

-continued
(z42) 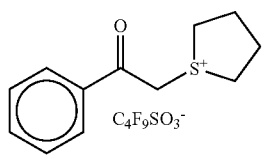
(z43) 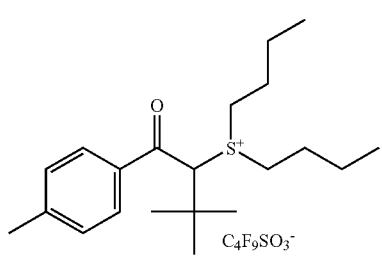
(z44) 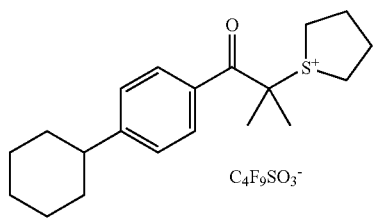
(z45) 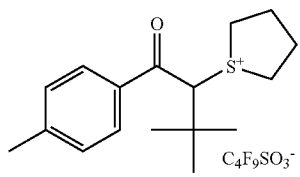
(z46) 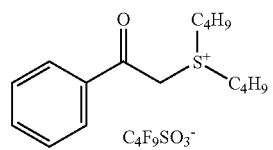
(z47) 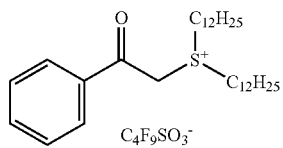
(z48) 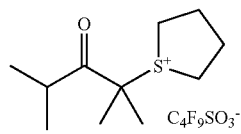
(z49) 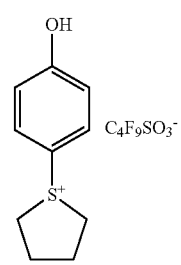
-continued
(z50) 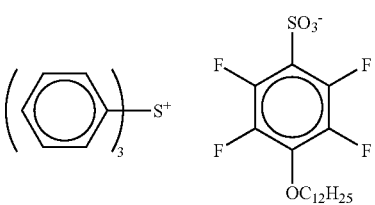
(z51) 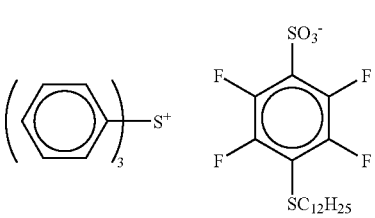
(z52) 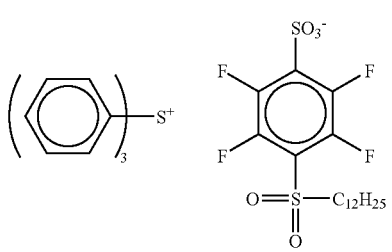
(z53) 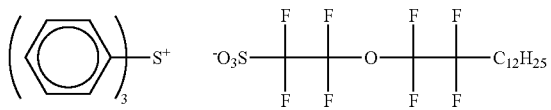
(z54) 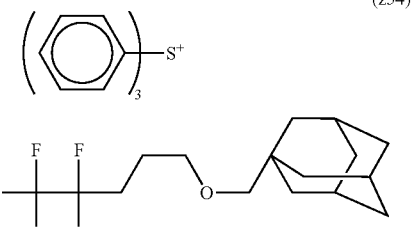
(z55) 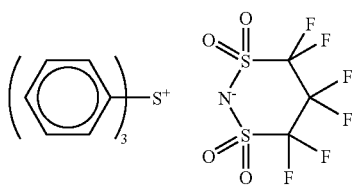
(z56) 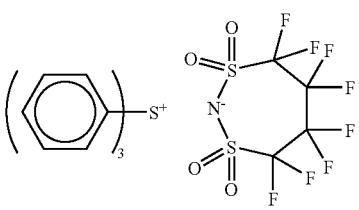

(z57) 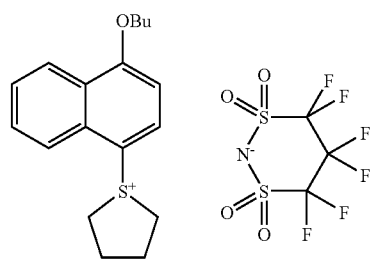
(z58) 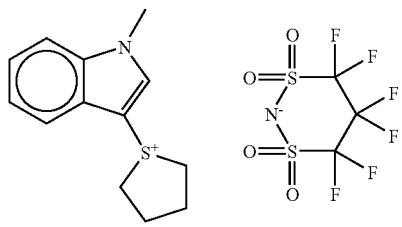
(z59) 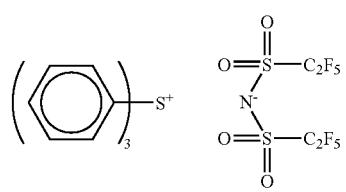
(z60) 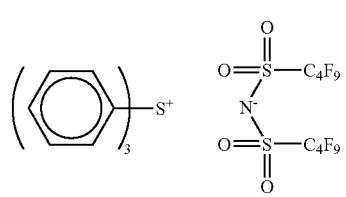
(z61) 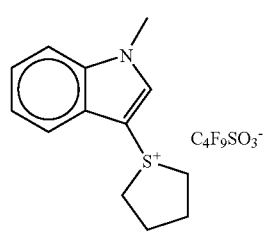
(z62) 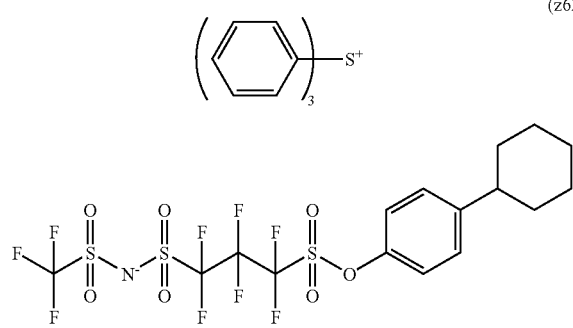
(z63) 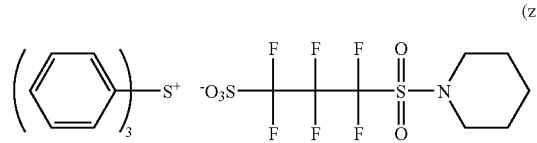
(z64) 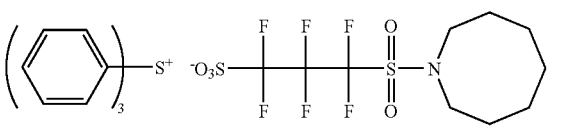
(z65) 
(z66) 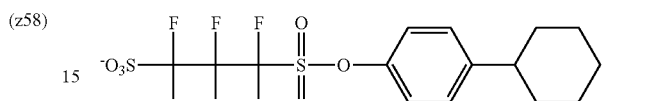
(z67) 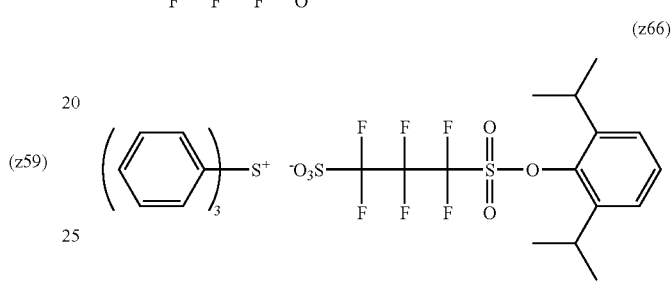
(z68) 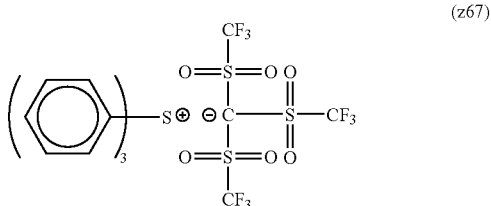
(z69) 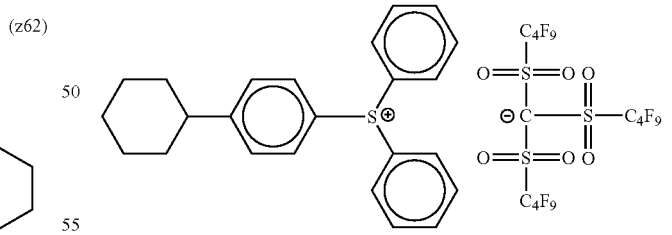
(z70) 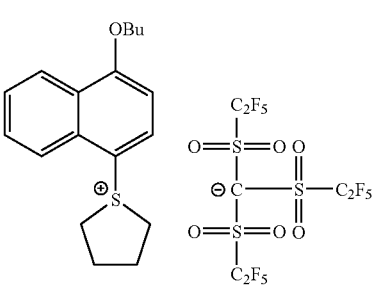

(z71) 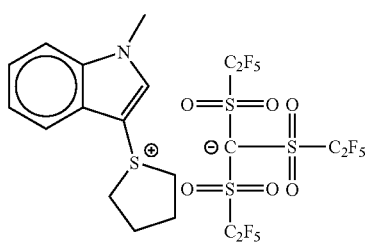

(z75) 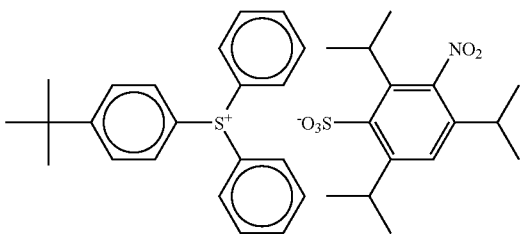

(z72) 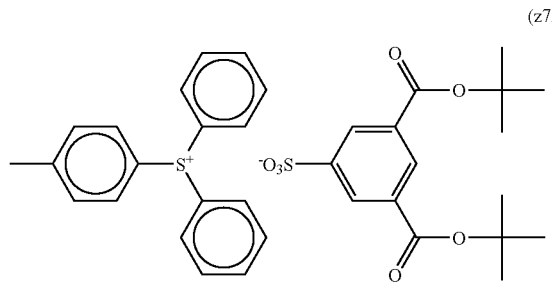

(z76) 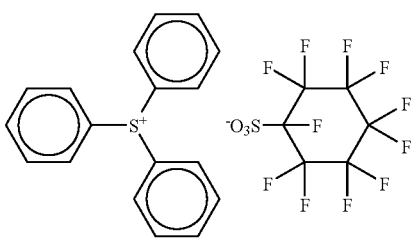

(z73)

(z77) 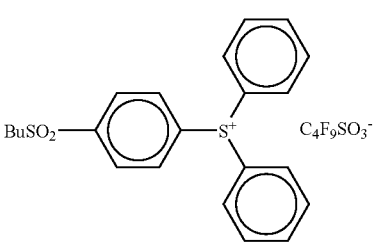

(z78) 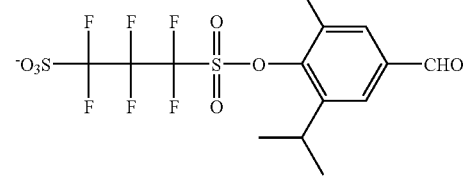

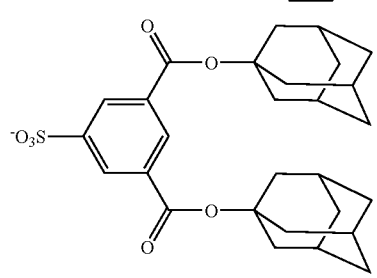

(z74) 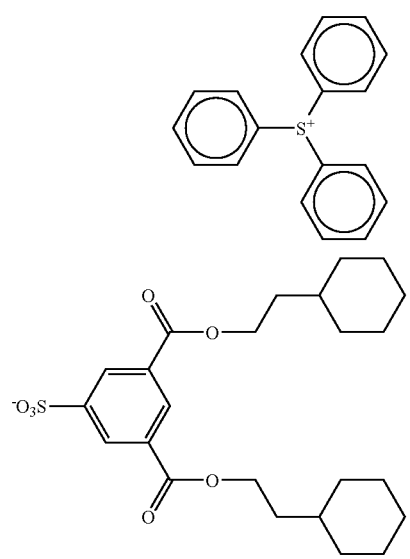

Photo-acid generators can be used by one kind alone, or two or more kinds can be used in combination. When two or more compounds are used in combination, it is preferred to combine compounds capable of generating two kinds of organic acids in which the total atom number exclusive of a hydrogen atom differs by 2 or more.

The content of the photo-acid generators is preferably from 0.1 to 20 mass % based on all the solids content of the positive resist composition, more preferably from 0.5 to 10 mass %, and still more preferably from 1 to 7 mass %.

(D) Solvent:

As the solvents that can be used for dissolving the above each component to prepare a positive resist composition, e.g., alkylene glycol monoalkyl ether carboxylate, alkylene glycol monoalkyl ether, alkyl lactate, alkyl alkoxypropionate, cyclic lactones having from 4 to 10 carbon atoms, monoketone compounds having from 4 to 10 carbon atoms which may contain a ring, alkylene carbonate, alkyl alkoxy acetate, and alkyl pyruvate can be exemplified.

As the alkylene glycol monoalkyl ether carboxylate, e.g., propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, ethylene glycol monoethyl ether acetate are preferably exemplified.

As the alkylene glycol monoalkyl ether, e.g., propylene glycol monomethyl ether, propylene glycol monoethyl ether, propylene glycol monopropyl ether, propylene glycol monobutyl ether, ethylene glycol monomethyl ether, and ethylene glycol monoethyl ether are preferably exemplified.

As the alkyl lactate, e.g., methyl lactate, ethyl lactate, propyl lactate, and butyl lactate are preferably exemplified.

As the alkyl alkoxypropionate, e.g., ethyl 3-ethoxypropionate, methyl 3-methoxypropionate, methyl 3-ethoxypropionate, and ethyl 3-methoxypropionate are preferably exemplified.

As the cyclic lactones having from 4 to 10 carbon atoms, e.g., β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone are preferably exemplified.

As the monoketone compounds having from 4 to 10 carbon atoms which may contain a ring, e.g., 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone are preferably exemplified.

As the alkylene carbonate, e.g., propylene carbonate, vinylene carbonate, ethylene carbonate, and butylene carbonate are preferably exemplified.

As the alkyl alkoxy acetate, e.g., 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate are preferably exemplified.

As the alkyl pyruvate, e.g., methyl pyruvate, ethyl pyruvate, and propyl pyruvate are preferably exemplified.

Solvents having a boiling point of 130° C. or more under room temperature and atmospheric pressure are preferably used, and specifically cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate are exemplified.

In the invention, these solvents may be used alone or two or more solvents may be used in combination.

In the invention, a mixed solvent comprising a solvent containing a hydroxyl group in the structure and a solvent not containing a hydroxyl group in the structure may be used as an organic solvent.

As the solvent containing a hydroxyl group, ethylene glycol, ethylene glycol monomethyl ether, ethylene glycol monoethyl ether, propylene glycol, propylene glycol monomethyl ether, propylene glycol monoethyl ether, and ethyl lactate can be exemplified. Of these solvents, propylene glycol monomethyl ether and ethyl lactate are particularly preferred.

As the solvent not containing a hydroxyl group, e.g., propylene glycol monomethyl ether acetate, ethylethoxy propionate, 2-heptanone, γ-butyrolactone, cyclohexanone, butyl acetate, N-methylpyrrolidone, N,N-dimethylacetamide, and dimethyl sulfoxide can be exemplified. Of these solvents, propylene glycol monomethyl ether acetate, ethylethoxy propionate, 2-heptanone, γ-butyrolactone, cyclohexanone, and butyl acetate are especially preferred, and propylene glycol monomethyl ether acetate, ethylethoxy propionate and 2-heptanone are most preferred.

The mixing ratio (by mass) of the solvent containing a hydroxyl group and the solvent not containing a hydroxyl group is from 1/99 to 99/1, preferably from 10/90 to 90/10, and more preferably from 20/80 to 60/40. A mixed solvent comprising 50 mass % or more of a solvent not containing a hydroxyl group is especially preferred in the point of coating uniformity.

The solvent is preferably a mixed solvent comprising two or more kinds of solvents containing propylene glycol monomethyl ether acetate.

(E) Basic Compounds:

For reducing the fluctuation of performances due to aging from exposure to heating, it is preferred for a positive resist composition of the invention to contain basic compound (E).

As preferred basic compounds, compounds having a structure represented be any of the following formulae (A) to (E) can be exemplified.

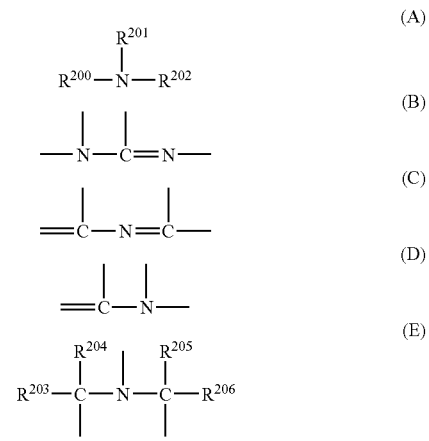

In formulae (A) and (E), $R^{200}$, $R^{201}$ and $R^{202}$, which may be the same or different, each represents a hydrogen atom, an alkyl group (preferably having from 1 to 20 carbon atoms), a cycloalkyl group (preferably having from 3 to 20 carbon atoms), or an aryl group (having from 6 to 20 carbon atoms), and $R^{201}$ and $R^{202}$ may be bonded to each other to form a ring.

The alkyl group may be unsubstituted or substituted, and as the alkyl group having a substituent, an aminoalkyl group having from 1 to 20 carbon atoms, a hydroxyalkyl group having from 1 to 20 carbon atoms, and a cyanoalkyl group having from 1 to 20 carbon atoms are preferred.

$R^{203}$, $R^{204}$, $R^{205}$ and $R^{206}$, which may be the same or different, each represents an alkyl group having from 1 to 20 carbon atoms.

These alkyl groups in formulae (A) to (E) are more preferably unsubstituted.

As preferred examples of basic compounds, guanidine, aminopyrrolidine, pyrazole, pyrazoline, piperazine, aminomorpholine, aminoalkylmorpholine, and piperidine can be exemplified. As more preferred compounds, compounds having an imidazole structure, a diazabicyclo structure, an onium hydroxide structure, an onium carboxylate structure, a trialkylamine structure, an aniline structure, or a pyridine structure, alkylamine derivatives having at least one of a hydroxyl group and an ether bond, and aniline derivatives having at least one of a hydroxyl group and an ether bond can be exemplified.

As the compounds having an imidazole structure, imidazole, 2,4,5-triphenylimidazole, and benzimidazole can be exemplified. As the compounds having a diazabicyclo structure, 1,4-diazabicyclo[2,2,2]octane, 1,5-diazabicyclo[4,3,0]nona-5-ene, and 1,8-diazabicyclo[5,4,0]undeca-7-ene can be exemplified. As the compounds having an onium hydroxide structure, triarylsulfonium hydroxide, phenacylsulfonium hydroxide, sulfonium hydroxide having a 2-oxoalkyl group, specifically triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide can be exemplified. The compounds having an onium carboxylate structure are compounds having an onium hydroxide structure in which the anionic part is carboxylated, e.g., acetate, adamantane-1-carboxylate and perfluoroalkyl carboxylate are exemplified. As the compounds having a trialkylamine structure, tri(n-butyl)amine and tri(n-octyl)amine are exemplified. As the aniline compounds, 2,6-diisopropylaniline, N,N-dimethylaniline, N,N-dibutylaniline, and N,N-dihexylaniline are exemplified. As the alkylamine derivatives having at least one of a hydroxyl group and an ether bond, ethanolamine, diethanolamine, triethanolamine, and tris(methoxyethoxyethyl)amine are exemplified. As the aniline derivatives having at least one of a hydroxyl group and an ether bond, N,N-bis(hydroxyethyl)aniline is exemplified.

These basic compounds are used alone or in combination of two or more kinds.

The use amount of basic compounds is generally from 0.001 to 10 mass % based on the solids content of the positive resist composition, and preferably from 0.01 to 5 mass %.

The proportion of use amount of the acid generator to basic compound in a composition is preferably acid generator/basic compound (molar ratio) of from 2.5 to 300. That is, from the points of sensitivity and resolution, the molar ratio is preferably 2.5 or more, and in view of the restraint of the reduction of resolution by the thickening of a resist pattern due to aging from exposure to heating treatment, the molar ratio is preferably 300 or less. More preferably acid generator/basic compound (molar ratio) is from 5.0 to 200, and still more preferably from 7.0 to 150.

(F) Surfactants:

It is preferred for the positive resist composition in the invention to further contain surfactant (F), and it is more preferred to contain either one or two or more of fluorine and/or silicon surfactants (a fluorine surfactant, a silicon surfactant, a surfactant containing both a fluorine atom and a silicon atom).

By containing surfactant (F), it becomes possible for the positive resist composition in the invention to provide a resist pattern excellent in sensitivity and resolution, and low in defects in adhesion and development in using an exposure light source of 250 nm or lower, in particular, 220 nm or lower.

These fluorine and/or silicon surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. The commercially available surfactants shown below can also be used as they are.

As the commercially available fluorine or silicon surfactants usable in the invention, e.g., Eftop EF301 and EF303 (manufactured by Shin-Akita Kasei Co., Ltd.), Fluorad FC 430, 431 and 4430 (manufactured by Sumitomo 3M Limited), Megafac F171, F173, F176, F189, F113, F110, F177, F120, and R08 (manufactured by Dainippon Ink and Chemicals Inc.), Sarfron S-382, SC 101, 102, 103, 104, 105 and 106 (manufactured by ASAHI GLASS CO., LTD.), Troy Sol S-366 (manufactured by Troy Chemical Co., Ltd.), GF-300 and Gf-150 (manufactured by TOAGOSEI CO., LTD.), Sarfron S-393 (manufactured by SEIMI CHEMICAL CO., LTD.), Eftop EF121, EF122A, EF122B, RF122C, EF125M, EF135M, EF351, 352, EF801, EF802, and EF601 (manufactured by JEMCO INC.), PF636, PF656, PF6320 and PF6520 (manufactured by OMNOVA), and FTX-204D, 208G, 218G, 230G, 204D, 208D, 212D, 218, and 222D (manufactured by NEOS) are exemplified. In addition, polysiloxane polymer KP-341 (manufactured by Shin-Etsu Chemical Co., Ltd.) can also be used as a silicon surfactant.

In addition to these known surfactants as exemplified above, surfactants using polymers having fluoro-aliphatic groups derived from fluoro-aliphatic compounds manufactured by a telomerization method (also called a telomer method) or an oligomerization method (also called an oligomer method) can be used. Fluoro-aliphatic compounds can be synthesized by the method disclosed in JP-A-2002-90991.

As polymers having fluoro-aliphatic groups, copolymers of monomers having fluoro-aliphatic groups and at least one of (poly(oxyalkylene)) acrylate and (poly(oxyalkylene)) methacrylate are preferred, and they may be distributed at random or may be block copolymerized. As the poly(oxyalkylene) groups, a poly(oxyethylene) group, a poly(oxypropylene) group, and a poly(oxybutylene) group are exemplified. Further, the polymers may be units having alkylenes different in chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly(oxyalkylene) acrylate (or methacrylate) may be not only bipolymers but also terpolymers or higher polymers obtained by copolymerization of monomers having different two or more kinds of fluoro-aliphatic groups or different two or more kinds of poly(oxyalkylene) acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and poly(oxyalkylene) acrylate (or methacrylate), and copolymers of acrylate (or methacrylate) having a $C_3F_7$ group, poly(oxyethylene) acrylate (or methacrylate), and poly(oxypropylene) acrylate (or methacrylate) are exemplified.

In the invention, surfactants other than fluorine and/or silicon surfactants can also be used. Specifically, nonionic surfactants, such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkylallyl ether, e.g., polyoxyethylene octylphenol ether, polyoxyethylene nonylphenol ether, etc., polyoxyethylene-polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., and polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc., can be exemplified.

These surfactants may be used alone or may be used in combination of some kinds.

The amount of surfactants (F) is preferably in proportion of from 0.01 to 10 mass % based on all the amount of the positive resist composition (excluding solvents), and more preferably from 0.1 to 5 mass %.

(G) Carboxylic Acid Onium Salt:

The positive resist composition in the invention may further contain carboxylic acid onium salt (G). As the carboxylic acid onium salt, carobxylic acid sulfonium salt, carobxylic acid iodonium salt, carobxylic acid ammonium salt, etc., can be exemplified. As carboxylic acid onium salt (G), iodonium salt and sulfonium salt are especially preferred. It is preferred that the carboxylate residue of carboxylic acid onium salt (G) of the invention does not contain an aromatic group and a carbon-carbon double bond. An especially preferred anion moiety is a straight chain or branched, monocyclic or polycyclic alkylcarboxylate anion having from 1 to 30 carbon atoms, and the carboxylate anion in which a part or all of the alkyl groups are substituted with fluorine atoms is more preferred. An oxygen atom may be contained in the alkyl chain, by which the transparency to the lights of 220 nm or less is ensured, sensitivity and resolution are enhanced, and iso/dense bias and exposure margin are improved.

As fluorine-substituted carboxylate anions, anions of fluoroacetate, difluoroacetate, trifluoroacetate, pentafluoropropionate, heptafluorobutyrate, nonafluoropentanoate, perfluorododecanoate, perfluorotridecanoate, perfluorocyclohexanecarboxylate, 2,2-bistrifluoromethylpropionate, etc., are exemplified.

These carboxylic acid onium salts (G) can be synthesized by reacting sulfonium hydroxide, iodonium hydroxide, or ammonium hydroxide and carboxylic acid with silver oxide in an appropriate solvent.

The content of carboxylic acid onium salt (G) in a composition is generally from 0.1 to 20 mass % to all the solids content of the composition, preferably from 0.5 to 10 mass %, and more preferably from 1 to 7 mass %.

(H) Other Additives:

If necessary, dyes, plasticizers, photosensitizers, light absorbers, alkali-soluble resins, dissolution inhibitors, and compounds for accelerating solubility in a developing solution (e.g., phenolic compounds having a molecular weight of 1,000 or less, alicyclic or aliphatic compounds having a carboxyl group) may further be added to the positive resist composition in the invention.

Such phenolic compounds having a molecular weight of 1,000 or less can be easily synthesized with referring to the methods disclosed, e.g., in JP-A-4-122938, JP-A-2-28531, U.S. Pat. No. 4,916,210, and EP 219,294.

As the specific examples of the alicyclic or aliphatic compounds having a carboxyl group, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, cyclohexanedicarboxylic acid, etc., are exemplified, but the invention is not limited to these compounds.

[3] Pattern-Forming Method:

From the improvement of resolution, the positive resist composition in the invention is preferably used in a film thickness of from 30 to 500 nm, more preferably from 30 to 250 nm, and still more preferably from 30 to 200 nm of film thickness. Such a film thickness can be obtained by setting the concentration of solids content in the positive resist composition in a proper range having appropriate viscosity to thereby improve a coating property and a film-forming property.

The concentration of all the solids content in the positive resist composition is generally from 1 to 10 mass %, more preferably from 1 to 8.0 mass %, and still more preferably from 1.0 to 6.0 mass %.

The positive resist composition in the invention is used by dissolving the above components in a prescribed organic solvent, preferably in a mixed solvent as described above, filtering the resulting solution through a filter, and coating the solution on a prescribed support as follows. Filters for filtration are preferably made of polytetrafluoroethylene, polyethylene or nylon having a pore diameter of preferably 0.1 μm or less, more preferably 0.05 μm or less, and still more preferably 0.03 μm or less.

For example, a positive resist composition is coated on a substrate such as the one used in the manufacture of precision integrated circuit devices (e.g., silicon/silicon dioxide coating) by an appropriate coating method with a spinner or a coater and dried to form a photosensitive film. Incidentally, a known antireflection film may be coated on a substrate in advance.

The photosensitive film is then irradiated with actinic ray or radiation through a prescribed mask, and the exposed film is preferably subjected to baking (heating), and then development and rinsing, whereby a good pattern can be obtained.

As actinic rays or radiation, infrared rays, visible rays, ultraviolet rays, far ultraviolet rays, and X-rays can be exemplified, preferably far ultraviolet rays of wavelengths of 250 nm or less, more preferably 220 nm or less, and especially preferably from 1 to 200 nm. Specifically, a KrF excimer laser (248 nm), an ArF excimer laser (193 nm), an $F_2$ excimer laser (157 nm), and X-rays are exemplified, and an ArF excimer laser, an $F_2$ excimer laser, and EUV (13 nm) are preferably used.

Prior to formation of a resist film, an antireflection film may be coated on a substrate in advance.

As antireflection films, an inorganic film type, e.g., titanium, titanium dioxide, titanium nitride, chromium oxide, carbon, and amorphous silicon, and an organic film type comprising a light absorber and a polymer material are exemplified, and any of these materials can be used. As the organic antireflection films, commercially available organic antireflection films such as DUV30 series and DUV-40 series (manufactured by Brewer Science), AR-2, AR-3 and AR-5 (manufactured by Shipley Company LLC), etc., are exemplified and any of these products can also be used.

In a development process, an alkali developing solution is used as follows. As the alkali developing solution of a resist composition, alkali aqueous solutions of inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, di-n-butylamine, etc., tertiary amines, e.g., triethylamine methyldiethylamine, etc., alcohol amines, e.g., dimethylethanolamine, triethanolamine, etc., quaternary ammonium salts, e.g., tetramethylammonium hydroxide, tetraethylammonium hydroxide, etc., and cyclic amines, e.g., pyrrole, piperidine, etc., can be used.

An appropriate amount of alcohols and surfactants may be added to these alkali developing solutions.

The alkali concentration of alkali developing solutions is generally from 0.1 to 20 mass %.

The pH of alkali developing solutions is generally from 10.0 to 15.0.

Pure water is used as a rinsing liquid and an appropriate amount of surfactant may be added to a rinsing liquid.

After development process or rinsing process, a process to remove the developing solution or rinsing liquid on the pattern can be performed with a supercritical fluid.

The development process or rinsing process may be carried out with a paddle, or may be performed in a paddlelsess process.

In immersion exposure, a rinsing process may be performed before and after exposure.

In patterning by immersion exposure, at the time of irradiation with actinic ray or radiation, exposure (immersion exposure) is performed by filling a liquid (an immersion medium) having a higher refractive index than that of air between a resist film and a lens, by which resolution can be raised. As the immersion medium, any liquids can be used so long as they are liquids higher in refractive index than air, but pure water is preferred.

An immersion liquid for use in immersion exposure is described below.

An immersion liquid having a temperature coefficient of refractive index as small as possible is preferred so as to be transparent to the exposure wavelength and to hold the distortion of optical image reflected on the resist to the minimum. In particular, when the exposure light source is an ArF excimer laser (wavelength: 193 nm), it is preferred to use water as the immersion liquid for easiness of availability and easy handling property, in addition to the above points.

Further, in view of the improvement of refractive index, a medium having a refractive index of 1.5 or more can also be used, e.g., an aqueous solution and an organic solvent can be used as the medium.

When water is used as an immersion liquid, to reduce the surface tension of water and to increase the surface activity, a trace amount of additive (a liquid) that does not dissolve the resist layer on a wafer and has a negligible influence on the optical coating of the lower surface of a lens may be added. As the additive, aliphatic alcohols having a refractive index almost equal to the refractive index of water is preferred, specifically methyl alcohol, ethyl alcohol and isopropyl alcohol are exemplified. By the addition of an alcohol having a refractive index almost equal to that of water, even if the alcohol component in water is evaporated and the concentration of the content is changed, the fluctuation of the refractive index of the liquid as a whole can be made extremely small. On the other hand, when substances opaque to the light of 193 nm or impurities largely different from water in a refractive index are mixed, these substances bring about the distortion of the optical image reflected on the resist. Accordingly, the water used is preferably distilled water. Further, pure water filtered through an ion exchange filter may be used.

The electric resistance of water is preferably 18.3 MΩ·cm or higher, and TOC (organic substance concentration) is preferably 20 ppb or lower. Further, it is preferred that water has been subjected to deaeration treatment.

It is possible to heighten lithographic performance by increasing the refractive index of an immersion liquid. From such a point of view, additives capable of heightening a refractive index may be added to water, or deuterium ($D_2O$) may be used in place of water.

Since the resin (HR) contained in the resist is locally distributed on the surface of the positive resist film in the invention, the contact angle of the film surface (in particular, receding contact angle) can be improved. When the positive resist composition of the invention is made a film, the receding contact angle of water to the resist film is preferably 65° or more, and more preferably 70° or more. When the resin (HR) alone is dissolved in a solvent and coated, the receding contact angle of the film is preferably from 70 to 110°. The receding contact angle of the resist film is adjusted to 60 to 80° by adjusting the addition amount of the resin (HR). Here, the receding contact angle is the one under room temperature and atmospheric pressure. The receding contact angle is a receding contact angle when a droplet begins to drop by slanting a resist film.

A resist-protective film (hereinafter also referred to as "a topcoat") may be provided between the resist film by the positive resist composition of the invention and an immersion liquid so that the resist film is not directly in contact with the immersion liquid. The elution of the composition from the resist film to the immersion medium is restrained by the topcoat, and there is the effect of the reduction of development defects.

The necessary functions required of the topcoat are coating suitability on the top layer of the resist, the transparency to radiation, in particular the transparency to the light of 193 nm, and the insolubility in the immersion liquid. It is preferred that the topcoat is not mixed with the resist and can be uniformly coated on the top layer of the resist.

From the viewpoint of transparency to 193 nm, polymers not containing aromatic groups are preferred as the topcoat. Specifically, hydrocarbon polymers, acrylate polymers, polymethacrylic acid, polyacrylic acid, polyvinyl ether, silicon-containing polymers and fluorine-containing polymers are exemplified. If impurities are eluted from the topcoat to the immersion liquid, the optical lens is contaminated, so that the residual monomer contained in the topcoat is preferably small.

When the topcoat is peeled, a developing solution may be used, or a remover may be used. As the remover, solvents low in permeation into the resist are preferred. In view of capable of performing peeling process at the same time with the development process of the resist, peeling by an alkali developing solution is preferred From the viewpoint of performing peeling by an alkali developing solution, the topcoat is preferably acidic, but from the point of non-intermixture with the resist, it may be neutral or alkaline.

Resolution increases when there is no difference in the refractive indexes between the topcoat and the immersion liquid. When water is used as the immersion liquid in an ArF excimer laser (wavelength: 193 nm) exposure light source, it is preferred that the refractive index of the topcoat for ArF immersion exposure is preferably near the refractive index of the immersion liquid. For bringing the refractive index of the topcoat near to that of the immersion liquid, it is preferred for the topcoat to contain a fluorine atom. Further, from the viewpoint of the transparency and refractive index, the topcoat is preferably a thin film.

It is preferred that the topcoat should not be mixed with the resist, and further not mixed with the immersion liquid. From this point of view, when water is used as the immersion liquid, the solvent for the topcoat is preferably hardly soluble in the solvent of the resist and a medium of not water-soluble. Further, when the immersion liquid is an organic solvent, the topcoat may be water-soluble or not water-soluble.

EXAMPLE

The invention will be described in further detail with reference to examples, but the invention is by no means restricted thereto.

The specific examples of the resins (A) in the invention are shown below. The compositions (molar ratios correspond to repeating units from the left side in order), weight average molecular weights (Mw), and polydispersity (Mw/Mn) of resins (A) shown in the specific examples are shown in Table 2 below. However, the invention is not restricted thereto.

TABLE 2

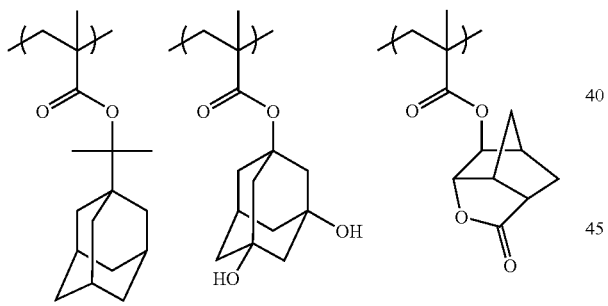

(1)

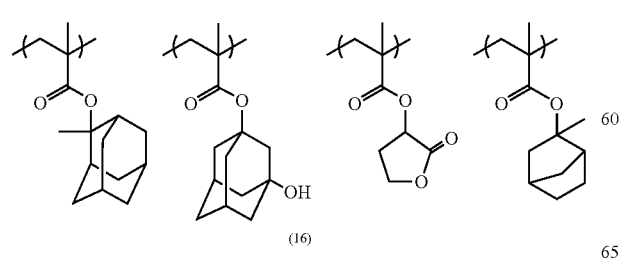

(16)

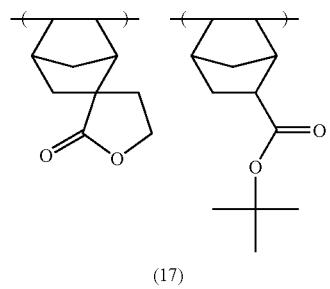

(17)

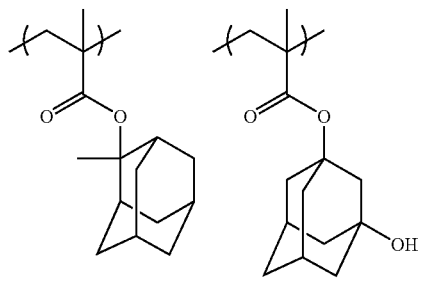

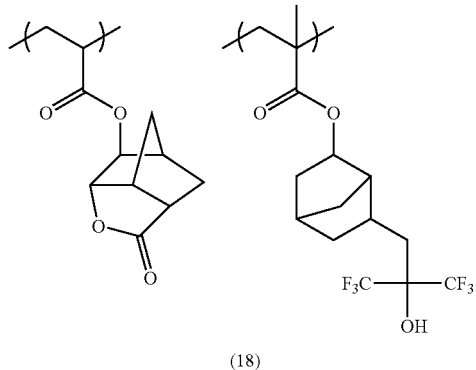

(18)

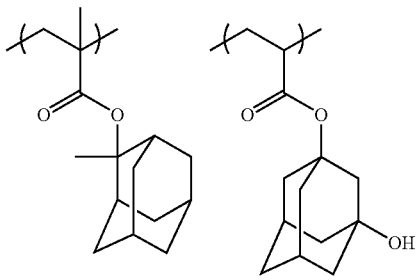

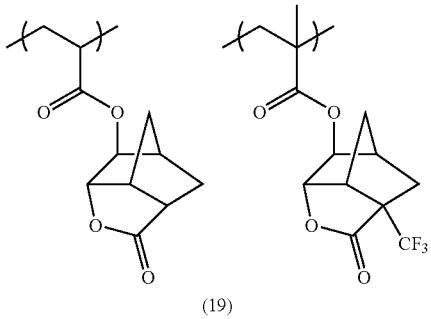

(19)

TABLE 2-continued
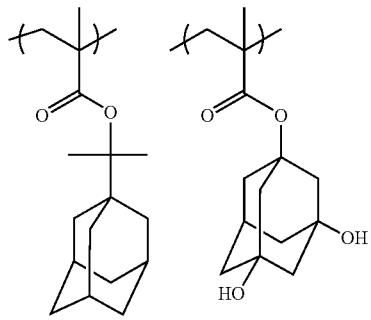
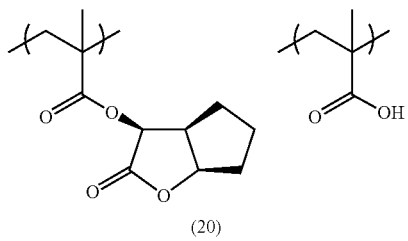
(20)
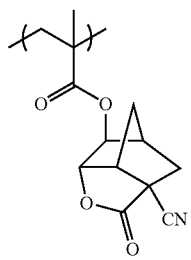 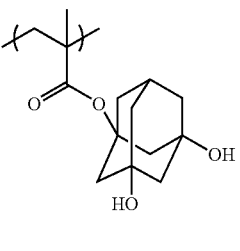
(21)
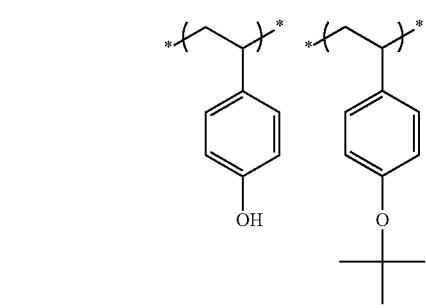
(22)
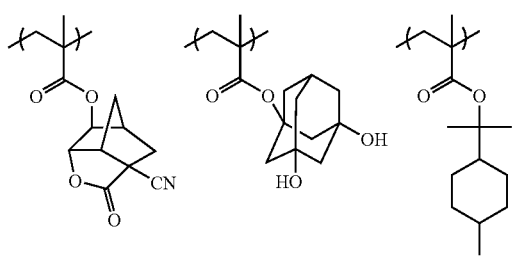
(23)
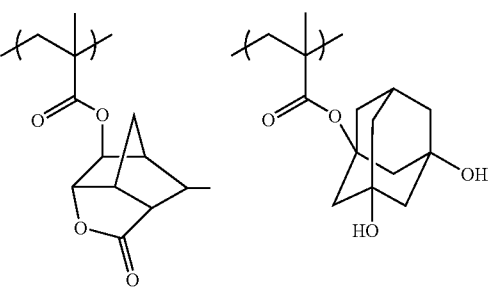
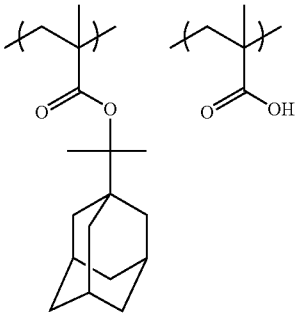
(24)
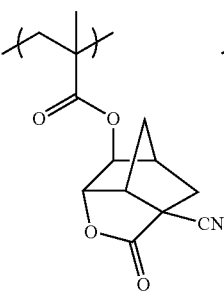 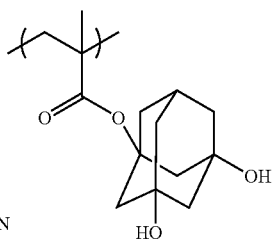
(25)
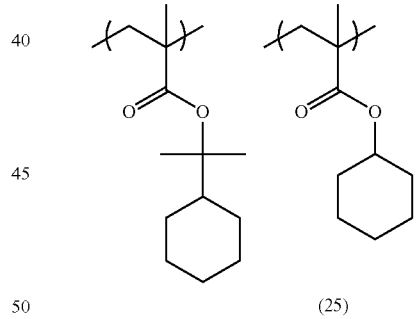
| Resin (A) | Composition (corresponding in order from the left hand of each repeating unit, molar ratio) | Mw | Mw/Mn |
| --- | --- | --- | --- |
| 1 | 50/10/40 | 8,300 | 1.7 |
| 16 | 45/10/40/5 | 9,900 | 1.6 |
| 17 | 50/50 | 9,700 | 1.4 |
| 18 | 40/10/40/10 | 8,700 | 1.6 |
| 19 | 40/10/25/25 | 8,100 | 1.6 |
| 20 | 40/10/40/10 | 8,400 | 1.6 |
| 21 | 40/10/50 | 8,800 | 1.6 |
| 22 | 50/50 | 9,700 | 1.4 |
| 23 | 50/10/40 | 7,600 | 1.7 |
| 24 | 40/20/30/10 | 7,500 | 1.7 |
| 25 | 40/10/40/10 | 9,500 | 1.7 |

Synthesis Example 1

Synthesis of Resin (HR-1)

A monomer solution is prepared by dissolving 28 g of t-butyl methacrylate (purity: 98%), and 53 g of 2,2,3,3,4,4,4-heptafluorobutyl methacrylate in 130 ml of cyclohexanone. A polymerization initiator V-601 (manufactured by Wako Pure Chemical Industries Ltd.) (4 g) is added to the above solution, and the mixture is dropped to 10 ml of cyclohexanone heated at 100° C. over 4 hours in a nitrogen atmosphere. After termination of dropping, the reaction solution is stirred for 2 hours while maintaining the polymerization temperature at 100° C., and then cooled to room temperature and the polymeric solution is taken out. The obtained polymeric solution is dropped into 1 liter of water-containing methanol to precipitate the polymer, and the polymer is filtered. The obtained undried resin is taken out, dried at 20 mmHg (2.66 kPa) and 40° C. for 40 hours to obtain the objective resin (HR-1). The resin is dissolved in propylene glycol methyl ether monoacetate (hereinafter abbreviated to "PGMEA"), and filtered through 142 mm diameter disc product of Posidyne filter (manufactured by Pall Corporation) having a pore size of 0.1 μm and positive ζ-potential.

The weight average molecular weight is 8,800 as the polystyrene equivalent by the GPC method, and polydispersity is 2.1.

Synthesis Example 2

Synthesis of Resin (HR-45)

A monomer solution is prepared by dissolving 9 g of hexafluoroisopropyl methacrylate (purity: 98%), and 36 g of tricyclo[5.2.1.0$^{2.6}$]decan-8-yl methacrylate (another name: tricyclodecanyl methacrylate) (purity>99%) in 200 ml of PGMEA, and 2 g of a polymerization initiator V-601 is added to the reaction solution. The pressure of the reaction vessel is reduced to 30 mmHg, and then the operation to return reduced pressure to atmospheric pressure by dry nitrogen is repeated 3 times, and the flask is maintained at 10 to 20° C. with ice water. PGMEA (20 ml) is put in another polymerization tank, and the inside of the tank is replaced with dry nitrogen. The reaction solution in which the monomers and the polymerization initiator are dissolved is stirred and dropped to the PGMEA heated at 80° C. in a nitrogen atmosphere over 2 hours. After termination of dropping, the reaction solution is stirred for 2 hours while maintaining the polymerization temperature at 80° C., and then cooled to room temperature and the polymeric solution is taken out. The obtained polymeric solution is dropped into 2 liters of water-containing methanol to precipitate the resin, and the resin is filtered. The obtained undried resin is taken out, dried at 20 mmHg (2.66 kPa), 40° C. for 40 hours to obtain the objective resin (HR-45).

After the obtained resin is washed with 2 liters of methanol, again dissolved in PGMEA, and filtered through 142 mm diameter disc product of Posidyne filter (manufactured by Pall Corporation) having a pore size of 0.1 μm and positive ζ-potential. In the next place, the reaction solution is heated under reduced pressure, PGMEA is thrown in to replace the solvent, and a PGMEA solution containing 20% of the resin (HR-45) is obtained.

The compositional ratio of the resin found from $^1$H-NMR is 50/50 (molar ratio). The weight average molecular weight is 12,000 as the polystyrene equivalent by the GPC method, and polydispersity is 2.6.

Synthesis Example 3

Synthesis of Resin (HR-30)

Allyltrimethylsilane (11 g) (purity>99%), and 20 g of t-butyl-2-(trifluoromethyl) acrylate (purity: 98%) are dissolved in 60 ml of tetrahydrofuran (hereinafter abbreviated to "THF"). While the mixture is stirring in a nitrogen atmosphere at 65° C., 0.1 g of a polymerization initiator V-65 (manufactured by Wako Pure Chemical Industries Ltd.) is added to the reaction solution and stirred for 5 hours. The obtained polymeric solution is cooled to room temperature, diluted with 10 ml of THR, and dropped to 500 ml of water-containing methanol to precipitate the resin, and the resin is filtered. The obtained undried resin is taken out, dried at 20 mmHg (2.66 kPa), 40° C. for 40 hours to obtain the objective resin (HR-30).

After the obtained resin is washed with 500 ml of methanol and filtered, dissolved in THF, and the solution is passed through "Ion Clean" (trade name, manufactured by Pall Corporation, material: chemical modification type super-high molecular weight polyethylene, filtering area: 0.11 m$^2$) consisting of a porous polyolefin film having a cation exchange group at room temperature at a flow rate of 100 g/min. In the next place, the solution is heated under reduced pressure to expel THF and PGMEA is thrown in to replace the solvent, and a PGMEA solution containing 20% of the resin (HR-30) is obtained.

The compositional ratio of the resin found from $^1$H-NMR is 40/60 (molar ratio). The weight average molecular weight is 6,500 as the polystyrene equivalent by the GPC method, and polydispersity is 1.6.

Synthesis Example 4

Synthesis of Resin (HR-22)

A monomer solution is prepared by dissolving 24 g of hexafluoroisopropyl methacrylate (purity>99%) in 200 ml of cyclohexanone. A polymerization initiator V-601 (4 g) is added to the above solution, and the mixture is dropped to 10 ml of cyclohexanone heated at 100° C. over 4 hours in a nitrogen atmosphere. After termination of dropping, the reaction solution is stirred for 2 hours while maintaining the polymerization temperature at 100° C., and then cooled to room temperature and the polymeric solution is taken out. The obtained polymeric solution is dropped into 1.5 liters of water-containing methanol to precipitate the resin, and the resin is filtered. The obtained undried resin is taken out, dried at 20 mmHg (2.66 kPa), 40° C. for 40 hours to obtain the objective resin (HR-22). The resin is dissolved in PGMEA, and filtered through 142 mm diameter disc product of Posidyne filter (manufactured by Pall Corporation) having a pore size of 0.1 μm and positive ζ-potential.

The weight average molecular weight is 3,000 as the polystyrene equivalent by the GPC method, and polydispersity is 1.6.

Synthesis Example 5

Synthesis of Resin (HR-37)

Allyltrimethylsilane (11 g) (purity>99%), and 24 g of 2,4-dimethylpentyl-2-(trifluoromethyl) acrylate (purity>99%) are dissolved in 160 ml of PGMEA. To the solution is added 2 g of a polymerization initiator azoisobutyronitrile and the reaction solution is dropped to 10 ml of PGMEA heated at 80° C. in a nitrogen atmosphere over 2 hours. After termination of dropping, the reaction solution is stirred for 2 hours while maintaining the polymerization temperature at 80° C., and then cooled to room temperature and the polymeric solution is taken out. The obtained polymeric solution is dropped into 1 liter of water-containing methanol to precipitate the resin, and the resin is filtered. The obtained undried resin is washed with 1 liter of methanol, dissolved in PGMEA, and is passed through "Ion Clean" (trade name, manufactured by Pall Corporation, material: chemical modification type super-high molecular weight polyethylene, filtering area: 0.11 m$^2$) consisting of a porous polyolefin film having a cation exchange group at room temperature at a flow rate of 100 g/min. In the next place, the solution is heated under reduced pressure and PGMEA is thrown in to replace the solvent, and a PGMEA solution containing 20% of the resin (HR-37) is obtained.

The compositional ratio of the resin found from $^1$H-NMR is 40/60 (molar ratio). The weight average molecular weight is 5,500 as the polystyrene equivalent by the GPC method, and polydispersity is 1.5.

Synthesis Example 6

Synthesis of Resin (HR-64)

3,5-bis[2,2,2-trifluoro-1-(trifluoromethyl)-1-hydroxyethyl]cyclohexyl methacrylate (50 g) (purity>99%), and 22 g of 4-t-butylcyclohexyl methacrylate (purity>99%) are dissolvedf in 300 ml of PGMEA. To the solution is added 3 g of a polymerization initiator azoisobutyronitrile, and the reaction solution is dropped to 10 ml of PGMEA heated at 100° C. in a nitrogen atmosphere over 2 hours. After termination of dropping, the reaction solution is stirred for 2 hours while maintaining the polymerization temperature at 100° C., and then cooled to room temperature and the polymeric solution is taken out. The obtained polymeric solution is dropped into 2 liters of hexane to precipitate the resin, and the resin is filtered. The obtained undried resin is washed with 1 liter of hexane and filtered, dissolved again in PGMEA, and is passed through "Ion Clean" (trade name, manufactured by Pall Corporation, material: chemical modification type super-high molecular weight polyethylene, filtering area: 0.11 m$^2$) consisting of a porous polyolefin film having a cation exchange group at room temperature at a flow rate of 100 g/min. In the next place, the solution is heated under reduced pressure and PGMEA is thrown in to replace the solvent, and a PGMEA solution containing 20% of the resin (HR-64) is obtained.

The compositional ratio of the resin found from $^1$H-NMR is 50/50 (molar ratio). The weight average molecular weight is 7,900 as the polystyrene equivalent by the GPC method, and polydispersity is 1.9.

Synthesis Example 7

Synthesis of Resin (HR-34)

Cyclohexanone (240 ml), 15 g of (3-methacryloyloxy)propyl ethyl-POSS (another name: 1-(3-methacryloyloxy)propyl-3,5,7,9,11,13,15-heptaethylpentacyclo[9.5.1.1.$^{3.9}$1.$^{7.13}$]octasiloxane) (purity: 97%), and 36 g of 2-ethylhexyl methacrylate (purity>99%) are put in a monomer solution preparation tank maintaining a nitrogen atmosphere, and the mixture is dissolved to prepare a monomer solution. To the solution is added 3 g of a polymerization initiator AIBN, and the mixture is dropped to 20 ml of cyclohexanone heated at 100° C. over 4 hours in a nitrogen atmosphere. After termination of dropping, the reaction solution is stirred for 2 hours while maintaining the polymerization temperature at 100° C., and then cooled to room temperature and the polymeric solution is taken out. The obtained polymeric solution is dropped to 3 liters of water-containing methanol to precipitate the resin, and the precipitate generated is repulped with water-containing methanol. The supernatant is removed, and the residue is placed in a centrifugal separator and dewatered to obtain undried resin.

The obtained undried resin is dissolved in PGMEA, and water of the same mass is added thereto. The mixture is stirred at 35° C. for 30 minutes, and allowed to stand for 30 minutes for separation of fluid. After the lower layer (water layer) is removed, water of the same mass as the upper layer is newly added to the upper layer (organic layer), the mixture is stirred again at 35° C. for 30 minutes, allowed to stand for 30 minutes, and then the lower layer (water layer) is removed. The upper layer (organic layer) is taken out, and filtered through 142 mm diameter disc product of Posidyne filter (manufactured by Pall Corporation) having a pore size of 0.1 μm and positive ζ-potential. The residue is concentrated to obtain a PGMEA solution containing 20% of the resin (HR-34).

The compositional ratio of the resin found from $^1$H-NMR is 10/90 (molar ratio). The weight average molecular weight is 8,000 as the polystyrene equivalent by the GPC method, and polydispersity is 1.8.

Synthesis Example 8

Synthesis of Resin (HR-25)

A monomer solution is prepared by dissolving 22 g of 4-t-butylcyclohexyl methacrylate (purity>99%) and 22 g of hexafluoroisopropyl acrylate (purity>99%) are dissolved in 200 ml of cyclohexanone. A polymerization initiator V-601 (4 g) is added to the above solution, and the mixture is stirred in a nitrogen atmosphere at 100° C. for 5 hours. The obtained polymeric solution is dropped to 2 liters of water-containing methanol to precipitate the resin, and the precipitate generated is repulped with water-containing methanol. The supernatant is removed, and the residue is placed in a centrifugal separator and dewatered to obtain undried resin. The obtained undried resin is dissolved in PGMEA, and a 5% aqueous oxalic acid of the same mass is added thereto. The mixture is stirred at 35° C. for 30 minutes, and allowed to stand for 30 minutes for separation of fluid. After the lower layer (water layer) is removed, ion exchange water of the same mass as the upper layer is newly added to the upper layer (organic layer), the mixture is stirred again at 35° C. for 30 minutes, allowed to stand for 30 minutes, and then the lower layer (water layer) is removed. The upper layer (organic layer) is taken out, and filtered through 142 mm diameter disc product of Posidyne filter (manufactured by Pall Corporation) having a pore size of 0.1 μm and positive ζ-potential. The residue is concentrated to obtain a PGMEA solution containing 20% of the resin (HR-25).

The compositional ratio of the resin found from $^1$H-NMR is 50/50 (molar ratio). The weight average molecular weight is 15,000 as the polystyrene equivalent by the GPC method, and polydispersity is 2.1.

Synthesis Example 9

Synthesis of Resin (HR-63)

3,5-bis[2,2,2-trifluoro-1-(trifluoromethyl)-1-hydroxyethyl]cyclohexyl methacrylate (50 g) (purity>99%) is dissolved in 250 ml of PGMEA. To the solution is added 1 g of AIBN, and the mixture is stirred in a nitrogen atmosphere at 80° C. for 5 hours. The obtained polymeric solution is dropped to 2 liters of water-containing methanol to precipitate the resin, and the precipitate generated is repulped with hexane. The supernatant is removed, and the residue is placed in a centrifugal separator and dewatered to obtain undried resin. The obtained undried resin is dissolved in PGMEA, and the solution is passed through "Ion Clean" (trade name, manufactured by Pall Corporation, material: chemical modification type super-high molecular weight polyethylene, filtering area: 0.11 m$^2$) consisting of a porous polyolefin film having a cation exchange group at room temperature at a flow rate of 100 g/min. In the next place, the solution is concentrated under reduced pressure to obtain a PGMEA solution containing 20% of the resin (HR-63).

The weight average molecular weight found is 6,800 as the polystyrene equivalent by the GPC method, and polydispersity is 1.6.

Synthesis Example 10

Synthesis of Resin (HR-65)

Hexafluoroisopropyl methacrylate (19 g) (purity>99%), 10 g of (2-oxotetrahydrofuran)-3-yl methacrylate (purity>99%) (another name: γ-butyrolactone methacrylate), and 13 g of 4-t-butylcyclohexyl methacrylate (purity>99%) are dissolved in 200 ml of a mixed solution of PGMEA/cyclohexanone (6/4). To the solution is added 6 g of a polymerization initiator V-601, and the mixture is dropped to 10 ml of a mixed solution of PGMEA/cyclohexanone (6/4) heated at 100° C. over 2 hours in a nitrogen atmosphere. After termination of dropping, the reaction solution is stirred for 2 hours while maintaining the polymerization temperature at 100° C., and then cooled to room temperature and the polymeric solution is taken out. The obtained polymeric solution is dropped to 2 liters of hexane to precipitate the resin, and the generated precipitate is repulped with hexane. The supernatant is removed, and the residue is placed in a centrifugal separator and dewatered to obtain undried resin. The obtained undried resin is dissolved in PGMEA. The upper layer (organic layer) is taken out, and filtered through 142 mm diameter disc product of Posidyne filter (manufactured by Pall Corporation) having a pore size of 0.1 μm and positive ζ-potential. The residue is concentrated to obtain a PGMEA solution containing 20% of the resin (HR-65).

The compositional ratio of the resin found from $^1$H-NMR is 40/30/30 (molar ratio). The weight average molecular weight is 5,600 as the polystyrene equivalent by the GPC method, and polydispersity is 2.1.

Synthesis Example 11

Synthesis of Resin (HR-73)

Hexafluoroisopropyl methacrylate (purity: 98%) (42 g) and 2 g of methacrylic acid (purity>99%) are dissolved in 100 ml of a mixed solution of PGMEA/propylene glycol monomethyl ether (hereinafter referred to as "PGME") (6/4). To the solution is added 2 g of a polymerization initiator AIBN. After the pressure of the reaction vessel is reduced to 30 mmHg, the operation to return reduced pressure to atmospheric pressure by dry nitrogen is repeated 3 times, and the flask is maintained at 10 to 20° C. with ice water. A mixed solution of PGMEA/PGME (6/4) (10 ml) is put in another polymerization tank, and the inside of the tank is replaced with dry nitrogen. The reaction solution in which the monomers and the polymerization initiator are dissolved is stirred and dropped to the mixed solution of PGMEA/PGME heated at 100° C. in a nitrogen atmosphere over 2 hours. After termination of dropping, the reaction solution is stirred for 2 hours while maintaining the polymerization temperature at 100° C., and then cooled to room temperature and the polymeric solution is taken out. The obtained polymeric solution is dropped into 500 ml of water-containing methanol to precipitate the resin, and the generated precipitate is repulped with water-containing methanol. The supernatant is removed, and the residue is placed in a centrifugal separator and dewatered to obtain undried resin. The obtained undried resin is dissolved in PGMEA, and the solution is passed through "Ion Clean" (trade name, manufactured by Pall Corporation, material: chemical modification type super-high molecular weight polyethylene, filtering area: 0.11 m$^2$) consisting of a porous polyolefin film having a cation exchange group at room temperature at a flow rate of 100 g/min. In the next place, the solution is concentrated under reduced pressure to obtain a PGMEA solution containing 20% of the resin (HR-73).

The compositional ratio of the resin found from $^1$H-NMR is 90/10 (molar ratio). The weight average molecular weight is 6,500 as the polystyrene equivalent by the GPC method, and polydispersity is 2.2.

Synthesis Example 12

Synthesis of Resin (HR-12)

3-(Trimethylsilyl)propyl methacrylate (purity>99%) (16 g), and 27 g of 4-t-butylcyclohexyl methacrylate (purity>99%) are dissolved in 200 ml of cyclohexanone. To the solution is added 1 g of a polymerization initiator AIBN, and the mixture is dropped to 20 ml of cyclohexanone heated at 100° C. over 2 hours in a nitrogen atmosphere. After termination of dropping, the reaction solution is stirred for 2 hours while maintaining the polymerization temperature at 100° C., and then cooled to room temperature and the polymeric solution is taken out. The obtained polymeric solution is dropped to 1 ml of water-containing methanol to precipitate the resin, and the generated precipitate is repulped with water-containing methanol. The supernatant is removed, and the residue is placed in a centrifugal separator and dewatered to obtain undried resin. The obtained undried resin is dissolved in PGMEA, and the solution is passed through "Ion Clean" (trade name, manufactured by Pall Corporation, material: chemical modification type super-high molecular weight polyethylene, filtering area: 0.11 m$^2$) consisting of a porous polyolefin film having a cation exchange group at room temperature at a flow rate of 100 g/min. In the next place, the solution is concentrated under reduced pressure to obtain a PGMEA solution containing 20% of the resin (HR-73).

The compositional ratio of the resin found from $^1$H-NMR is 90/10 (molar ratio). The weight average molecular weight is 6,500 as the polystyrene equivalent by the GPC method, and polydispersity is 2.2.

Synthesis Example 13

Synthesis of Resin (HR-13)

3-(Trimethylsilyl)propyl methacrylate (purity>99%) (16 g), and 27 g of 1-methyl-1-(4-methylcyclohexyl)ethyl methacrylate (purity>99%) are dissolved in 200 ml of cyclohexanone. To the solution is added 1 g of a polymerization initiator AIBN, and the mixture is dropped to 20 ml of cyclohexanone heated at 100° C. over 2 hours in a nitrogen atmosphere. After termination of dropping, the reaction solution is stirred for 2 hours while maintaining the polymerization temperature at 100° C., and then cooled to room temperature and the polymeric solution is taken out. The obtained polymeric solution is dropped to 2 liters of water-containing methanol to precipitate the resin.

The obtained undried resin is dissolved in PGMEA, and water of the same mass is added thereto. The mixture is stirred at 35° C. for 30 minutes, and allowed to stand for 30 minutes for separation of fluid. After the lower layer (water layer) is removed, water of the same mass as the upper layer is newly added to the upper layer (organic layer), the mixture is stirred again at 35° C. for 30 minutes, allowed to stand for 30 minutes, and then the lower layer (water layer) is removed. The upper layer (organic layer) is taken out, and filtered through 142 mm diameter disc product of Posidyne filter (manufactured by Pall Corporation) having a pore size of 0.1 μm and positive ζ-potential. The residue is concentrated to obtain a PGMEA solution containing 20% of the resin (HR-13).

The compositional ratio of the resin found from $^1$H-NMR is 40/60 (molar ratio). The weight average molecular weight is 13,000 as the polystyrene equivalent by the GPC method, and polydispersity is 2.2.

Synthesis Example 14

Synthesis of Resin (HR-68)

Hexafluoroisopropyl methacrylate (purity>99%) (24 g), and 22 g of 1-methyl-1-(4-methylcyclohexyl)ethyl methacrylate (purity>99%) are dissolved in 200 ml of cyclohexanone. To the solution is added 3 g of a polymerization initiator AIBN. The pressure of the reaction vessel is reduced to 30 mmHg, and then the operation to return reduced pressure to atmospheric pressure by dry nitrogen is repeated 3 times, and the flask is maintained at 10 to 20° C. with ice water. A mixed solution of PGMEA/PGME (6/4) (10 ml) is put in another polymerization tank, and the inside of the tank is replaced with dry nitrogen. The foregoing mixed solution is dropped to 20 ml of cyclohexanone heated at 100° C. in a nitrogen atmosphere. After termination of dropping, the reaction solution is stirred for 2 hours while maintaining the polymerization temperature at 100° C., and then cooled to room temperature and the polymeric solution is taken out. The obtained polymeric solution is dropped to 2 liters of water-containing methanol to precipitate the resin.

The obtained undried resin is dissolved in cyclohexanone, and water of the same mass is added thereto. The mixture is stirred at 35° C. for 30 minutes, and allowed to stand for 30 minutes for separation of fluid. After the lower layer (water layer) is removed, water of the same mass as the upper layer is newly added to the upper layer (organic layer), the mixture is stirred again at 35° C. for 30 minutes, allowed to stand for 30 minutes, and then the lower layer (water layer) is removed. The upper layer (organic layer) is taken out, and the solution is passed through "Ion Clean" (trade name, manufactured by Pall Corporation, material: chemical modification type superhigh molecular weight polyethylene, filtering area: 0.11 m$^2$) consisting of a porous polyolefin film having a cation exchange group at room temperature at a flow rate of 100 g/min. In the next place, the solution is concentrated under reduced pressure to obtain a PGMEA solution containing 20% of the resin (HR-68).

The compositional ratio of the resin found from $^1$H-NMR is 49/51 (molar ratio). The weight average molecular weight is 6,200 as the polystyrene equivalent by the GPC method, and polydispersity is 2.1.

Synthesis Example 15

Synthesis of Resin (HR-100)

A monomer solution is prepared by dissolving 28 g of t-butyl methacrylate (purity: 98%) in 130 ml of cyclohexanone. A polymerization initiator V-601 (manufactured by Wako Pure Chemical Industries Ltd.) (4 g) is added to the above solution, and the mixture is dropped to 10 ml of cyclohexanone heated at 100° C. over 4 hours in a nitrogen atmosphere. After termination of dropping, the reaction solution is stirred for 2 hours while maintaining the polymerization temperature at 100° C., and then cooled to room temperature and the polymeric solution is taken out. The obtained polymeric solution is dropped into 1 liter of water-containing methanol to precipitate the resin, and the resin is filtered. The obtained undried resin is taken out, dried at 20 mmHg (2.66 kPa) and 40° C. for 40 hours to obtain the objective resin (HR-100). The resin is dissolved in propylene glycol methyl ether monoacetate (hereinafter abbreviated to "PGMEA"), and filtered through a polyethylene filter having a pore size of 0.1 μm.

The weight average molecular weight is 8,800 as the polystyrene equivalent by the GPC method, and polydispersity is 2.1.

The synthesis examples are summarized in the following table.

TABLE 3

| | | Processes | | | | | |
|---|---|---|---|---|---|---|---|
| Synthesis Example No. | Resin | Filtration through a Cation Exchange Filter | Filtration through a Filter Having Positive ζ-Potential | Removal of Radical-Capturing Material | Purity of Monomer (99% or more) | Washing with Water | Repulping/ Rinsing |
| 1 | HR-1 | Not used | Used | Not used | Not used | Not used | Not used |
| 2 | HR-45 | Not used | Used | Used | Not used | Not used | Not used |
| 3 | HR-30 | Used | Not used | Not used | Not used | Not used | Not used |
| 4 | HR-22 | Not used | Used | Not used | Used | Not used | Not used |
| 5 | HR-37 | Used | Not used | Not used | Used | Not used | Not used |
| 6 | HR-64 | Used | Not used | Not used | Used | Not used | Not used |
| 7 | HR-34 | Not used | Used | Not used | Not used | Used | Used |
| 8 | HR-25 | Not used | Used | Not used | Used | Not used | Used |
| 9 | HR-63 | Used | Not used | Not used | Used | Not used | Used |
| 10 | HR-65 | Not used | Used | Not used | Used | Not used | Used |
| 11 | HR-73 | Used | Not used | Used | Used | Not used | Used |
| 12 | HR-12 | Used | Not used | Not used | Used | Not used | Used |
| 13 | HR-13 | Not used | Used | Not used | Used | Used | Not used |
| 14 | HR-68 | Used | Not used | Used | Used | Used | Not used |
| 15 | HR-100 | Not used | Not used | Not used | Not used | Not used | Not used |

Examples 1 to 14 and Comparative Examples 1 and 2

Preparation of Resist:

Each positive resist solution is prepared by dissolving the components shown in Table 4 below in a solvent(s) to prepare a solution of the concentration of solids content of 7 mass %, and filtering the solution through a polyethylene filter having a pore size of 0.1 μm. The mass % of the resin (HR) is based on all the solids content in the resist composition. The prepared positive resist solution is evaluated according to the following methods. The results obtained are shown in Table 4.

Evaluating Methods of Resist:
Determination of Residual Monomer:

The residual monomer is determined by high performance liquid chromatography (HPLC) with Shim-PACK CLC-ODS column (manufactured by TOSOH CORPORATION) at flow rate of 1.0 ml/min, and analytical condition of eluting solvent methanol/0.1% phosphoric acid/triethylamine buffer aqueous solution.

Evaluating Method of Immersion Defect (Development Defect):

A photosensitive resin composition is uniformly coated by spin coating on a silicon substrate of 8 inches subjected to hexamethyldisilazane treatment, and heated and dried at 120° C. for 60 seconds on a hot plate to form a resist film having a film thickness of 100 nm. The resist film is subjected to pattern exposure with an ArF excimer laser scanner for immersion (Na: 0.85). Ultrapure water is used as the immersion liquid. After that, the resist film is heated at 120° C. for 60 seconds on a hot plate. Further, the resist film is subjected to development with a tetramethylammonium hydroxide aqueous solution of 2.38 mass % concentration at 23° C. for 60 seconds, rinsing with pure water for 30 seconds, and then dried. The thus-obtained sample wafer is measured for development defects with KLA2360 (manufactured by LKA Tencor Japan).

Evaluation of Following Ability of Water:

The prepared positive resist composition is coated on a silicon wafer, based at 120° C. for 60 seconds to form a resist film having a thickness of 160 nm. In the next place, as shown in FIGURE, pure water 2 is filled between wafer 1 coated with the obtained positive resist composition and quartz glass substrate 3.

In this situation, quartz glass substrate 3 is moved (scanned) in parallel to the surface of resist-coated substrate 1, and the state of following of pure water 2 is visually observed. Scanning speed of quartz glass substrate 3 is gradually increased, and following ability of water (mm/sec) is evaluated by finding the limitation of scanning speed when pure water 2 cannot follow the scanning speed of quartz glass substrate 3 and water droplet begins to stay on the receding side. The greater the limitation of possible scanning speed, the greater is the following ability of water for higher speed, which shows that the following ability of water on the resist film is good.

Determination of Generated Acid:

Each of the prepared resist composition is coated on an eight inch silicon wafer and baked at 120° C. for 60 seconds to form a resist film having a thickness of 200 nm. After the resist film is exposed with an exposing apparatus of wavelength of 193 nm by whole exposure of 20 mJ/cm$^2$, 5 ml of deionized pure water is dropped on the resist film with an ultrapure water manufacturing apparatus (Milli-Q Jr., manufactured by Nippon Millipore Corporation). After the water is put on the resist film for 50 seconds, the water is collected, and elution concentration of acid is determined with LC-MS equipment.

LC equipment: 2695, manufactured by Waters Corporation
MS equipment: Esquire 3000plus, manufactured by Bruker Daltonics Detection strength of ionic species of mass 299 (corresponding to nonaflate anion) is measured with the LC-MS, and the elution amount of nonafluorobutanesulfonic acid (a) is computed. In the similar manner, detection strength of ionic species of mass 292 (corresponding to anion of compound b) is measured, and the elution amount of acid (b) shown below is computed.

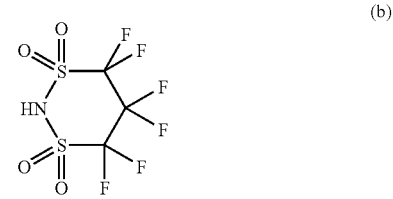

(b)

TABLE 4

| | | Composition | | | | | | Results of Evaluations | | |
| | | | | | | | | Elution | | |
| Ex. | Resin (A) | Photo- Acid Generator | Solvent | Basic Compound | Resin (HR) | Surf- actant | Amount of Monomer | Immersion | Amount of Generated Acid ($\times 10^{-13}$ mol/cm$^2$) | | Following Ability of Water |
| No. | (2 g) | (mg) | (mass ratio) | (mg) | (wt %) | (mg) | (%) | Defects | Acid (a) | Acid (b) | (mm/sec) |
| Ex. 1 | 1 | z2 (80) | SL-1/SL-2 40/60 | N-5 (7) | HR-1 (1.0) | W-1 (3) | 0.3 | | 0.003 | 3 | — | 200 |
| Ex. 2 | 1 | z2 (80) | SL-2/SL-4 60/40 | N-2 (7) | HR-45 (0.5) | W-1 (3) | 0.3 | | 0.002 | 3 | — | 250 |
| Ex. 3 | 1 | z2 (80) | SL-1/SL-2 40/60 | N-3 (6) | HR-30 (0.3) | W-1 (3) | 0.2 | | 0.003 | 3 | — | 250 |
| Ex. 4 | 17 | z55/z23 (100/25) | SL-2/SL-4 60/40 | N-5/N-1 (7/7) | HR-22 (1.0) | W-3 (3) | 0.3 | | 0.002 | 2 | 1 | 250 |
| Ex. 5 | 18 | z55/z23 (75/75) | SL-2/SL-4 60/40 | N-5/N-1 (7/7) | HR-37 (0.5) | W-3 (3) | 0.3 | | 0.002 | 2 | 1 | 250 |

TABLE 4-continued

| Ex. No. | Resin (A) (2 g) | Photo-Acid Generator (mg) | Solvent (mass ratio) | Basic Compound (mg) | Resin (HR) (wt %) | Surfactant (mg) | Amount of Monomer (%) | Immersion Defects | Amount of Generated Acid ($\times 10^{-13}$ mol/cm$^2$) Acid (a) | Acid (b) | Following Ability of Water (mm/sec) |
|---|---|---|---|---|---|---|---|---|---|---|---|
| Ex. 6 | 17 | z55 (100) | SL-2/SL-4 60/40 | N-5/N-1 (7/7) | HR-64 (2.0) | W-3 (3) | 0.2 | 0.002 | — | 3 | 200 |
| Ex. 7 | 16 | z55 (100) | SL-2/SL-4 60/40 | N-1 (10) | HR-34 (0.8) | W-5 (3) | <0.1 | 0.001 | — | 3 | 250 |
| Ex. 8 | 19 | z2 (80) | SL-2 100 | N-7 (7) | HR-25 (1.0) | W-3 (2) | <0.1 | 0.001 | 3 | — | 250 |
| Ex. 9 | 20 | z2 (80) | SL-1 100 | N-7 (7) | HR-63 (3.0) | W-1 (2) | <0.1 | 0.001 | 3 | — | 200 |
| Ex. 10 | 21 | z23 (80) | SL-2/SL-5 60/40 | N-3 (6) | HR-65 (1.5) | W-1 (2) | <0.1 | 0.001 | 3 | — | 200 |
| Ex. 11 | 22 | z2/z42 (50/40) | SL-2/SL-5 60/40 | N-3 (6) | HR-73 (2.0) | W-1 (2) | <0.1 | 0.001 | 2 | — | 200 |
| Ex. 12 | 23 | z2 (80) | SL-2/SL-3 60/40 | N-7 (7) | HR-12 (0.4) | W-1 (2) | <0.1 | 0.001 | 3 | — | 250 |
| Ex. 13 | 24 | z2/z15 (50/75) | SL-2/SL-3 60/40 | N-4 (6) | HR-13 (2.0) | W-1 (3) | <0.1 | 0.001 | 3 | — | 200 |
| Ex. 14 | 25 | z55/z15 (50/75) | SL-2 100 | N-8 (7) | HR-68 (2.0) | W-1 (2) | <0.1 | 0.001 | 1 | 1 | 200 |
| Comp. Ex. 1 | 1 | z2 (80) | SL-2/SL-4/SL-6 40/59/1 | N-6 (10) | HR-100 (1.0) | W-4 (5) | 2 | 1 | 5 | — | 200 |
| Comp. Ex. 2 | 1 | z2 (80) | SL-2/SL-4/SL-6 40/59/1 | N-6 (10) | — | W-4 (5) | — | 0.9 | 10 | — | 50 |

Resins (A) and acid generators are as shown above.
N-1: N,N-Dibutylaniline
N-2: N,N-Dihexylaniline
N-3: 2,6-Diisopropylaniline
N-4: Tri-n-octylamine
N-5: N,N-Dihydroxyethylaniline
N-6: 2,4,5-Triphenylimidazole
N-7: Tris(methoxyethoxyethyl)amine
N-8: 2-Phenylbenzimidazole
W-1: Megafac F176 (fluorine surfactant, manufactured by Dainippon Ink and Chemicals Inc.)
W-2: Megafac R08 (fluorine/silicon surfactant, manufactured by Dainippon Ink and Chemicals Inc.)
W-3: Polysiloxane polymer KP-341 (silicon surfactant, manufactured by Shin-Etsu Chemical Co., Ltd.)
W-4: Troy Sol S-366 (manufactured by Troy Chemical Co., Ltd.)
W-5: PF6320 (fluorine surfactant, manufactured by OMNOVA Solution Inc.)
SL-1: Cyclohexane
SL-2: Propylene glycol monomethyl ether acetate
SL-3: Ethyl lactate
SL-4: Propylene glycol monomethyl ether
SL-5: γ-Butyrolactone
SL-6: Propylene carbonate The invention can synthesize resin from which a high molecular weight component is removed, and resin suitable as the resin capable of well hydrophobitizing a resist film surface in patterning by immersion exposure can be obtained. The invention can provide a positive resist composition capable of hydrophobitizing a resist film surface, obtaining good following ability after an immersion liquid, preventing elution of a generated acid to an immersion liquid, restraining development defects, and suitable for patterning by immersion exposure.

The entire disclosure of each and every foreign patent application from which the benefit of foreign priority has been claimed in the present application is incorporated herein by reference, as if fully set forth.

What is claimed is:

1. A resin to be added to a resist composition and locally distributed on a resist film surface to hydrophobitize the resist film surface, the resin comprising: a residual monomer in an amount of 1 mass % or less to the resin as a whole in terms of solid content, said resin being manufactured by a method comprising passing a solution containing a resin obtained by polymerization through a filter comprising a porous polyolefin film having a cation exchange group.

2. A method for manufacturing the resin as claimed in claim 1, the method comprising:
   passing a solution containing a resin obtained by polymerization through a filter comprising a porous polyolefin film having a cation exchange group.

3. A method for manufacturing the resin claimed in claim 1, the method comprising:
   passing a solution containing a resin obtained by polymerization through a filter having positive ζ-potential.

4. The method as claimed in claim 2, wherein
   the purity of a monomer for use in the synthesis of the resin is 99% or more.

5. The method as claimed in claim 3, wherein the purity of a monomer for use in the synthesis of the resin is 99% or more.

6. The method as claimed in claim 2, further comprising:
   removing a radical capturing material, before the polymerization, from at least one of (a) a solution containing a monomer, a radical polymerization initiator, and a solvent, and (b) a solvent in the reaction vessel.

7. The method as claimed in claim 3, further comprising:
removing a radical capturing material, before the polymerization, from at least one of (a) a solution containing a monomer, a radical polymerization initiator, and a solvent, and (b) a solvent in the reaction vessel.

8. The method as claimed in claim 2, further comprising:
bringing the resin obtained by polymerization into contact with an aqueous solution.

9. The method as claimed in claim 3, further comprising:
bringing the resin obtained by polymerization into contact with an aqueous solution.

10. The method as claimed in claim 2, further comprising:
performing, after precipitation-purifying the resin obtained by polymerization, at least either treatment of (i) a repulping treatment using a poor solvent, or (ii) a rinsing treatment using a poor solvent.

11. The method as claimed in claim 3, further comprising:
performing, after precipitation-purifying the resin obtained by polymerization, at least either treatment of (i) a repulping treatment using a poor solvent, or (ii) a rinsing treatment using a poor solvent.

12. A positive resist composition comprising:
(A) a resin having a monocyclic or polycyclic alicyclic hydrocarbon structure, and capable of increasing the solubility in an alkali developing solution by the action of an acid,
(B) a compound capable of generating an acid upon irradiation with actinic ray or radiation,
(C) the resin as claimed in claim 1, and
(D) a solvent.

13. A pattern-forming method comprising:
forming a resist film with the positive resist composition as claimed in claim 12,
exposing the resist film, and
developing the resist film.

14. The resin as claimed in claim 1, wherein the purity of a monomer for use in the synthesis of the resin is 99% or more.

15. The resin as claimed in claim 1, wherein the method of manufacturing the resin further comprises:
removing a radical capturing material, before the polymerization, from at least one of (a) a solution containing a monomer, a radical polymerization initiator, and a solvent, and (b) a solvent in the reaction vessel.

16. The resin as claimed in claim 1, wherein the method of manufacturing the resin further comprises:
bringing the resin obtained by polymerization into contact with an aqueous solution.

17. The resin as claimed in claim 1, wherein the method of manufacturing the resin further comprises:
performing, after precipitation-purifying the resin obtained by polymerization, at least either treatment of (i) a repulping treatment using a poor solvent, or (ii) a rinsing treatment using a poor solvent.

18. A resin to be added to a resist composition and locally distributed on a resist film surface to hydrophobitize the resist film surface, the resin comprising:
a residual monomer in an amount of 1 mass% or less to the resin as a whole in terms of solid content, said resin being manufactured by a method comprising passing a solution containing a resin obtained by polymerization through a filter having positive $\zeta$-potential.

19. The resin as claimed in claim 18, wherein
the purity of a monomer for use in the synthesis of the resin is 99% or more.

20. The resin as claimed in claim 18, wherein the method of manufacturing the resin further comprises:
removing a radical capturing material, before the polymerization, from at least one of (a) a solution containing a monomer, a radical polymerization initiator, and a solvent, and (b) a solvent in the reaction vessel.

21. The resin as claimed in claim 18, wherein the method of manufacturing the resin further comprises:
bringing the resin obtained by polymerization into contact with an aqueous solution.

22. The resin as claimed in claim 18, wherein the method of manufacturing the resin further comprises:
performing, after precipitation-purifying the resin obtained by polymerization, at least either treatment of (i) a repulping treatment using a poor solvent, or (ii) a rinsing treatment using a poor solvent.

* * * * *